(12) United States Patent
More et al.

(10) Patent No.: US 11,688,648 B2
(45) Date of Patent: *Jun. 27, 2023

(54) GATE STRUCTURE OF A SEMICONDUCTOR DEVICE AND METHOD OF FORMING SAME

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW); Chun Hsiung Tsai, Xinpu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/671,145

(22) Filed: Feb. 14, 2022

(65) Prior Publication Data
US 2022/0165624 A1    May 26, 2022

Related U.S. Application Data

(63) Continuation of application No. 16/914,880, filed on Jun. 29, 2020, now Pat. No. 11,251,092.

(51) Int. Cl.
*H01L 21/8238* (2006.01)
*H01L 27/092* (2006.01)
(Continued)

(52) U.S. Cl.
CPC ........... *H01L 21/823842* (2013.01); *H01L 21/28088* (2013.01); *H01L 21/28123* (2013.01);
(Continued)

(58) Field of Classification Search
CPC ....... H01L 21/823842; H01L 21/28088; H01L 21/28123; H01L 21/31116;
(Continued)

(56) References Cited

U.S. PATENT DOCUMENTS 9,911,736 B1    3/2018    Zang et al.
11,251,092 B2 *   2/2022    More ............. H01L 21/823878
(Continued)

FOREIGN PATENT DOCUMENTS

TW    201820633 A    6/2018
TW    201906011 A    2/2019

OTHER PUBLICATIONS

Fang, Chang, et al., "Thermal Atomic Layer Etching: Mechanism, Materials and Prospects," Progress in Natural Science: Materials International 28, 2018, pp. 667-675.
(Continued)

*Primary Examiner* — Christine A Enad
(74) *Attorney, Agent, or Firm* — Slater Matsil, LLP

(57) ABSTRACT

A semiconductor device having a gate structure and a method of forming same are provided. The semiconductor device includes a substrate and a gate structure over the substrate. The substrate has a first region and a second region. The gate structure extends across an interface between the first region and the second region. The gate structure includes a first gate dielectric layer over the first region, a second gate dielectric layer over the second region, a first work function layer over the first gate dielectric layer, a barrier layer along a sidewall of the first work function layer and above the interface between the first region and the second region, and a second work function layer over the first work function layer, the barrier layer and the second
(Continued)

gate dielectric layer. The second work function layer is in physical contact with a top surface of the first work function layer.

20 Claims, 60 Drawing Sheets

(51) Int. Cl.
*H01L 29/49* (2006.01)
*H01L 29/66* (2006.01)
*H01L 21/311* (2006.01)
*H01L 21/28* (2006.01)
*H01L 21/3115* (2006.01)

(52) U.S. Cl.
CPC .. *H01L 21/31116* (2013.01); *H01L 21/31155* (2013.01); *H01L 21/823821* (2013.01); *H01L 27/0924* (2013.01); *H01L 29/4966* (2013.01); *H01L 29/66545* (2013.01)

(58) Field of Classification Search
CPC ....... H01L 21/31155; H01L 21/823821; H01L 27/0924; H01L 29/4966; H01L 29/66545
See application file for complete search history.

(56) References Cited

U.S. PATENT DOCUMENTS

| | | |
|---|---|---|
| 2017/0110454 A1 | 4/2017 | Chang et al. |
| 2017/0200719 A1 | 7/2017 | Bao et al. |
| 2017/0221889 A1 | 8/2017 | Dasgupta et al. |
| 2018/0151706 A1 | 5/2018 | Lin et al. |
| 2019/0067417 A1 | 2/2019 | Ching et al. |
| 2019/0252268 A1 | 8/2019 | Xie et al. |
| 2019/0371912 A1* | 12/2019 | Bao ................ H01L 21/823842 |
| 2020/0035674 A1 | 1/2020 | Lu et al. |

OTHER PUBLICATIONS

Kanarik, Keren J. et al., "Overview of Atomic Layer Etching in the Semiconductor Industry," Journal of Vacuum Science & Technology, Mar./Apr. 2015, vol. 33, No. 2, pp. 020801-1-020802-14, Fremont California.

Lee, Hee Kwan, et al., "Selective Etching of Thick Si3N4, SiO2, and Si by Using CF4/O2, and C2F6 Gases with or Without O2 or Ar Addition," Journal of the Korean Physical Society, May 2009, pp. 1816-1823, vol. 54, No. 5.

Matsuo, Seitaro, "Selective Etching of SiO2 Relative to Si by Plasma Reactive Sputter Etching," Journal of Vacuum Science and Technology, Mar./Apr. 1980, pp. 586-594, vol. 17, No. 2, Japan.

* cited by examiner

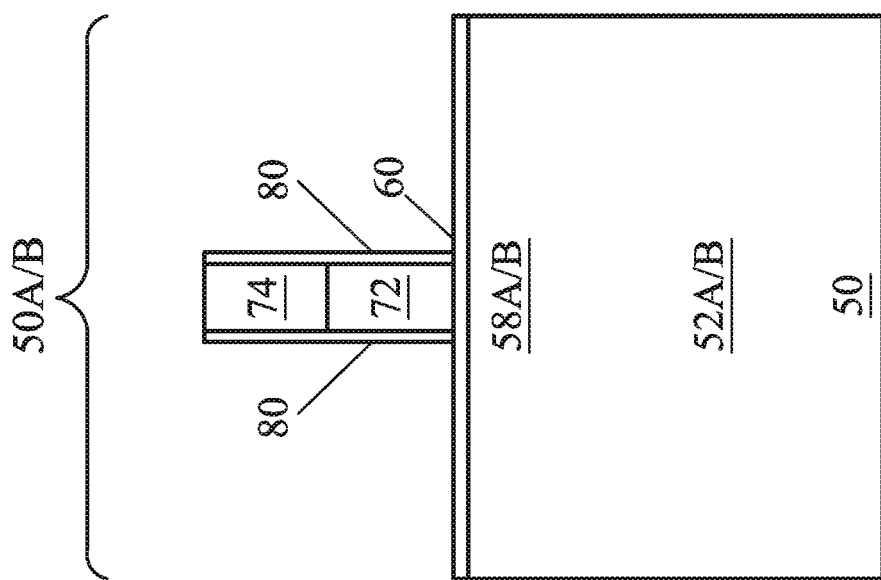

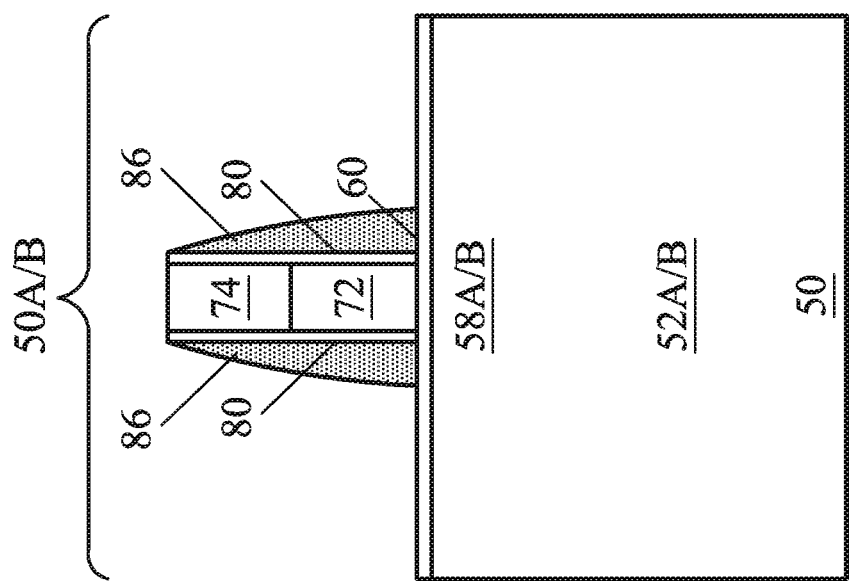

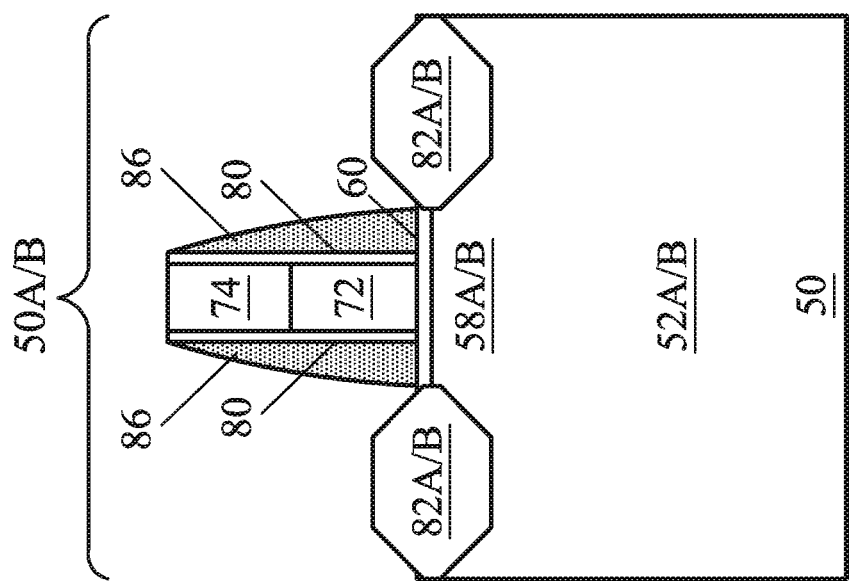

GATE STRUCTURE OF A SEMICONDUCTOR DEVICE AND METHOD OF FORMING SAME

PRIORITY CLAIM AND CROSS-REFERENCE

This application is a continuation and claims the benefit of U.S. patent application Ser. No. 16/914,880, filed on Jun. 29, 2020, now U.S. Pat. No. 11,251,092, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, and 16B are cross-sectional views of intermediate stages in the manufacturing of a FinFET device in accordance with some embodiments.

DETAILED DESCRIPTION

Figure 1:
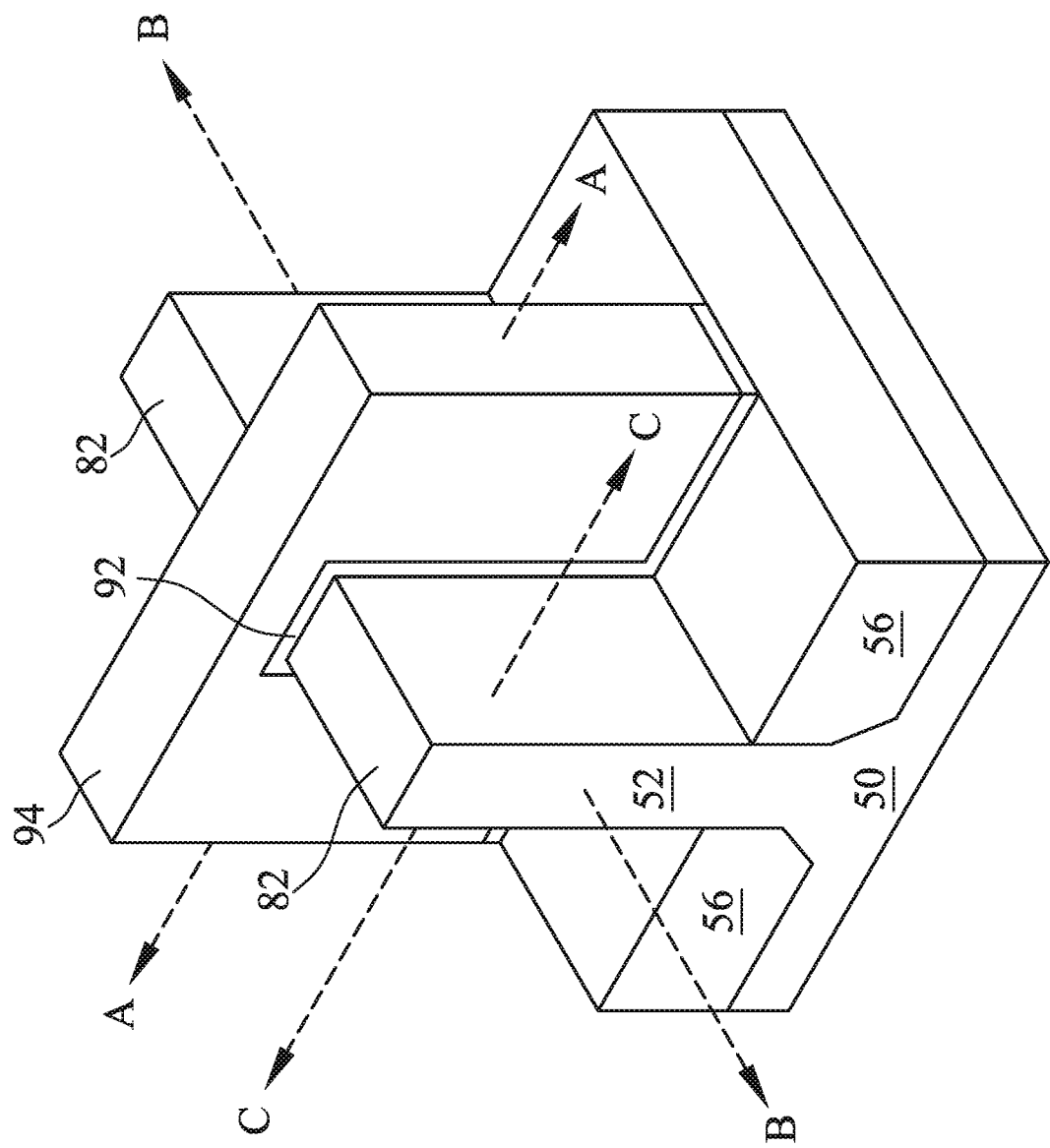
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate structure of a semiconductor device and a method of forming the same. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around transistor devices, nanowire transistor devices, or the like. Various embodiments presented herein allow for forming a barrier layer along sidewall of one or more work function layers at an interface between adjacent semiconductor devices. The barrier layer allows for preventing or reducing a metal diffusion from a work function layer of a gate stack of a first semiconductor device to a work function layer of a gate stack of a second semiconductor device. Furthermore, the barrier layer isolates the gate stack of the first semiconductor device from the gate stack of the second semiconductor device and prevents or reduces a threshold voltage shift due to the metal diffusion. In addition, various process steps for forming the barrier layer may be incorporated into a process flow for forming a gate stack of a semiconductor device.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to a direction of a current flow between the source/drain regions 82 of the FinFET. Cross-section B-B is perpendicular to the cross-section A-A and is along the longitudinal axis of the fin 52 and in the direction of, for example, the current flow between the source/drain regions 82 of the FinFET. Cross-section C-C is parallel to the cross-section A-A and extends through a source/drain region of the FinFET. Subsequent figures refer to these reference cross-sections for clarity.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, and 16B are cross-sectional views of intermediate stages in the manufacturing of a FinFET device, in accordance with some embodiments. FIGS. 2 through 7 illustrate cross-sectional views along the reference cross-section A-A illustrated in FIG. 1, except for multiple fins/FinFETs. FIGS. 8A, 9A, 10A, 11A, 12A, 13A, 14A, 15A, and 16A are illustrated along the reference cross-section A-A illustrated in FIG. 1 and FIGS. 8B, 9B, 10B, 11B, 12B, 13B, 14B, 15B, and 16B are illustrated along the reference cross-section B-B illustrated in FIG. 1, except for multiple fins/FinFETs. FIGS. 10C and 10D are illustrated along the reference cross-section C-C illustrated in FIG. 1, except for multiple fins/FinFETs.

Figure 2:
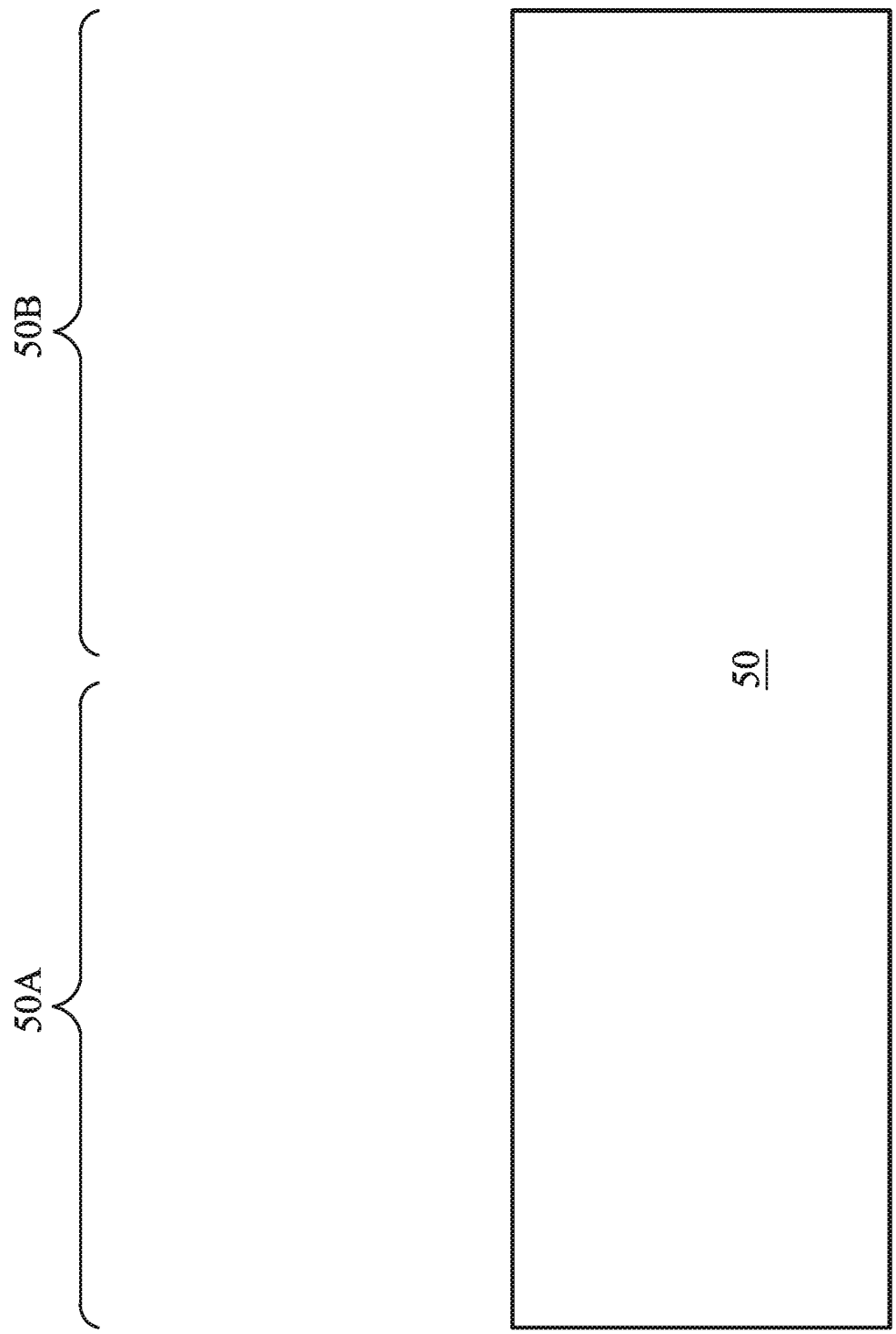

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, the substrate 50 has a region 50A and a region 50B adjacent the region 50A. The region 50A can be for forming a first device and the region 50B can be for forming a second device. Each of the first device and the second device may be an NMOS transistor, such as an n-type FinFET or a PMOS transistor, such as a p-type FinFET.

Figure 3:
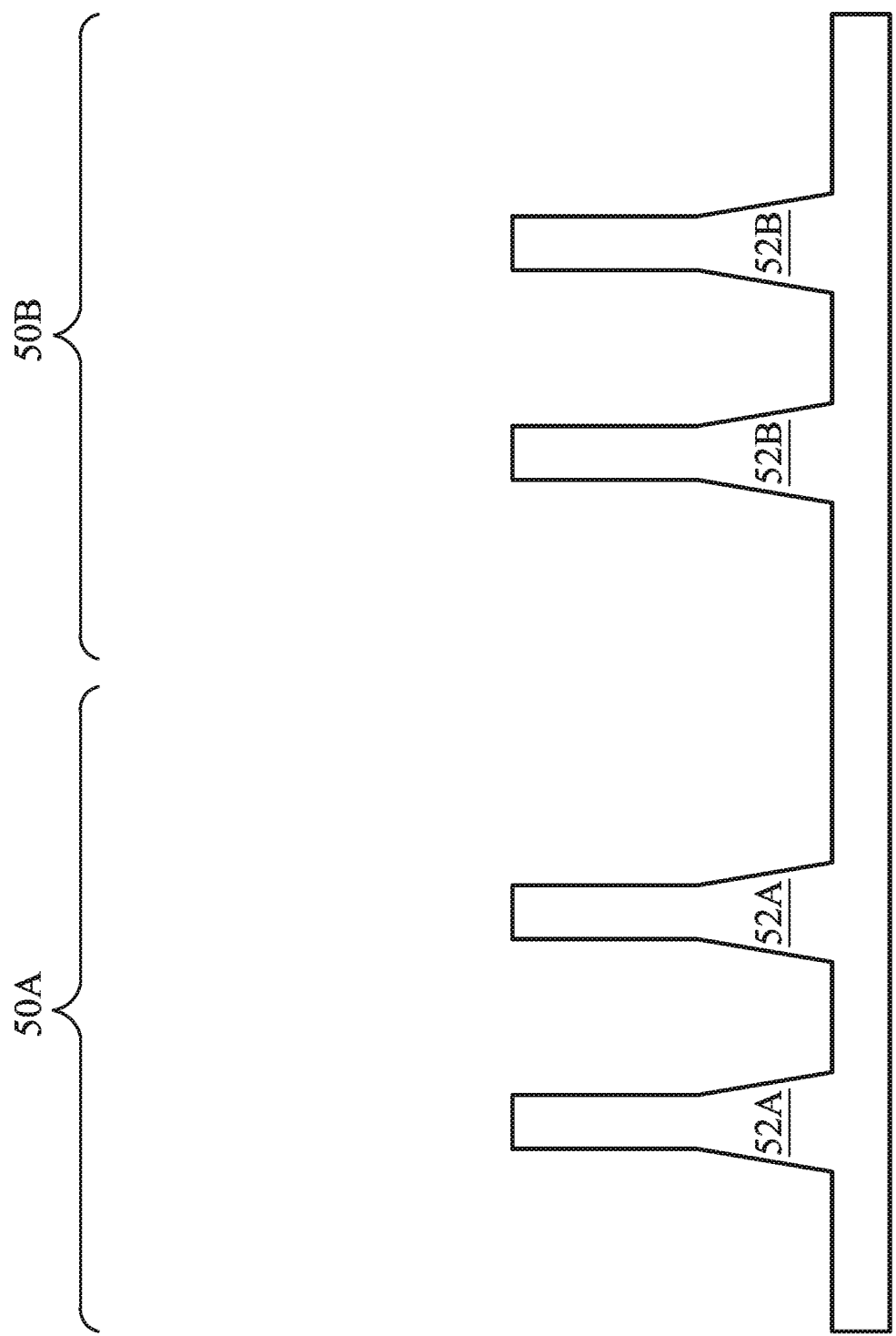

In FIG. 3, fins 52A are formed in the region 50A of the substrate 50 and fins 52B are formed in the region 50B of the substrate 50. The fins 52A and 52B are semiconductor strips. In some embodiments, the fins 52A and 52B may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins 52A and 52B may be patterned by any suitable method. For example, the fins 52A and 52B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52A and 52B. In some embodiments, the mask (or other layer) may remain on the fins 52A and 52B.

Figure 4:
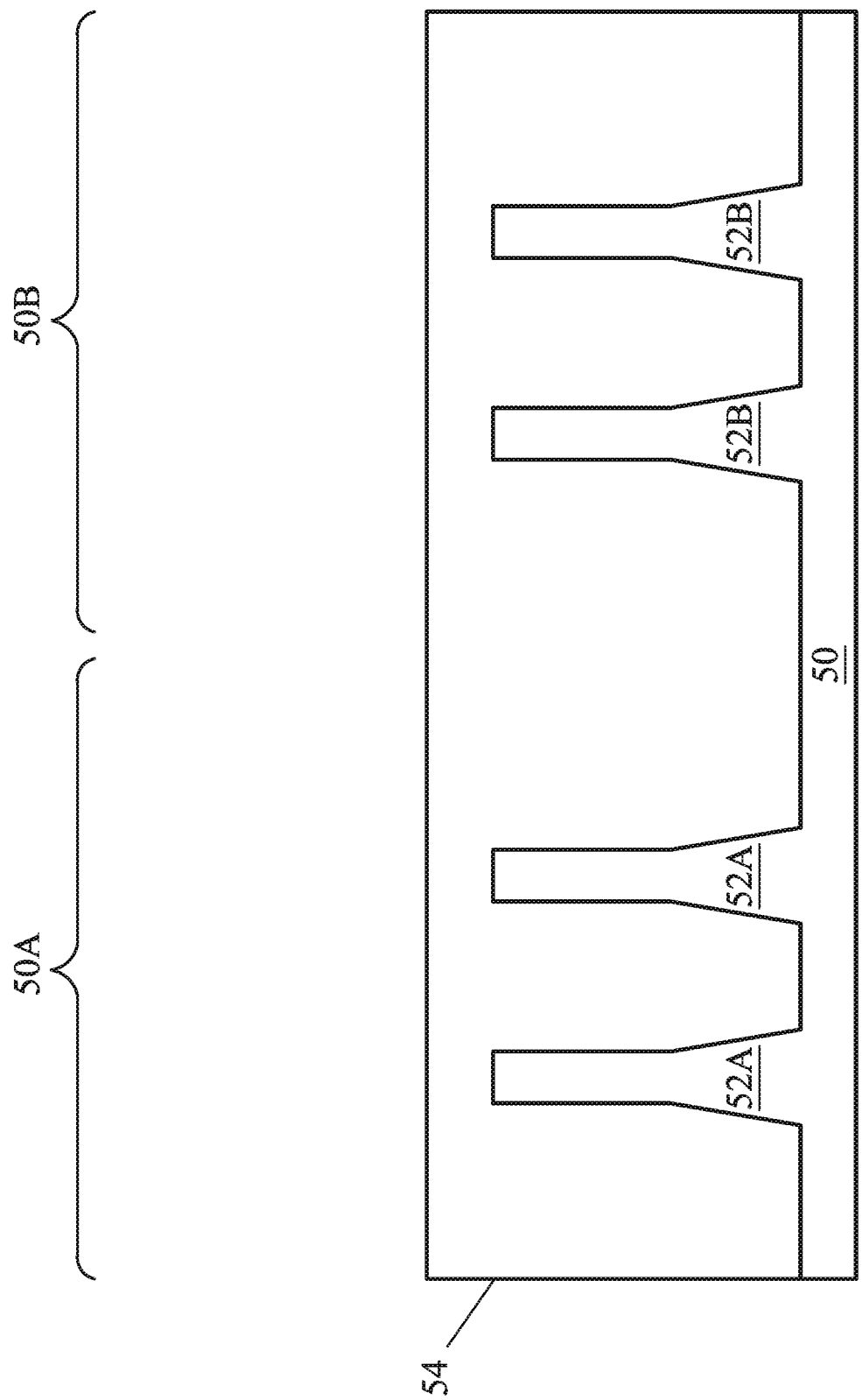

In FIG. 4, an insulation material 54 is formed over the substrate 50 and between neighboring ones of the fins 52A and 52B. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be also used. In the illustrated embodiment, the insulation material 54 is silicon oxide formed by a FCVD process. An anneal process may be performed once the insulation material 54 is formed. In some embodiments, the insulation material 54 is formed such that excess insulation material 54 covers the fins 52A and 52B. Although the insulation material 54 is illustrated as a single layer, some embodiments may utilize multiple layers. For example, in some embodiments, a liner (not shown) may first be formed along surfaces of the substrate 50 and the fins 52A and 52B. Thereafter, a fill material, such as those discussed above may be formed over the liner.

Figure 5:
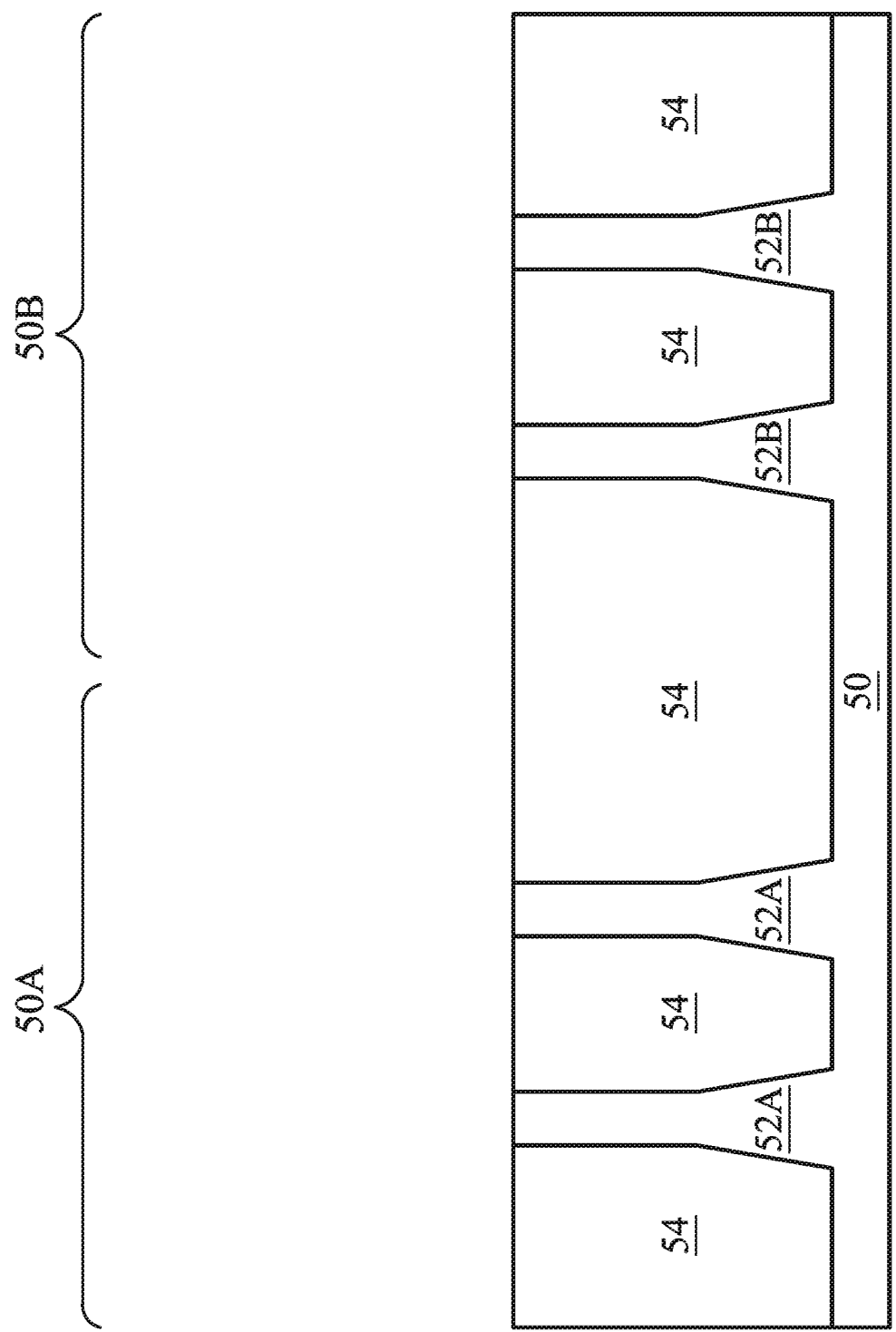

In FIG. 5, a removal process is applied to the insulation material 54 to remove excess insulation material 54 over the fins 52A and 52B. In some embodiments, a planarization process such as a chemical mechanical polish (CMP) process, an etch-back process, combinations thereof, or the like may be utilized. The planarization process exposes the fins 52A and 52B such that top surfaces of the fins 52A and 52B and a top surface of the insulation material 54 are level after the planarization process is completed. In some embodiments in which a mask remains on the fins 52A and 52B, the planarization process may expose the mask or remove the mask such that a top surface of the mask or the top surfaces of the fins 52A and 52B, respectively, and the top surface of the insulation material 54 are level after the planarization process is completed.

Figure 6:
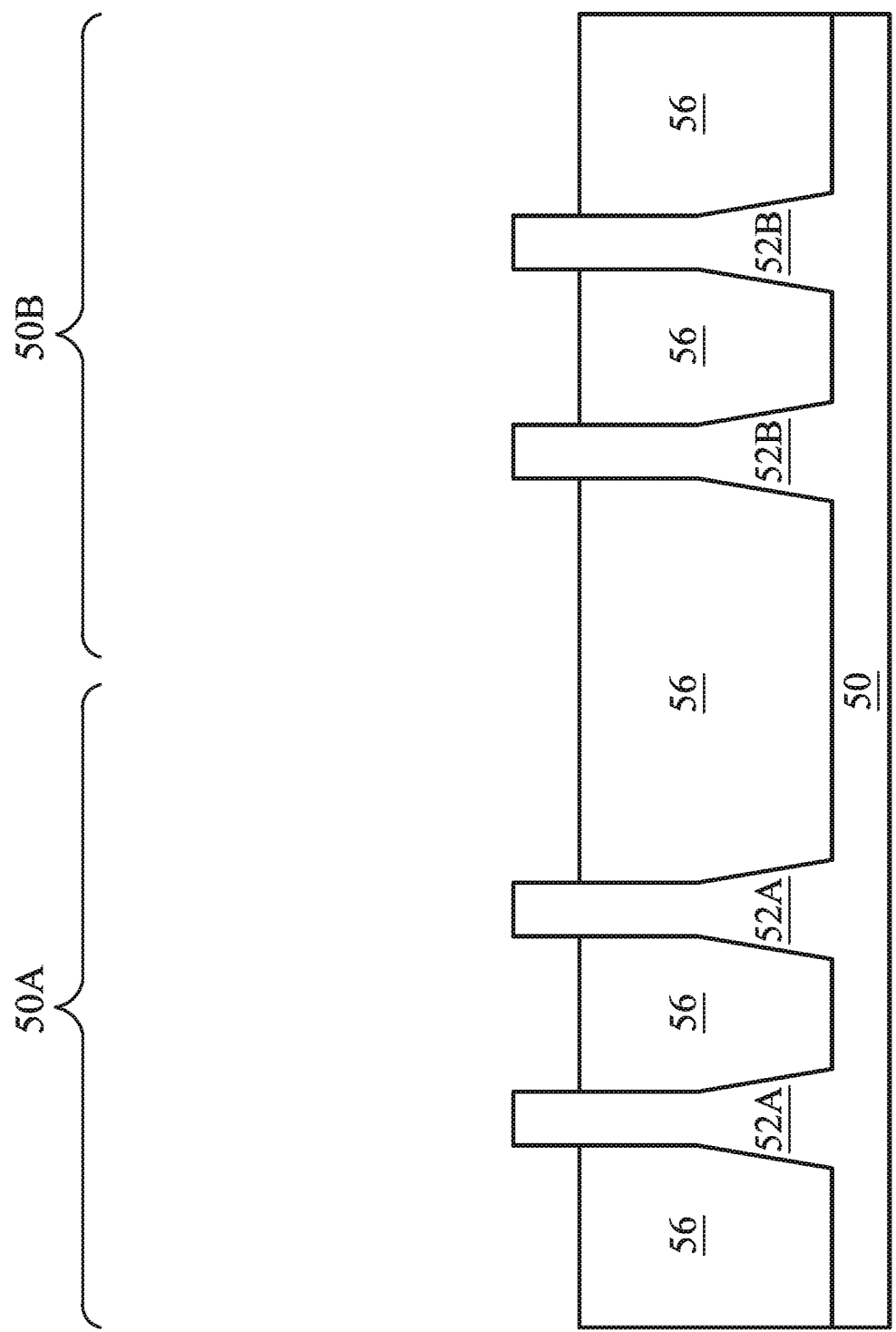

In FIG. 6, the insulation material 54 (see FIG. 5) is recessed to form shallow trench isolation (STI) regions 56. The insulation material 54 is recessed such that upper portions of fins 52A and 52B protrude from between respective neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etch process, such as one that is selective to the material of the insulation material 54 (e.g., etches the material of the insulation material 54 at a faster rate than the material of the fins 52A and 52B). For example, a chemical oxide removal with a suitable etch process using, for example, dilute hydrofluoric (dHF) acid may be used.

The process described with respect to FIGS. 2 through 6 is just one example of how the fins may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52A and 52B in FIG. 5 can be recessed, and a material different from the fins 52A and 52B may be epitaxially grown over the recessed fins 52A and 52B. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50A different from a material in the region 50B. In various embodiments, upper portions of the fins 52A and 52B may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52A and 52B, and/or the substrate 50. In some embodiments, a P well or an N well may be formed in each of the regions 50A and 50B depending on a type of a semiconductor device to be formed in the regions 50A and 50B. In some embodiments, appropriate wells may be formed in the region 50A and 50B by using a photoresist or other masks (not shown). For example, a first photoresist may be formed over the regions 50A and 50B of the substrate 50. The first photoresist is patterned to expose the region 50A of the substrate 50, while the region 50B of the substrate 50 is protected by a remaining portion of the first photoresist. The first photoresist may be formed using a spin-on technique and may be patterned using acceptable photolithography techniques. Once the first photoresist is patterned, an n-type impurity implantation or a p-type impurity implantation is performed in the region 50A, and the first photoresist may act as a mask to substantially prevent impurities from being implanted into the region 50B. After the implantation, the first photoresist is removed, such as by an acceptable ashing process followed by a wet clean process.

Following the implantation of the region 50A, a second photoresist may be formed over the regions 50A and 50B of the substrate 50. The second photoresist is patterned to expose the region 50B of the substrate 50, while the region 50A of the substrate 50 is protected by a remaining portion of the second photoresist. The second photoresist may be formed using a spin-on technique and may be patterned using acceptable photolithography techniques. Once the second photoresist is patterned, an n-type impurity implantation or a p-type impurity implantation is performed in the region 50B, and the second photoresist may act as a mask to substantially prevent impurities from being implanted into the region 50A. After the implantation, the second photoresist is removed, such as by an acceptable ashing process followed by a wet clean process.

The n-type impurities may be phosphorus, arsenic, antimony, or the like, implanted in the regions 50A or 50B to a dose of equal to or less than $10^{15}$ cm$^{-2}$, such as between about $10^{12}$ cm$^{-2}$ and about $10^{15}$ cm$^{-2}$. In some embodiments, the n-type impurities may be implanted at an implantation energy of about 1 keV to about 10 keV. The p-type impurities may be boron, $BF_2$, indium, or the like, implanted in the regions 50A and 50B to a dose of equal to or less than $10^{15}$ cm$^{-2}$, such as between about $10^{12}$ cm$^{-2}$ and about $10^{15}$ cm$^{-2}$. In some embodiments, the p-type impurities may be implanted at an implantation energy of about 1 keV to about 10 keV. After performing the implantations of the region 50A and the region 50B, an anneal process may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
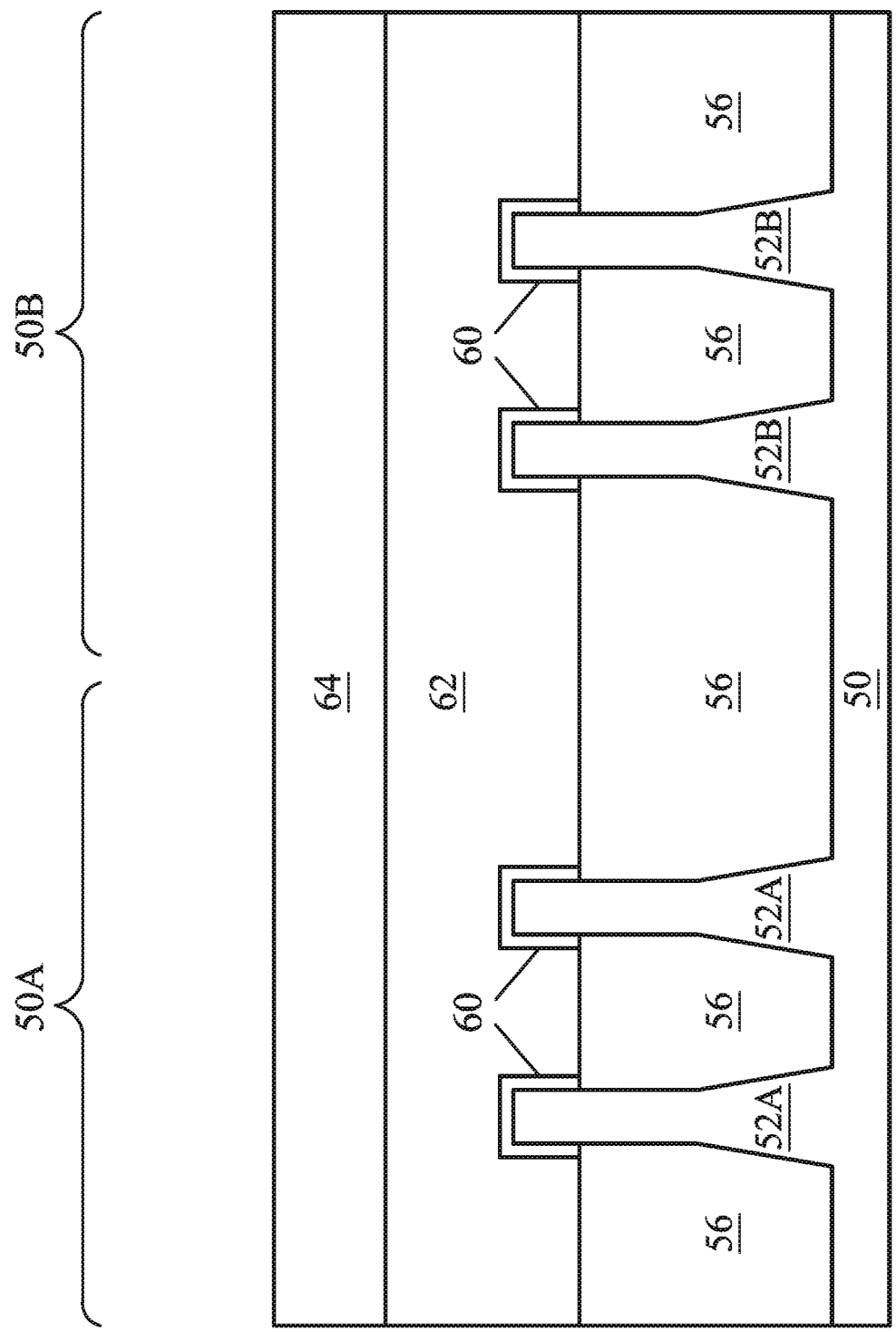

In FIG. 7, a dummy dielectric layer 60 is formed on the fins 52A and 52B. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The mask layer 64 may include, for example, SiN, SiON, a combination thereof, or the like. In the illustrated embodiment, a single dummy gate layer 62 and a single mask layer 64 are formed across the region 50A and the region 50B. In other embodiments, a first dummy gate layer formed in the region 50A may be different from a second dummy gate layer formed in the region 50B. It is noted that the dummy dielectric layer 60 is shown covering only the fins 52A and 52B for illustrative purposes only. In some embodiments, the dummy dielectric layer 60 may be deposited such that the dummy dielectric layer 60 covers top surfaces of the STI regions 56, extending between the dummy gate layer 62 and the STI regions 56.

Figure 8A:
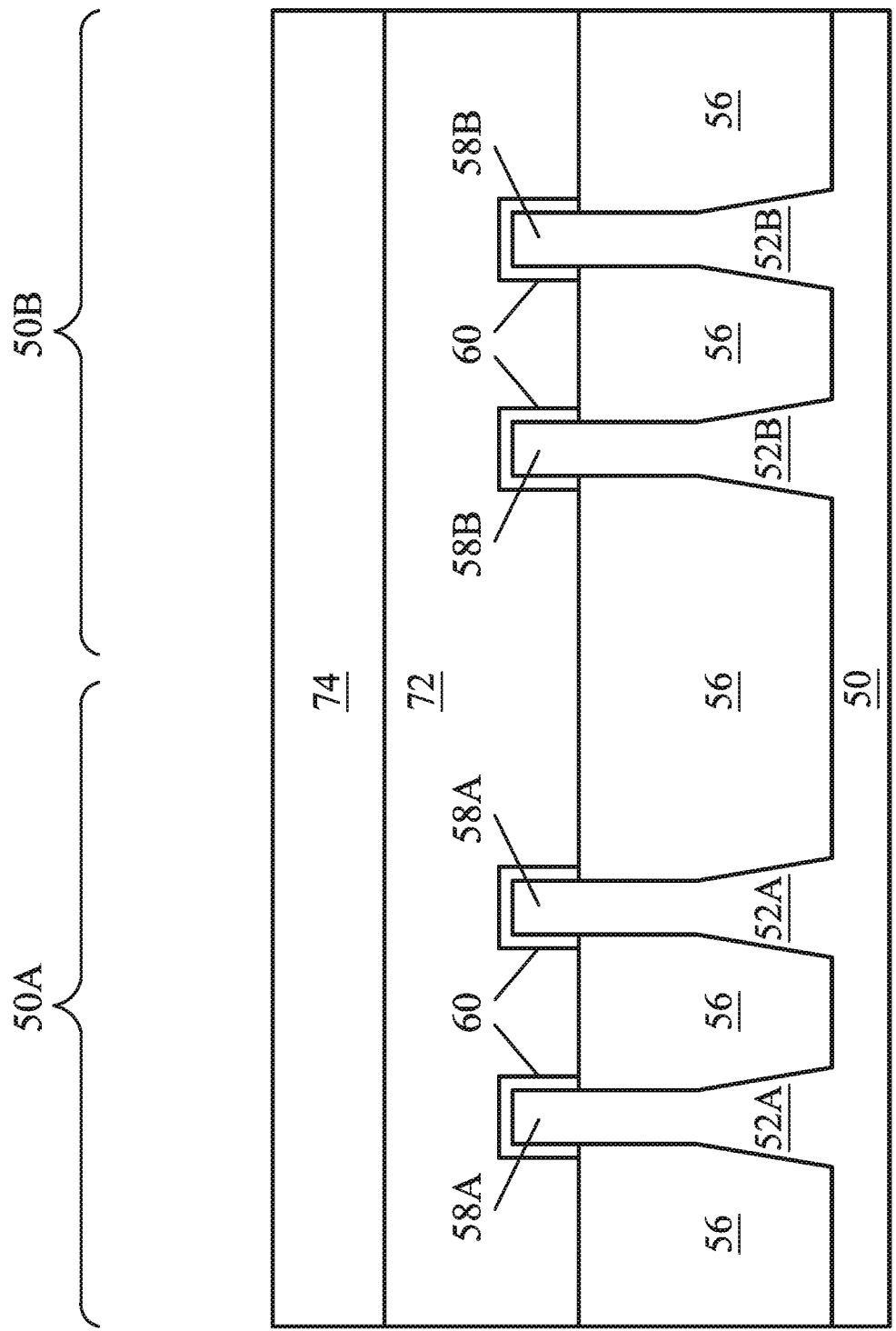

In FIGS. 8A and 8B, the mask layer 64 (see FIG. 7) may be patterned using acceptable photolithography and etching techniques to form masks 74. The pattern of the masks 74 then may be transferred to the dummy gate layer 62 (see FIG. 7) to form dummy gates 72. In some embodiments, the pattern of the masks 74 may also be transferred to the dummy dielectric layer 60 by an acceptable etching technique. The dummy gates 72 cover channel regions 58A and 58B of the fins 52A and 52B, respectively. The pattern of the masks 74 may be used to physically separate each of the dummy gates 72 from adjacent dummy gates. The dummy gates 72 may also have a lengthwise direction substantially perpendicular to the lengthwise direction of respective one of the fins 52A and 52B. As described below in greater detail, the dummy gates 72 are sacrificial gates and are subsequently replaced by replacement gates. Accordingly, dummy gates 72 may also be referred to as sacrificial gates. In other embodiments, some of the dummy gates 72 are not replaced and remain in the final structure of the resulting FinFET device.

Further in FIGS. 8A and 8B, gate seal spacers 80 may be formed on exposed surfaces of the dummy gates 72, the masks 74, and/or the fins 52A and 52B. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. After the formation of the gate seal spacers 80, lightly doped source/drain (LDD) regions (not explicitly illustrated) may be formed. In some embodiments when a p-type device is formed in the region 50A of the substrate 50, p-type impurities may be implanted into the exposed fins 52A in the region 50A. In some embodiments when an n-type device is formed in the region 50A of the substrate 50, n-type impurities may be implanted into the exposed fins 52A in the region 50A. In some embodiments when a p-type device is formed in the region 50B of the substrate 50, p-type impurities may be implanted into the exposed fins 52B in the region 50B. In some embodiments when an n-type device is formed in the region 50B of the substrate 50, n-type impurities may be implanted into the exposed fins 52B in the region 50B. The n-type impurities may be the any of the n-type impurities previously discussed, and the p-type impurities may be the any of the p-type impurities previously discussed. The lightly doped source/drain regions may have a dose of impurities of from about $10^{12}$ cm$^{-2}$ to about $10^{16}$ cm$^{-2}$. In some embodiments, the n-type impurities or the p-type impurities may be implanted at an implantation energy of about 1 keV to about 10 keV. An anneal may be used to activate the implanted impurities.

Figure 9A:
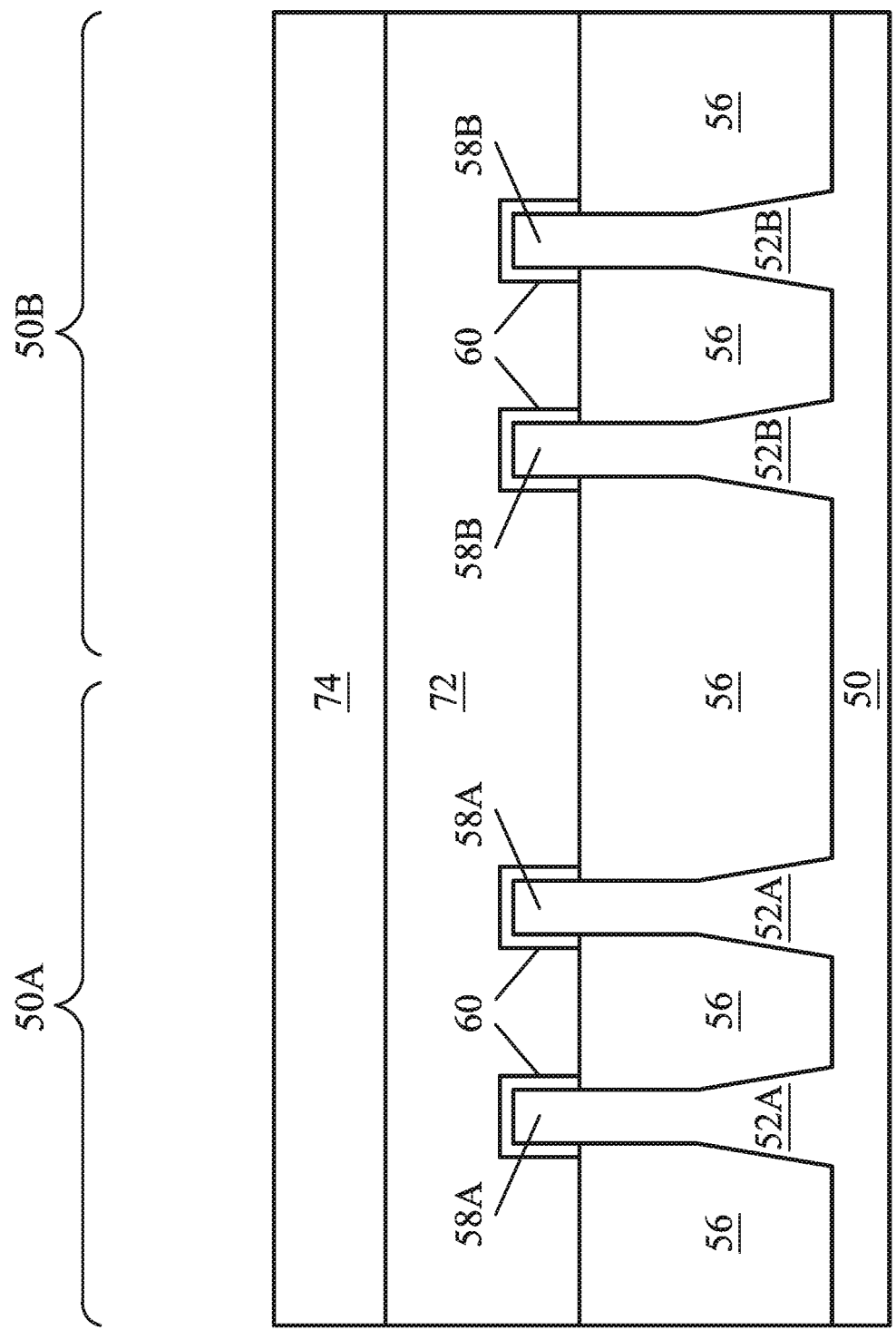

In FIGS. 9A and 9B, gate spacers 86 are formed on the gate seal spacers 80 along sidewalls of the dummy gates 72, the masks 74 and/or fins 52A and 52B. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10A:
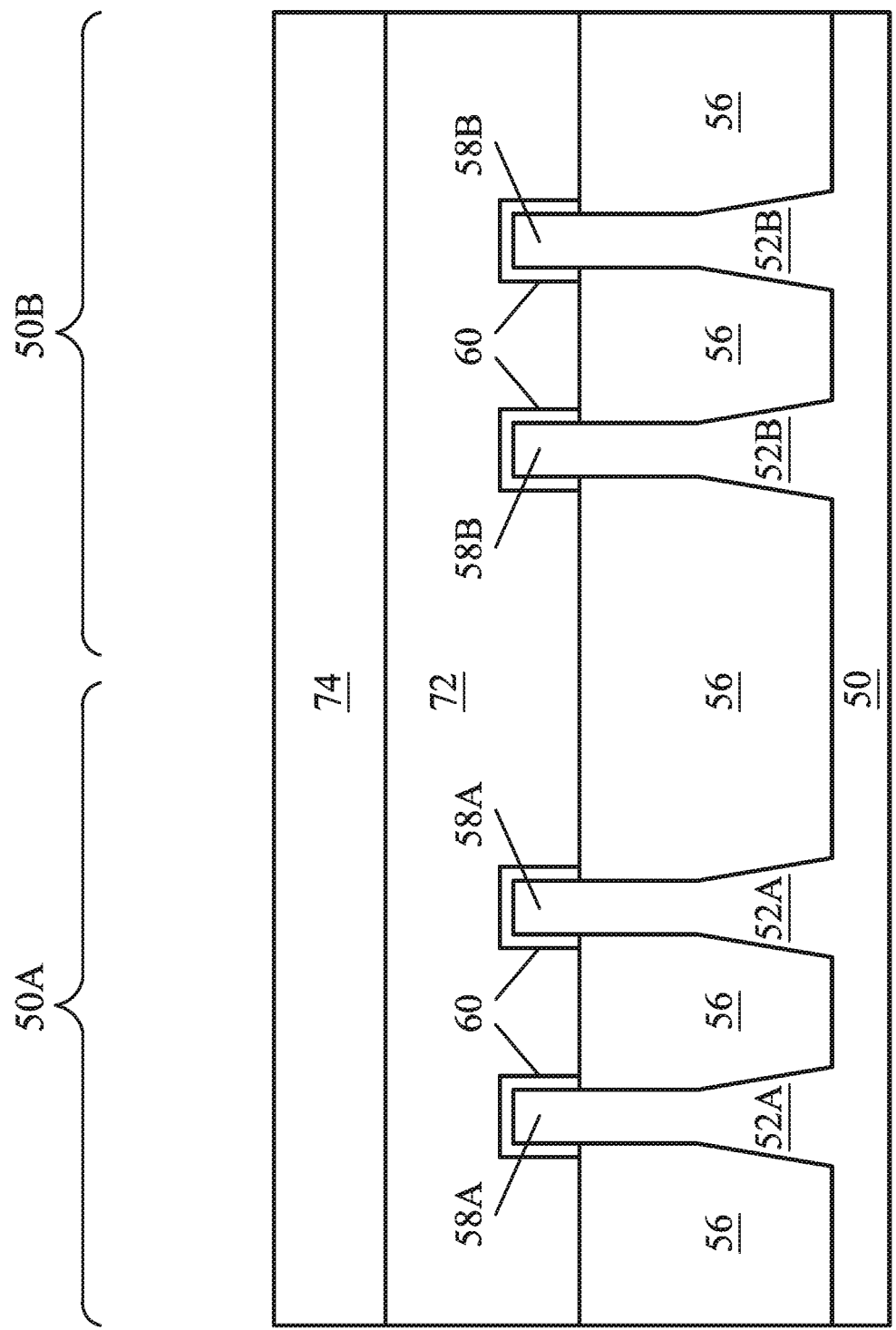
Figure 10C:
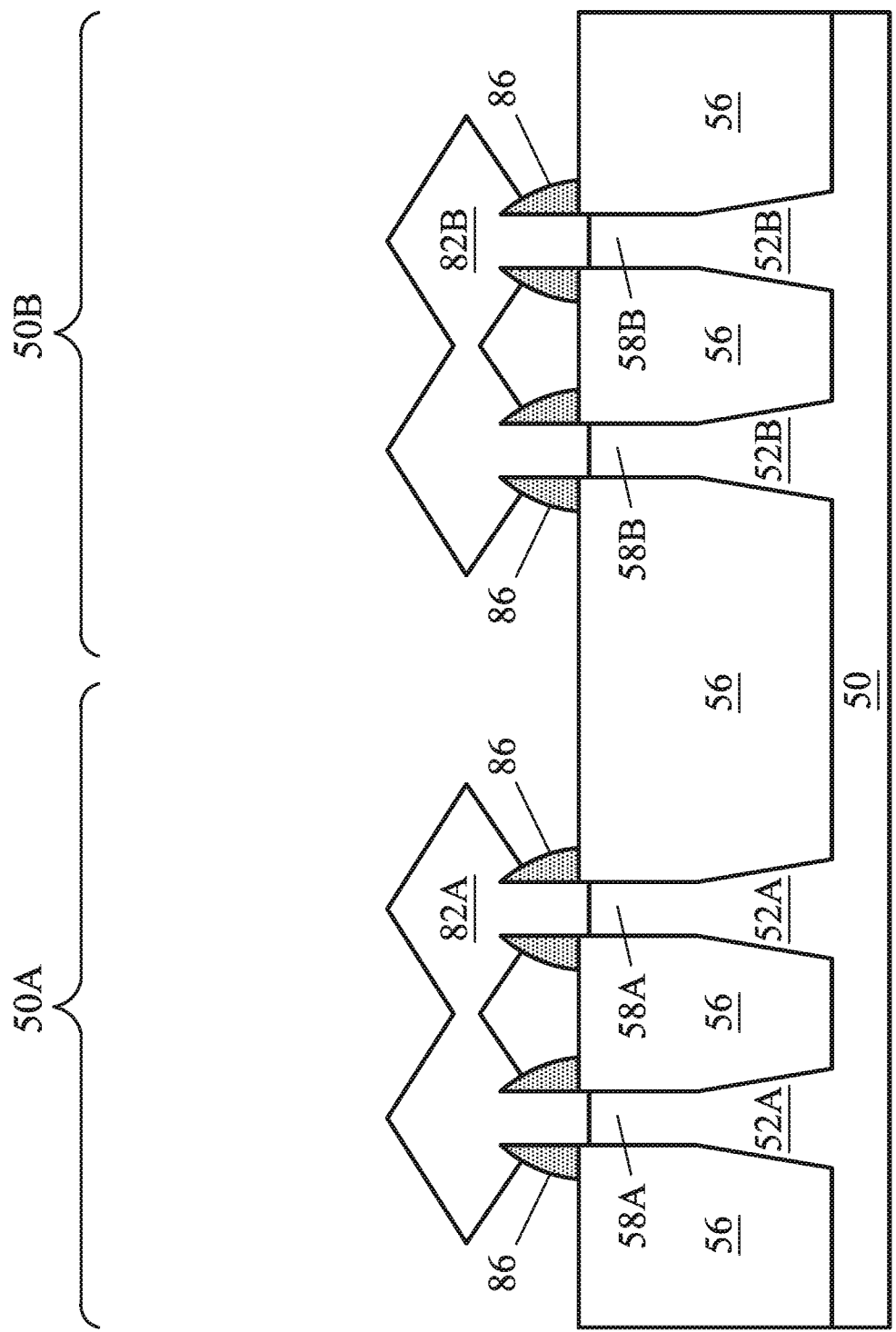
Figure 10D:
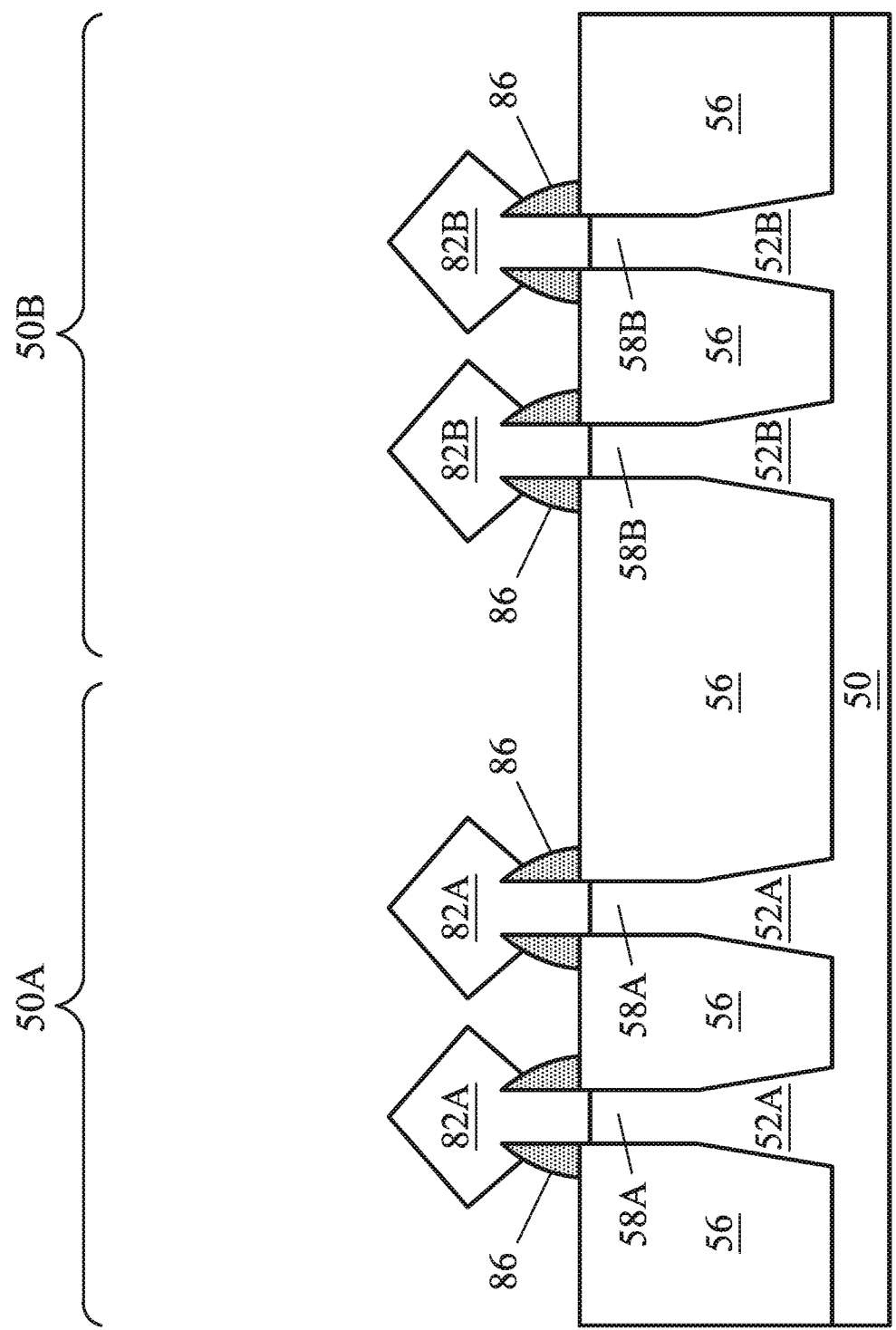

In FIGS. 10A and 10B, epitaxial source/drain regions 82A and 82B are formed in the fins 52A and 52B, respectively, to exert stress in the respective ones of the channel regions 58A and 58B, thereby improving device performance. The epitaxial source/drain regions 82A and 82B are formed in the fins 52A and 52B, respectively, such that each dummy gate 72 is disposed between respective neighboring pairs of the epitaxial source/drain regions 82A and 82B. In some embodiments, the epitaxial source/drain regions 82A and 82B may extend into, and may also penetrate through, the fins 52A and 52B, respectively. In some embodiments, the gate spacers 86 are used to separate the epitaxial source/drain regions 82A and 82B from the dummy gates 72 by an appropriate lateral distance so that the epitaxial source/drain regions 82A and 82B do not short out subsequently formed gates of the resulting FinFET device.

The epitaxial source/drain regions 82A and 82B may be formed in the regions 50A and 50B, respectively, by etching source/drain regions of the fins 52A and 52B to form recesses in the fins 52A and 52B. Then, the epitaxial source/drain regions 82A and 82B are epitaxially grown in the respective recesses. In some embodiments when an n-type device is formed in the region 50A of the substrate 50, the epitaxial source/drain regions 82A may include any acceptable material, such as appropriate for n-type FinFETs. For example, if the fins 52A are formed of silicon, the epitaxial source/drain regions 82A may include materials exerting a tensile strain in the channel region 58A, such as silicon, SiC, SiCP, SiP, a combination thereof, or the like. The epitaxial source/drain regions 82A may have surfaces raised from respective surfaces of the fins 52A and may have facets. In some embodiments when a p-type device is formed in the region 50A of the substrate 50, the epitaxial source/drain regions 82A may include any acceptable material, such as appropriate for p-type FinFETs. For example, if the fins 52A are formed of silicon, the epitaxial source/drain regions 82A may comprise materials exerting a compressive strain in the channel region 58A, such as SiGe, SiGeB, Ge, GeSn, a combination thereof, or the like. The epitaxial source/drain regions 82A may have surfaces raised from respective surfaces of the fins 52A and may have facets.

In some embodiments when an n-type device is formed in the region 50B of the substrate 50, the epitaxial source/drain regions 82B may include any acceptable material, such as appropriate for n-type FinFETs. For example, if the fins 52B are formed of silicon, the epitaxial source/drain regions 82B may include materials exerting a tensile strain in the channel region 58B, such as silicon, SiC, SiCP, SiP, a combination thereof, or the like. The epitaxial source/drain regions 82B may have surfaces raised from respective surfaces of the fins 52B and may have facets. In some embodiments when a p-type device is formed in the region 50B of the substrate 50, the epitaxial source/drain regions 82B may include any acceptable material, such as appropriate for p-type FinFETs. For example, if the fins 52B are formed of silicon, the epitaxial source/drain regions 82B may comprise materials exerting a compressive strain in the channel region 58B, such as SiGe, SiGeB, Ge, GeSn, a combination thereof, or the like. The epitaxial source/drain regions 82B may have surfaces raised from respective surfaces of the fins 52B and may have facets.

The epitaxial source/drain regions 82A and 82B and/or the fins 52A and 52B may be implanted with dopants to form source/drain regions, similar to the process previously discussed for forming lightly-doped source/drain regions, followed by an anneal process. The source/drain regions 82A and 82B may have an impurity concentration of between about $10^{19}$ cm$^{-3}$ and about $10^{21}$ cm$^{-3}$. The n-type and/or p-type impurities for source/drain regions 82A and 82B may be any of the impurities previously discussed. In some embodiments, the epitaxial source/drain regions 82A and 82B may be in situ doped during growth.

As a result of the epitaxy processes used to form the epitaxial source/drain regions 82A and 82B, upper surfaces of the epitaxial source/drain regions have facets which expand laterally outward beyond sidewalls of the fins 52A and 52B, respectively. In some embodiments, these facets cause adjacent ones of the epitaxial source/drain regions 82A of a device formed in the region 50A and adjacent ones of the epitaxial source/drain regions 82B of a device formed in the region 50B to merge as illustrated by FIG. 10C. In other embodiments, adjacent ones of the epitaxial source/drain regions 82A and adjacent ones of the epitaxial source/drain regions 82B remain separated after the epitaxy process is completed as illustrated by FIG. 10D. In the embodiments illustrated in FIGS. 10C and 10D, gate spacers 86 are formed covering a portion of the sidewalls of the fins 52A and 52B that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11A:
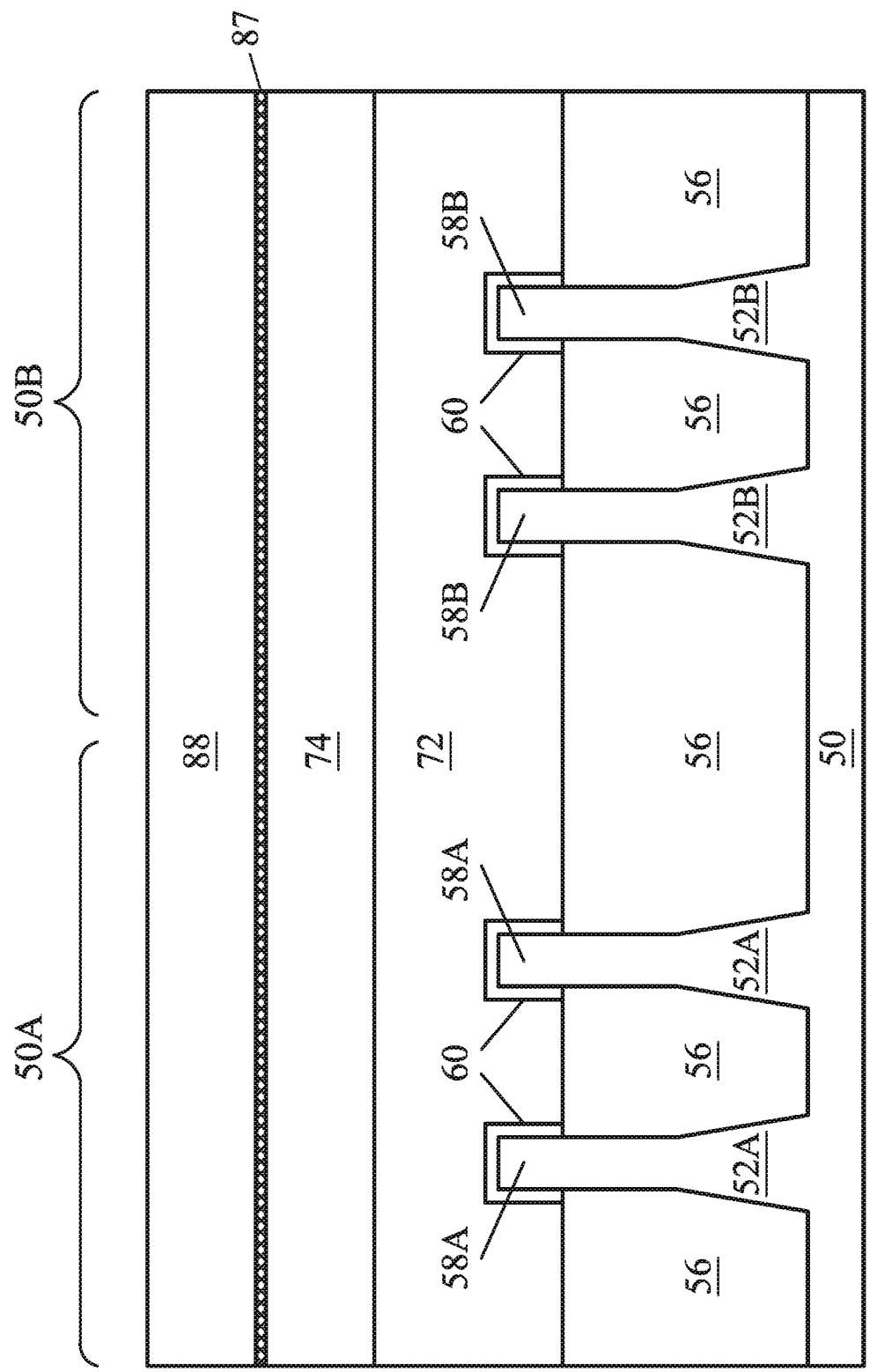
Figure 11B:
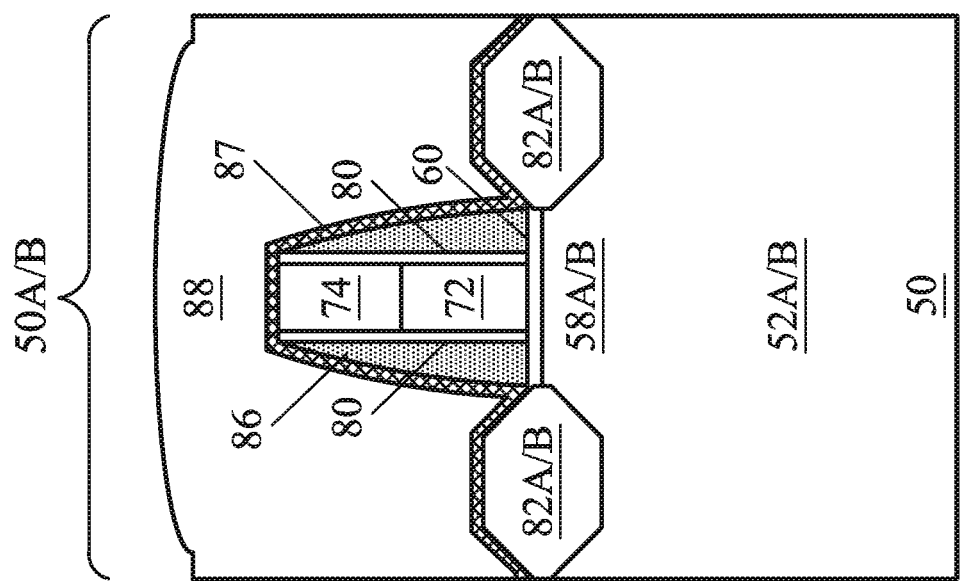

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 87 is disposed between the first ILD 88 and the epitaxial source/drain regions 82A and 82B, the masks 74, and the gate spacers 86. The CESL 87 may comprise a dielectric material, such as silicon nitride, silicon oxide, silicon oxynitride, a combination thereof, or the like, having a different etch rate than the material of the overlying first ILD 88.

Figure 12A:
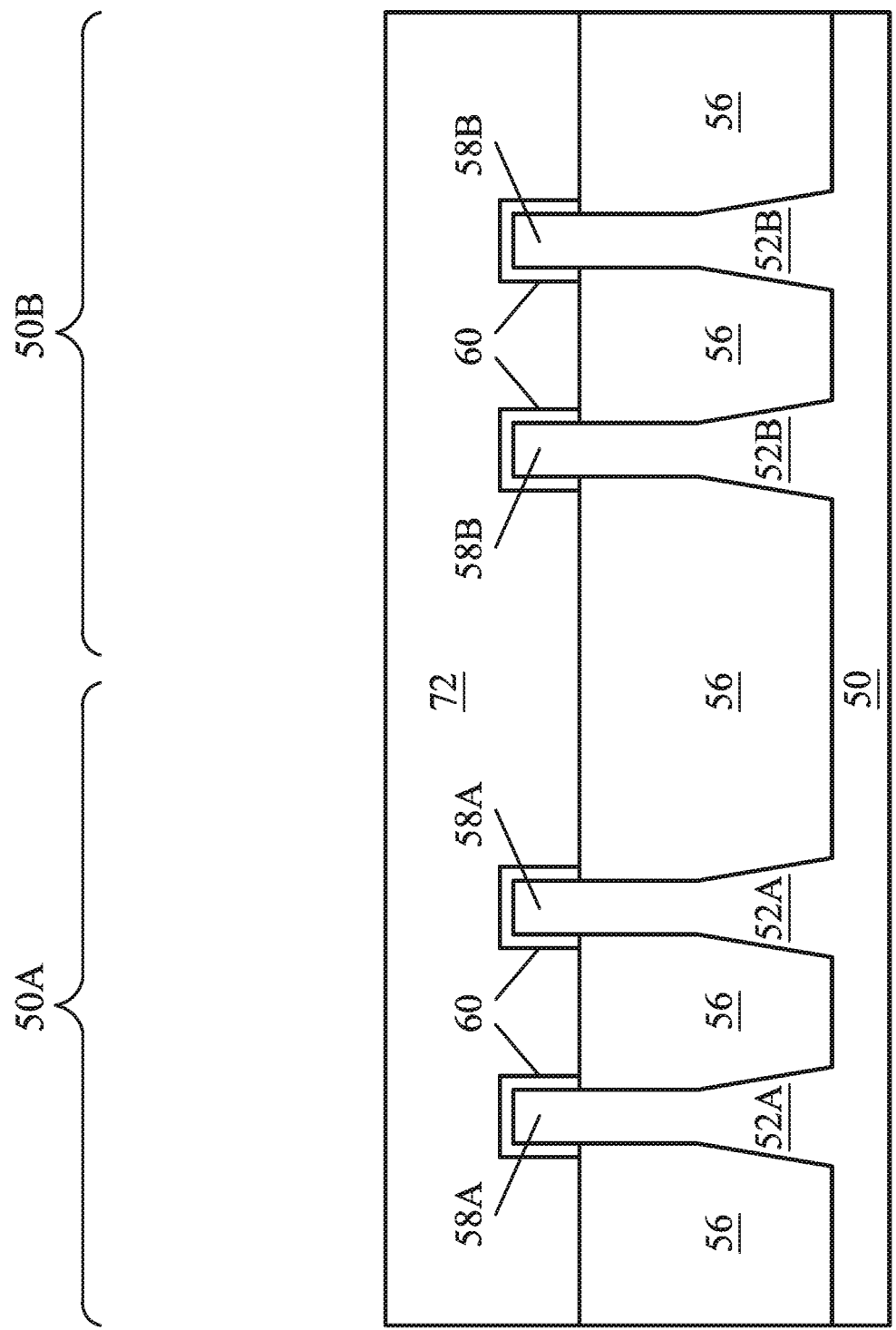
Figure 12B:
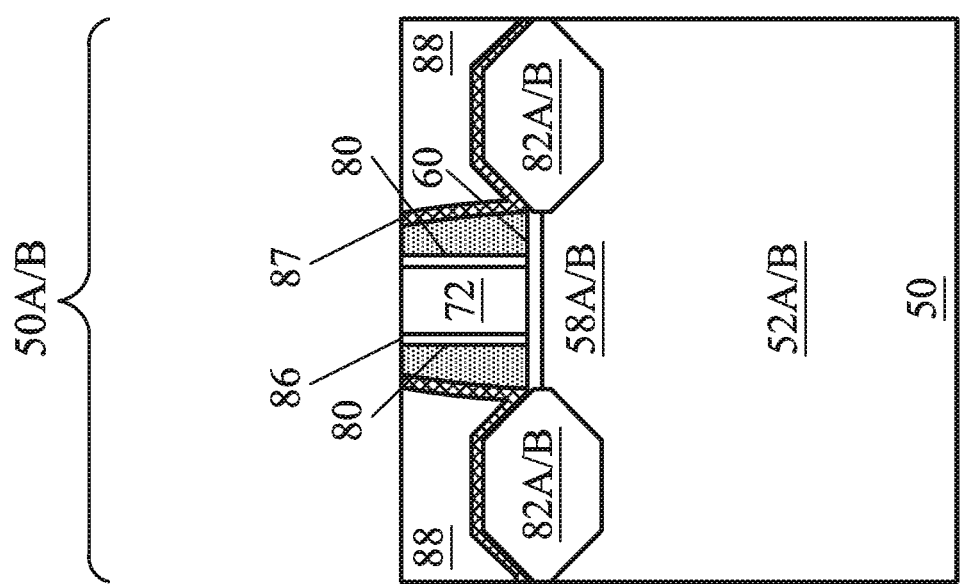

In FIGS. 12A and 12B, a planarization process, such as a CMP process, may be performed to level the top surface of the first ILD 88 with the top surfaces of the dummy gates 72 or the masks 74 (see FIGS. 11A and 11B). The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level with each other. Accordingly, the top surfaces of the dummy gates 72 are exposed through the first ILD 88. In some embodiments, the masks 74 may remain, in which case the planarization process levels the top surface of the first ILD 88 with the top surfaces of the masks 74 (see FIGS. 11A and 11B).

Figure 13A:
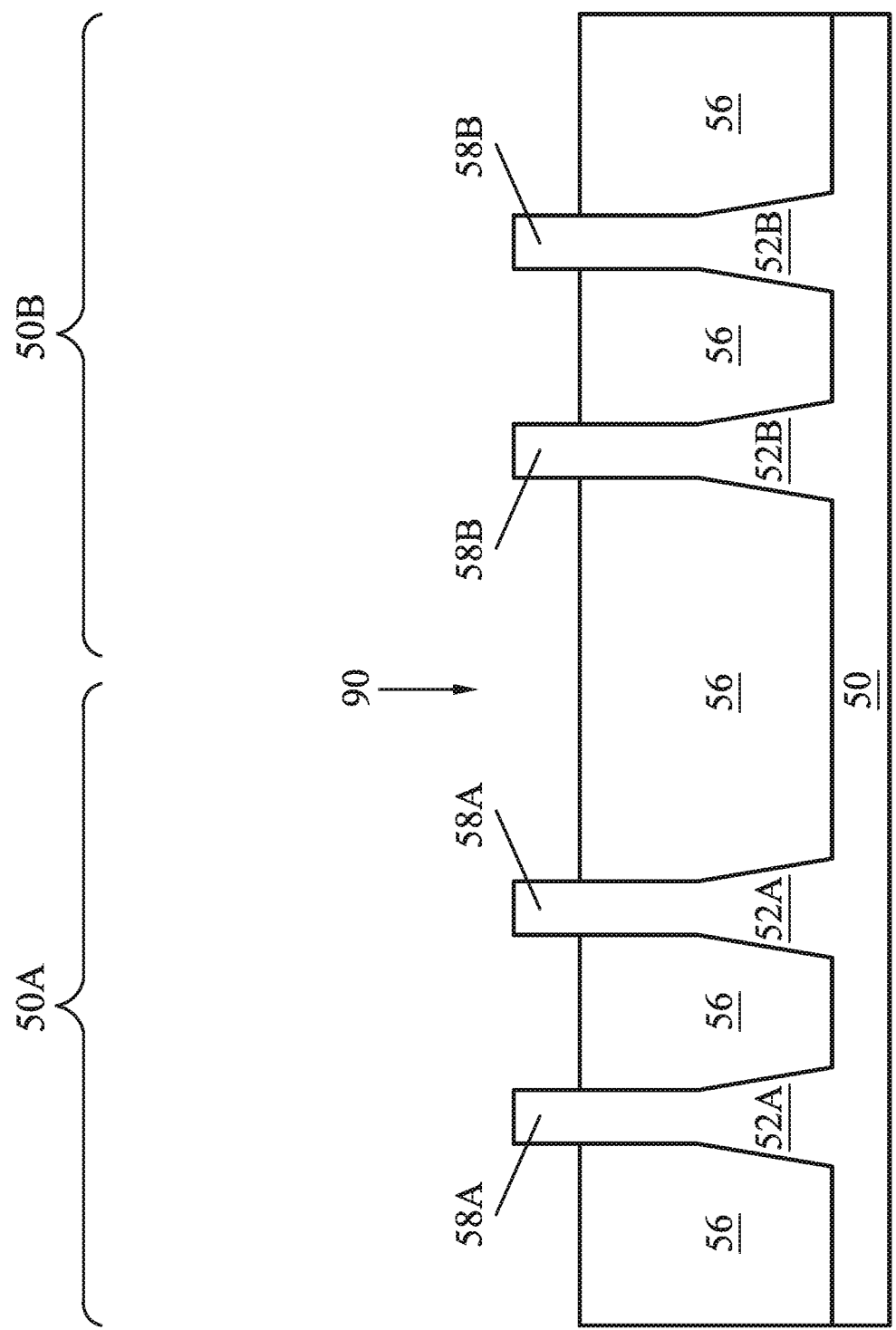
Figure 13B:
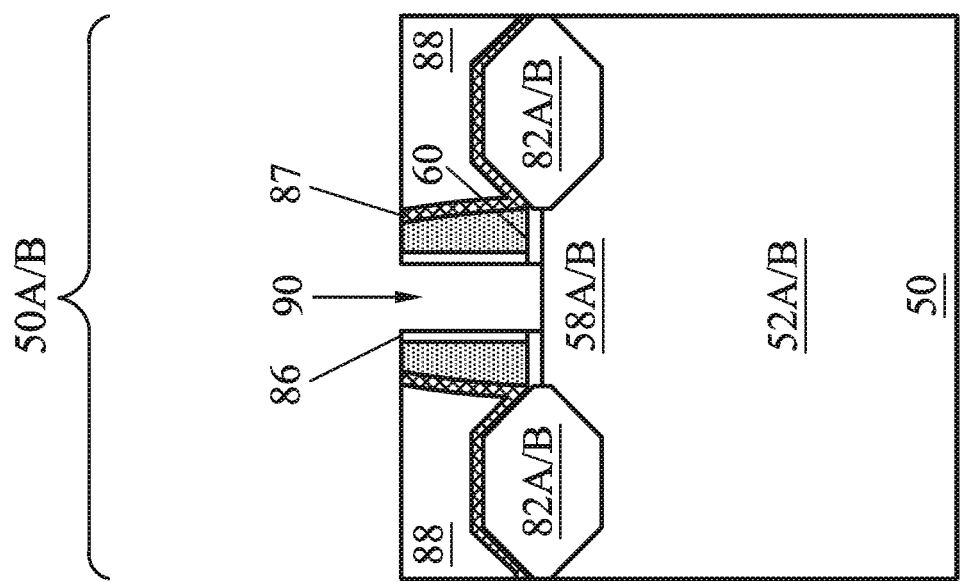

In FIGS. 13A and 13B, the dummy gates 72, and the masks 74, if present, are removed in an etching step(s), so that openings 90 are formed. Portions of the dummy dielectric layer 60 in the openings 90 may also be removed. In some embodiments, only the dummy gates 72 are removed and the dummy dielectric layer 60 remains and is exposed by the openings 90. In some embodiments, the dummy dielectric layer 60 is removed from the openings 90 in a first region of a die (e.g., a core logic region) and remains in openings 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each opening 90 exposes a channel region 58A (58B) of a respective fin 52A (52B). During the removal, the dummy dielectric layer 60 may be used as an etch stop layer when the dummy gates 72 are etched. The dummy dielectric layer 60 may then be optionally removed after the removal of the dummy gates 72.

Figure 14A:
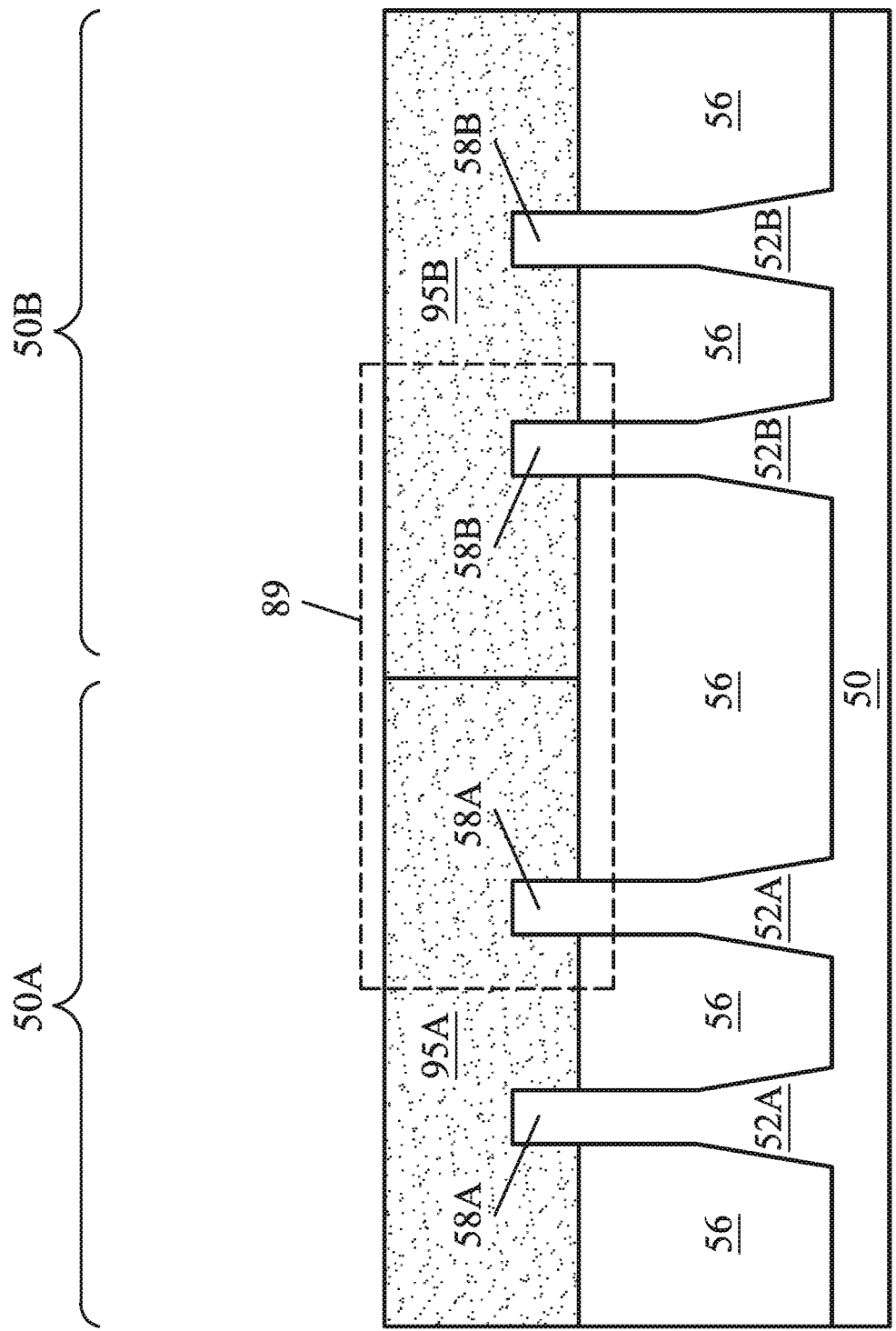
Figure 14B:
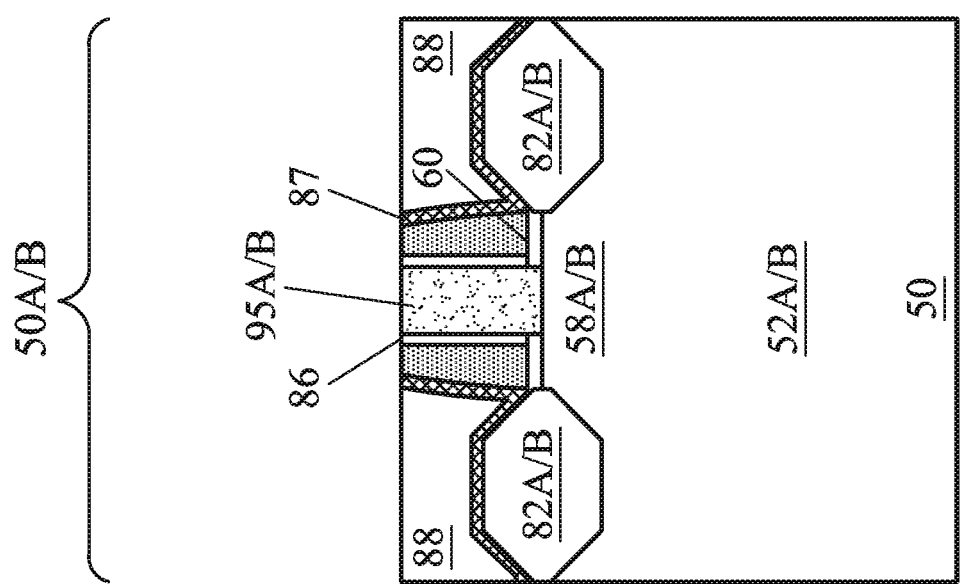

In FIGS. 14A and 14B, gate stacks 95A and 95B are formed in the region 50A and 50B of the substrate 50, respectively, within the opening 90. The gate stacks 95A and 95B may be also referred to as replacement gates. The gate stack 95A extends along sidewalls and top surfaces of the channel regions 58A of the fins 52A. The gate stack 95B extends along sidewalls and top surfaces of the channel regions 58B of the fins 52B. In some embodiments, the gate stacks 95A and 95B may be formed as described below with reference to FIGS. 17-22 and the detailed description is provided at that time. In other embodiments, the gate stacks 95A and 95B may be formed as described below with reference to FIGS. 23-29 and the detailed description is provided at that time. In yet other embodiments, the gate stacks 95A and 95B may be formed as described below with reference to FIGS. 30-37 and the detailed description is provided at that time.

Figure 15A:
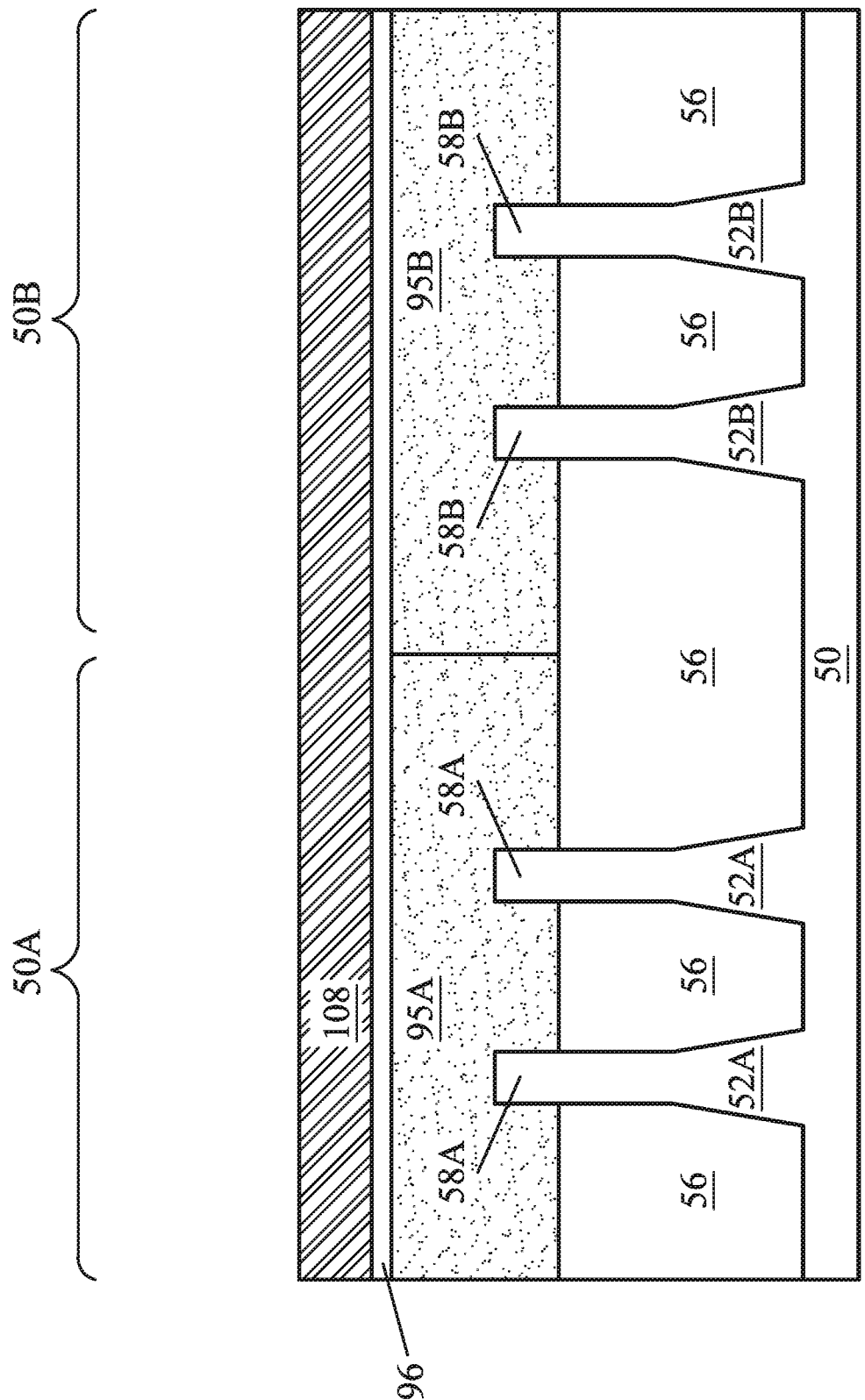
Figure 15B:
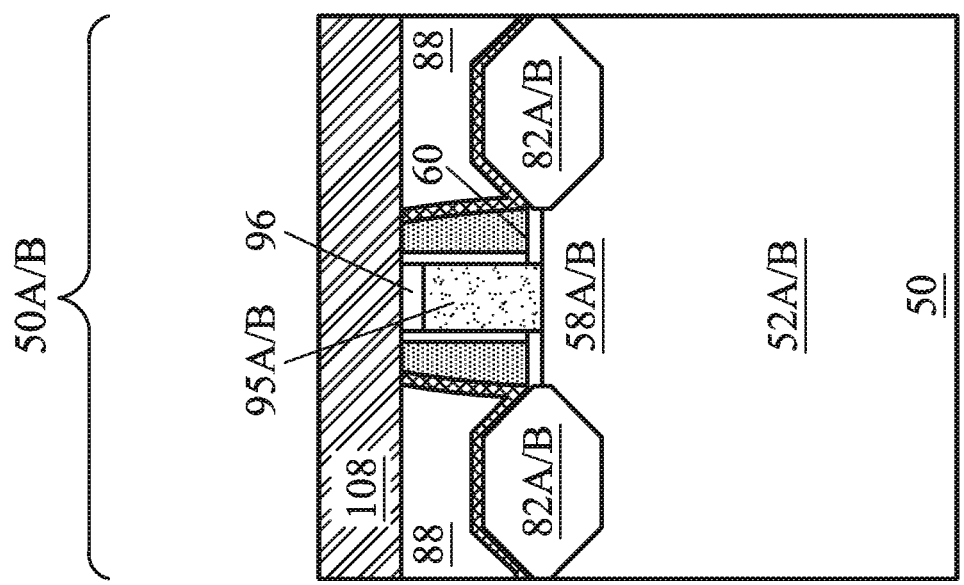

In FIGS. 15A and 15B, a second ILD 108 is deposited over the first ILD 88 and the gate stacks 95A and 95B. In some embodiment, the second ILD 108 is a flowable film formed by a flowable CVD method. In some embodiments, the second ILD 108 is formed of a dielectric material such as PSG, BSG, BPSG, USG, a combination thereof, or the like, and may be deposited by any suitable method, such as CVD, PECVD, a combination thereof, or the like. In some embodiments, the first ILD 88 and the second ILD 108 comprise a same material. In other embodiments, the first ILD 88 and the second ILD 108 comprise different materials. In some embodiments, before the formation of the second ILD 108, the gate stacks 95A and 95B are recessed, so that recesses are formed directly over the gate stacks 95A and 95B and between opposing portions of the gate spacers 86. Gate masks 96 comprising one or more layers of dielectric material, such as silicon nitride, silicon oxynitride, a combination thereof, or the like, are filled in the recesses, followed by a planarization process to remove excess portions of the dielectric material extending over the first ILD 88. The subsequently formed gate contacts 110A and 110B (see FIGS. 16A and 16B) penetrate through the respective gate mask 96 to contact the top surface of the respective ones of the gate stacks 95A and 95B.

Figure 16A:
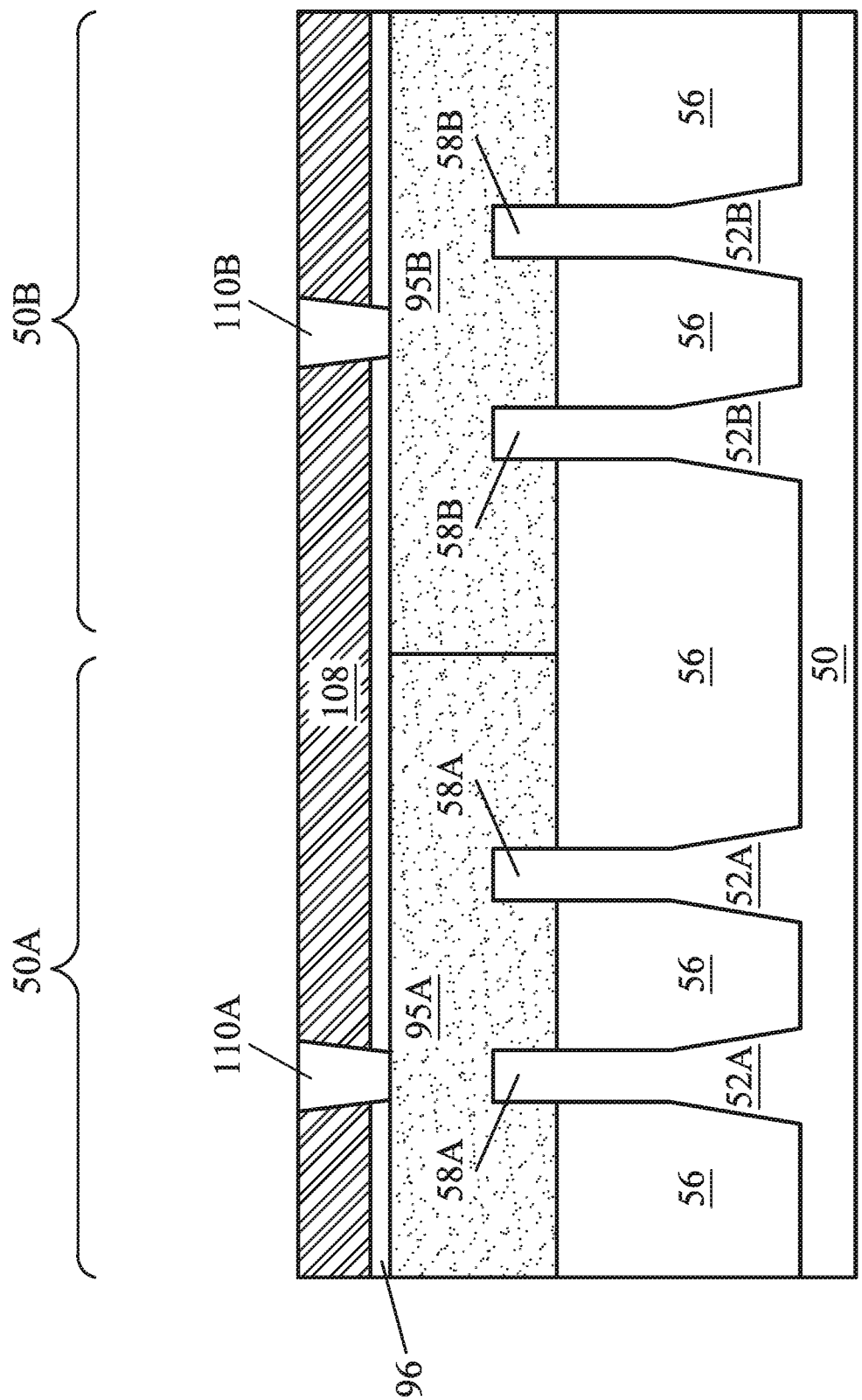
Figure 16B:
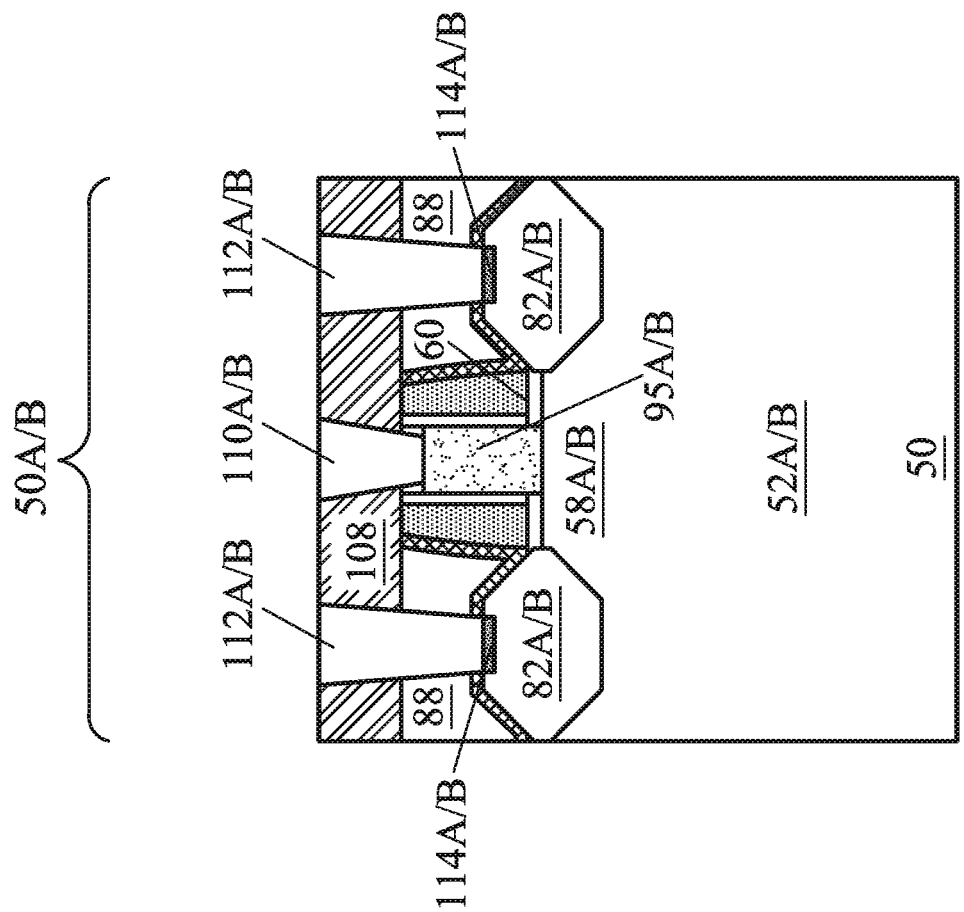

In FIGS. 16A and 16B, gate contacts 110A and 110B and source/drain contacts 112A and 112B are formed through the second ILD 108 and the first ILD 88 in the regions 50A and 50B, respectively, in accordance with some embodiments. Openings for the source/drain contacts 112A and 112B are formed through the first ILD 88 and the second ILD 108, and openings for the gate contacts 110A and 110B are formed through the second ILD 108 and the gate masks 96. The openings may be formed using acceptable photolithography and etching techniques. After forming the openings for the source/drain contacts 112A and 112B, silicide layers 114A and 114B, respectively, are formed through the openings for the source/drain contacts 112A and 112B. In some embodiments, a metallic material is deposited in the openings for the source/drain contacts 112A and 112B. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 114A and 114B in the regions 50A and 50B, respectively. In some embodiments where the epitaxial source/drain regions 82A and 82B comprise silicon, the annealing process causes the metallic material to react with silicon to form a silicide of the metallic material at interfaces between the metallic material and the epitaxial source/drain regions 82A and 82B. After forming the silicide layers 114A and 114B, unreacted portions of the metallic material are removed using a suitable removal process. Subsequently, a liner, such as a diffusion barrier layer, an adhesion layer, or the like, and a conductive material are formed in the openings for the source/drain contacts 112A and 112B, and in the openings for the gate contacts 110A and 110B. The liner may include titanium, titanium nitride, tantalum, tantalum nitride, a combination thereof, or the like. The conductive material may be copper, a copper alloy, silver, gold, tungsten, cobalt, aluminum, nickel, a combination thereof, or the like. A planarization process, such as a CMP process, may be performed to remove excess material from a surface of the second ILD 108. The remaining portions of the liner and the conductive material in the openings form the source/drain contacts 112A and 112B, and the gate contacts 110A and 110B. The source/drain contacts 112A and 112B are physically and electrically coupled to the epitaxial source/drain regions 82A and 82B, respectively. The gate contacts 110A and 110B are physically and electrically coupled to the gate stacks 95A and 95B, respectively. The source/drain contacts 112A and 112B, and the gate contacts 110A and 110B may be formed in different processes, or may be formed in the same process. Although shown as being formed in the same cross-sections, it should be appreciated that each of the source/drain contacts 112A and 112B and the gate contacts 110A and 110B may be formed in different cross-sections, which may avoid shorting of the contacts.

Figure 17:
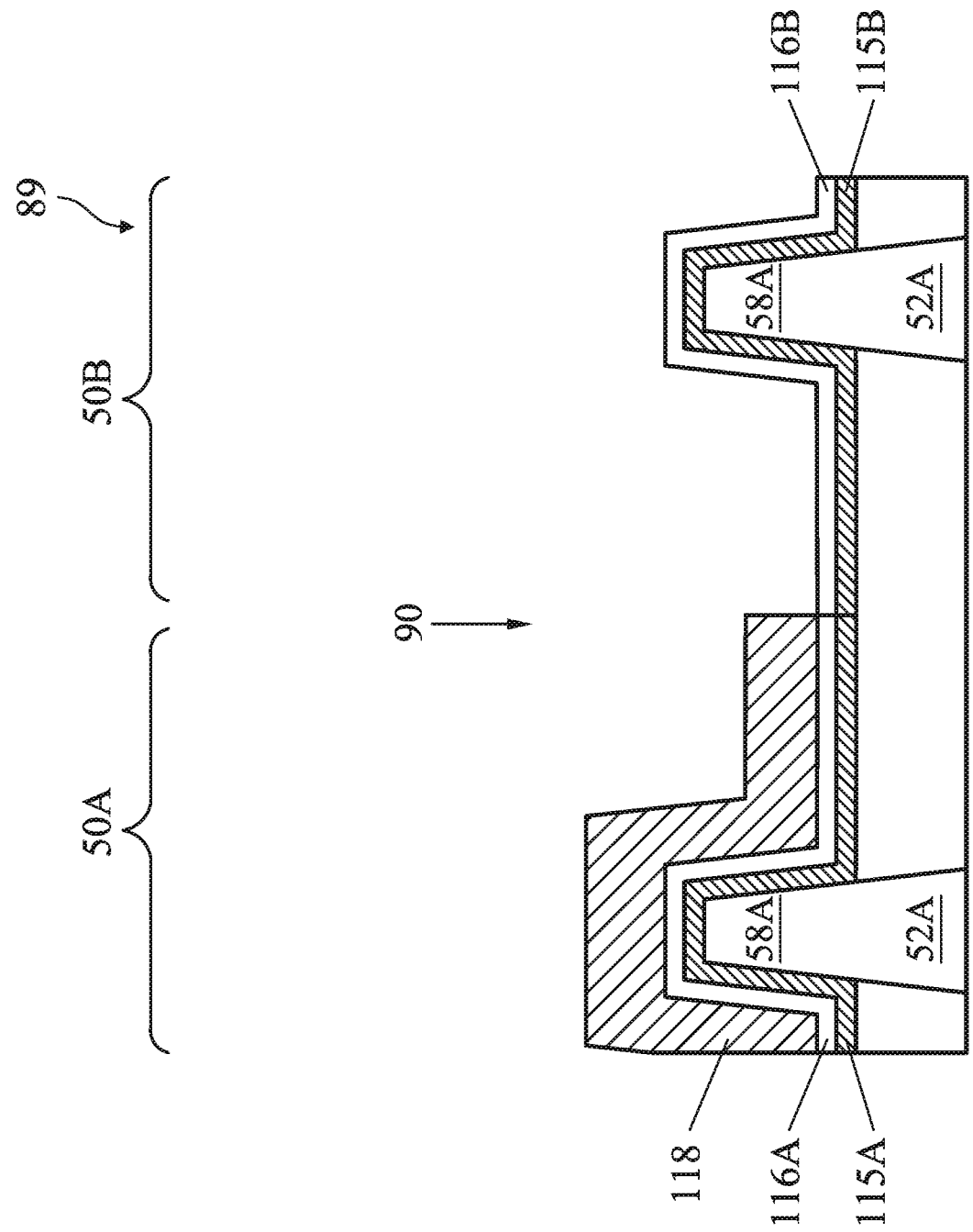
FIGS. 17-22 are cross-sectional views of intermediate stages in the manufacturing of a gate structure of a FinFET device in accordance with some embodiments.

FIGS. 17-22 are cross-sectional views of intermediate stages in the manufacturing of a gate structure including the gate stacks 95A and 95B illustrated in FIGS. 14A and 14B, in accordance with some embodiments. In particular, FIGS. 17-22 illustrate detailed views of a region 89 of FIG. 14A as the gate stacks 95A and 95B are formed in the opening 90. In FIG. 17, interfacial layers 115A and 115B are formed in the opening 90 in the regions 50A and 50B, respectively. In some embodiments, each of the interfacial layers 115A and 115B may comprise a dielectric material such as silicon oxide, silicon oxynitride, silicon hydroxide, silicon germanium oxide, germanium oxide, a combination thereof, or the like, and may formed using thermal oxidation, chemical oxidation, ALD, CVD, a combination thereof, or the like. In some embodiments, the interfacial layer 115A and the interfacial layer 115B comprise a same dielectric material. In such embodiments, the interfacial layers 115A and 115B may be formed by depositing a dielectric material in the opening 90 in both the region 50A and the region 50B. In other embodiments, the interfacial layer 115A and the interfacial layer 115B may comprise different dielectric materials. In some embodiments, the interfacial layer 115A and the interfacial layer 115B comprise different dielectric materials formed by chemical oxidation or thermal oxidation of the materials of the fins 52A and 52B, respectively. In other embodiments when the interfacial layer 115A and the interfacial layer 115B comprise different dielectric materials, a method for forming the interfacial layer 115A and the interfacial layer 115B may include depositing a first dielectric material in the opening 90 in both the region 50A and the region 50B, removing a portion of the first dielectric layer in the region 50B using suitable photolithography and etching processes, depositing a second dielectric material in the opening 90 in both the region 50A and the region 50B, and removing a portion of the second dielectric layer in the region 50A using suitable photolithography and etching processes. In this example, the interfacial layer 115A is formed before forming the interfacial layer 115B. Alternatively, the interfacial layer 115A may be formed after forming the interfacial layer 115B. In some embodiments, the interfacial layer 115A has a thickness between about 5 Å and about 150 Å. In some embodiments, the interfacial layer 115B has a thickness between about 5 Å and about 150 Å.

After forming the interfacial layer 115A and the interfacial layer 115B, a gate dielectric layer 116A and a gate dielectric layer 116B are formed in the opening 90 in the regions 50A and 50B, respectively. The gate dielectric layer 116A and the gate dielectric layer 116B are formed over the interfacial layer 115A and the interfacial layer 115B, respectively. In some embodiments, each of the gate dielectric layers 116A and 116B may comprise silicon oxide, silicon nitride, multilayers thereof, or the like. In some embodiments, each of the gate dielectric layers 116A and 116B may comprise a high-k dielectric material, and in these embodiments, the gate dielectric layers 116A and 116B may have a k value greater than about 7.0, and may include a metal oxide or a silicate of Hf, Al, Zr, La, Mg, Ba, Ti, Pb, Y, Sc, combinations thereof, or the like. The formation methods of the gate dielectric layers 116A and 116B may include Molecular-Beam Deposition (MBD), ALD, PECVD, a combination thereof, or the like. In some embodiments, the gate dielectric layer 116A and the gate dielectric layer 116B may comprise a same dielectric material. In such embodiments, the gate dielectric layers 116A and 116B may be formed by depositing a dielectric material in the opening 90 in both the region 50A and the region 50B, such that a first portion of the dielectric material in the region 50A forms the gate dielectric layer 116A and a second portion of the dielectric material in the region 50B forms the gate dielectric layer 116B. In other embodiments, the gate dielectric layer 116A and the gate dielectric layer 116B may comprise different dielectric materials. In such embodiments, a method for forming the gate dielectric layer 116A and the gate dielectric layer 116B may include depositing a first dielectric material in the opening 90 in both the region 50A and the region 50B, removing a portion of the first dielectric layer in the region 50B using suitable photolithography and etching processes, depositing a second dielectric material in the opening 90 in both the region 50A and the region 50B, and removing a portion of the second dielectric layer in the region 50A using suitable photolithography and etching processes. In this example, the gate dielectric layer 116A is formed before forming the gate dielectric layer 116B. Alternatively, the gate dielectric layer 116A may be formed after forming the gate dielectric layer 116B. In some embodiments, the gate dielectric layer 116A has a thickness between about 8 Å and about 300 Å. In some embodiments, the gate dielectric layer 116B has a thickness between about 8 Å and about 300 Å.

After forming the gate dielectric layer 116A and the gate dielectric layer 116B, a work function layer 118 is formed in the opening 90 over the gate dielectric layer 116A in the region 50A. In some embodiments, the work function layer 118 may be a p-type work function layer. The p-type work function layer may comprise TiN, WN, WCN, TaN, Ru, Co, W, combinations thereof, multi-layers thereof, or the like, and may be formed using PVD, CVD, ALD, a combination thereof, or the like. In such embodiments, a method for forming the work function layer 118 may include blanket depositing a suitable material in the opening 90 in both the region 50A and the region 50B, and removing a portion of the suitable material in the region 50B using suitable photolithography and etching processes. In some embodiments, the work function layer 118 has a thickness between about 5 Å and about 400 Å.

Figure 18:
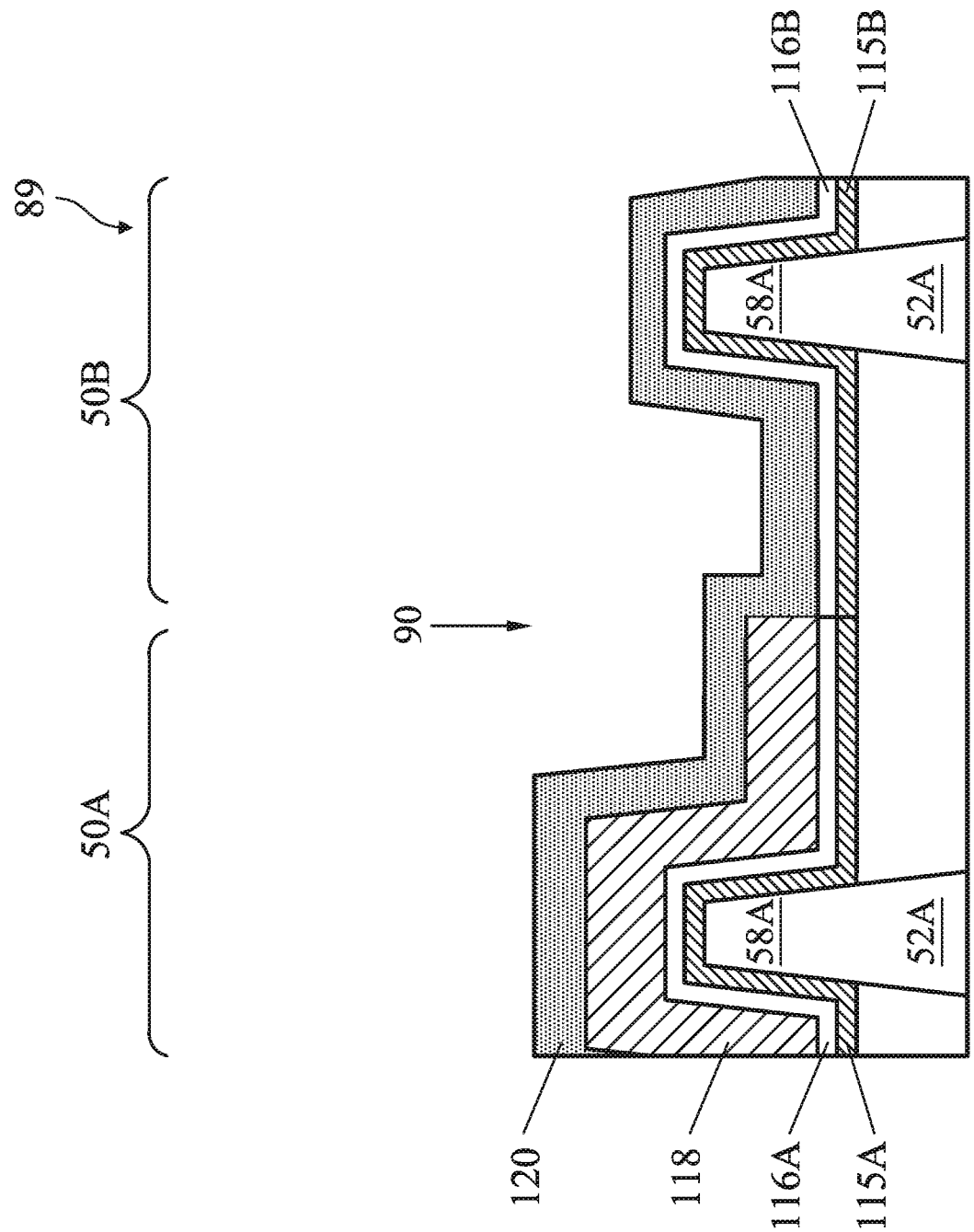

In FIG. 18, after forming the work function layer 118, a barrier layer 120 is blanket deposited in the opening 90 in both the region 50A and the region 50B. In some embodiments, the barrier layer 120 may comprise TaN, TiN, TaTiN, AlN, $Al_2O_3$, $HfO_2$, $ZrO_2$, Si, Ti, V, combinations thereof, multi-layers thereof, or the like, and may be formed using ALD, CVD, PEALD a combination thereof, or the like. In some embodiments, the barrier layer 120 has a thickness between about 5 Å and about 250 Å.

Figure 19:
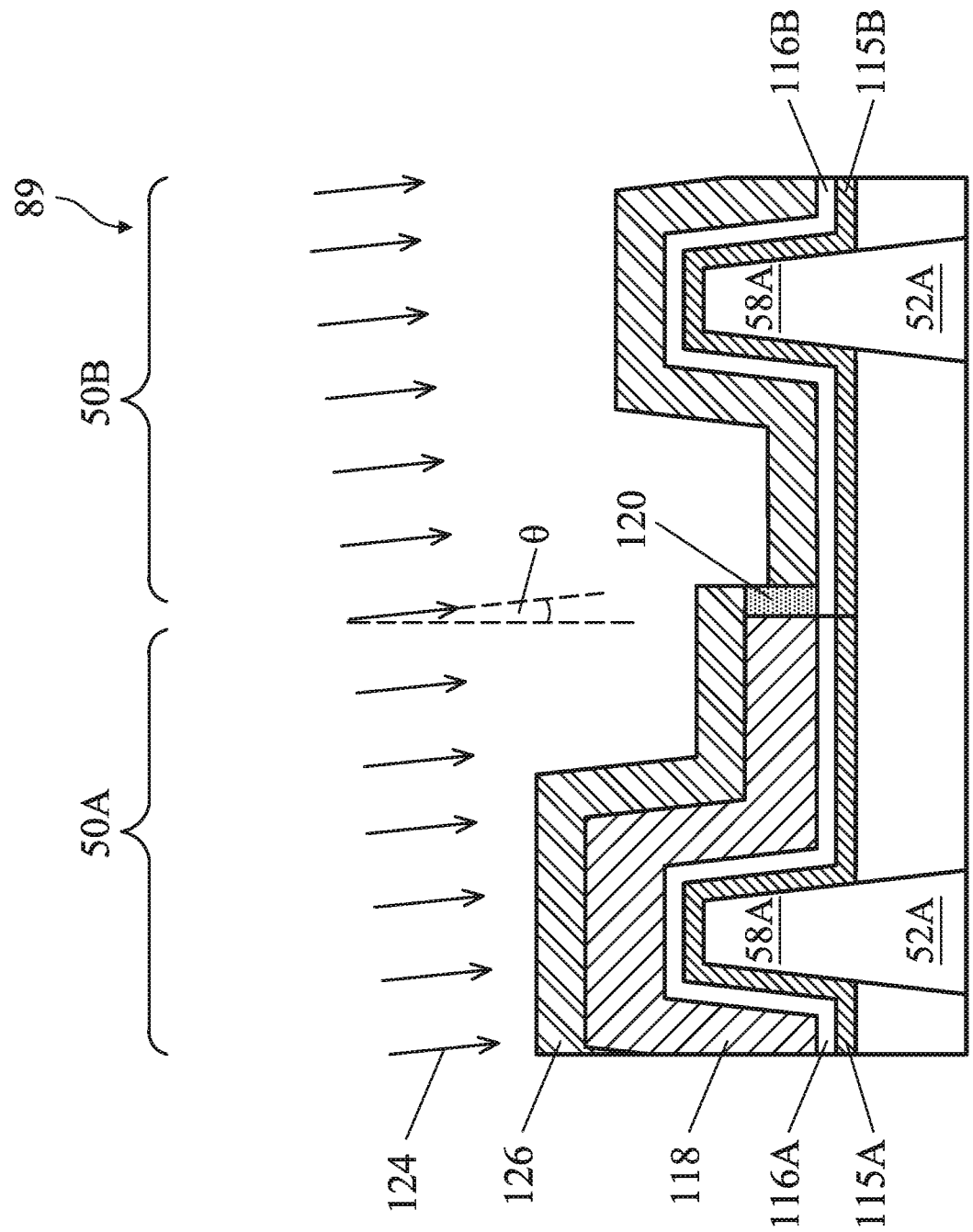

In FIG. 19, after forming the barrier layer 120, a treatment process is performed on the barrier layer 120 to form a treated portion 126 of the barrier layer 120. In some embodiments, the treatment process converts as-deposited material of the barrier layer 120 to another material different from the as-deposited material, such that the treated portion 126 of the barrier layer 120 comprises the converted as-deposited material. In some embodiments, the treated portion 126 of the barrier layer 120 has a higher etch rate than an un-treated portion of the barrier layer 120. In some embodiments, a ratio of an etch rate of the treated portion 126 of the barrier layer 120 to an etch rate of the un-treated portion of the barrier layer 120 is between about 1.8 and about 50. In some embodiments, the treatment process comprises an oxidation process, a fluorination process, a nitridation process, a chlorination process, or the like. In some embodiments, the oxidation process may comprise a treatment with a suitable oxygen-containing chemical, an oxygen implantation process, a combination thereof, or the like. In some embodiments, the fluorination process may comprise a treatment with a suitable fluorine-containing chemical, a fluorine implantation process, a combination thereof, or the like. In some embodiments, the nitridation process may comprise a treatment with a suitable nitrogen-containing chemical, a nitrogen implantation process, a combination thereof, or the like. In some embodiments, the chlorination process may comprise a treatment with a suitable chlorine-containing chemical, a chlorine implantation process, a combination thereof, or the like. In some embodiments when the treatment process is an implantation process, the implantation process may be followed by an anneal process. In some embodiments, a direction of ions (illustrated by arrows 124 in FIG. 19) of the implantation process forms an angle θ with a direction that is perpendicular to a major surface of the substrate 50. In some embodiments, the angle θ is between about 5 degrees to about 22 degrees. In some embodiments, energy of ions of the implantation process (implantation energy) is between about 100 eV and about 6 KeV. In some embodiments, an implantation dose is between about $10^{12}$ $cm^{-2}$ to about $5 \times 10^{18}$ $cm^{-2}$. In some embodiments, the angle θ and/or some other parameters of implantation process may be adjusted such that a portion of the barrier layer 120 formed on sidewall of the work function layer 118 at an interface between the region 50A and the region 50B remains untreated after completing the implantation process.

In some embodiments when the barrier layer 120 comprises TaN, TiN, TaTiN, combinations thereof, multi-layers thereof, or the like, the treatment process comprises an oxidation process. In some embodiments when the barrier layer 120 is formed of TiN, TiN is converted to titanium oxide (such as $TiO_2$) or titanium oxynitride, such that the treated portion 126 of the barrier layer 120 comprises titanium oxide (such as $TiO_2$) or titanium oxynitride, while the un-treated portion of the barrier layer 120 remains to be formed of TiN. In some embodiment when the barrier layer 120 is formed of TaN, TaN is converted to tantalum oxide (such as $TaO_2$, or $Ta_2O_5$) or tantalum oxynitride, such that the treated portion 126 of the barrier layer 120 comprises tantalum oxide (such as $TaO_2$, or $Ta_2O_5$) or tantalum oxynitride, while the un-treated portion of the barrier layer 120 remains to be formed of TaN. In some embodiment when the barrier layer 120 is formed of TaTiN, TaTiN is converted to TaTiO such that the treated portion 126 of the barrier layer 120 comprises TaTiO, while the un-treated portion of the barrier layer 120 remains to be formed of TaTiN.

In some embodiment when the barrier layer 120 comprises AlN, $Al_2O_3$, $HfO_2$, $ZrO_2$, combinations thereof, multi-layers thereof, or the like, the treatment process comprises a fluorination process. In some embodiment when the barrier layer 120 is formed of $Al_2O_3$, $Al_2O_3$ is converted to $AlF_3$ such that the treated portion 126 of the barrier layer 120 comprises $AlF_3$, while the un-treated portion of the barrier layer 120 remains to be formed of $Al_2O_3$. In some embodiment when the barrier layer 120 is formed of AlN, AlN is converted to $AlF_3$ such that the treated portion 126 of the barrier layer 120 comprises $AlF_3$, while the un-treated portion of the barrier layer 120 remains to be formed of AlN. In some embodiment when the barrier layer 120 is formed of $HfO_2$, $HfO_2$ is converted to $HfF_4$ such that the treated portion 126 of the barrier layer 120 comprises $HfF_4$, while the un-treated portion of the barrier layer 120 remains to be formed of $HfO_2$. In some embodiment when the barrier layer 120 is formed of $ZrO_2$, $ZrO_2$ is converted to $ZrF_4$ such that the treated portion 126 of the barrier layer 120 comprises $ZrF_4$, while the un-treated portion of the barrier layer 120 remains to be formed of $ZrO_2$.

In some embodiments when the barrier layer 120 comprises Si, the treatment process may comprise an oxidation process, a nitridation process, a chlorination process, or the like. In some embodiments when the treatment process comprises an oxidation process, Si is converted to silicon oxide ($SiO_2$) such that the treated portion 126 of the barrier layer 120 comprises silicon oxide ($SiO_2$), while the un-treated portion of the barrier layer 120 remains to be formed of Si. In some embodiments when the treatment process comprises a nitridation process, Si is converted to silicon nitride ($Si_3N_4$) such that the treated portion 126 of the barrier layer 120 comprises silicon nitride ($Si_3N_4$), while the un-treated portion of the barrier layer 120 remains to be formed of Si. In some embodiments when treatment process comprises a chlorination process, Si is converted to silicon chloride ($SiCl_x$) such that the treated portion 126 of the barrier layer 120 comprises silicon chloride ($SiCl_x$), while the un-treated portion of the barrier layer 120 remains to be formed of Si.

In some embodiment when the barrier layer 120 comprises Ti and V, the treatment process comprises an oxidation process. In some embodiments when the barrier layer 120 comprises Ti, Ti is converted to titanium oxide ($TiO_2$) such that the treated portion 126 of the barrier layer 120 comprises titanium oxide ($TiO_2$), while the un-treated portion of the barrier layer 120 remains to be formed of Ti. In some embodiments when the barrier layer 120 comprises V, V is converted to vanadium oxide ($V_2O_5$) such that the treated portion 126 of the barrier layer 120 comprises vanadium oxide ($V_2O_5$), while the un-treated portion of the barrier layer 120 remains to be formed of V.

Figure 20:
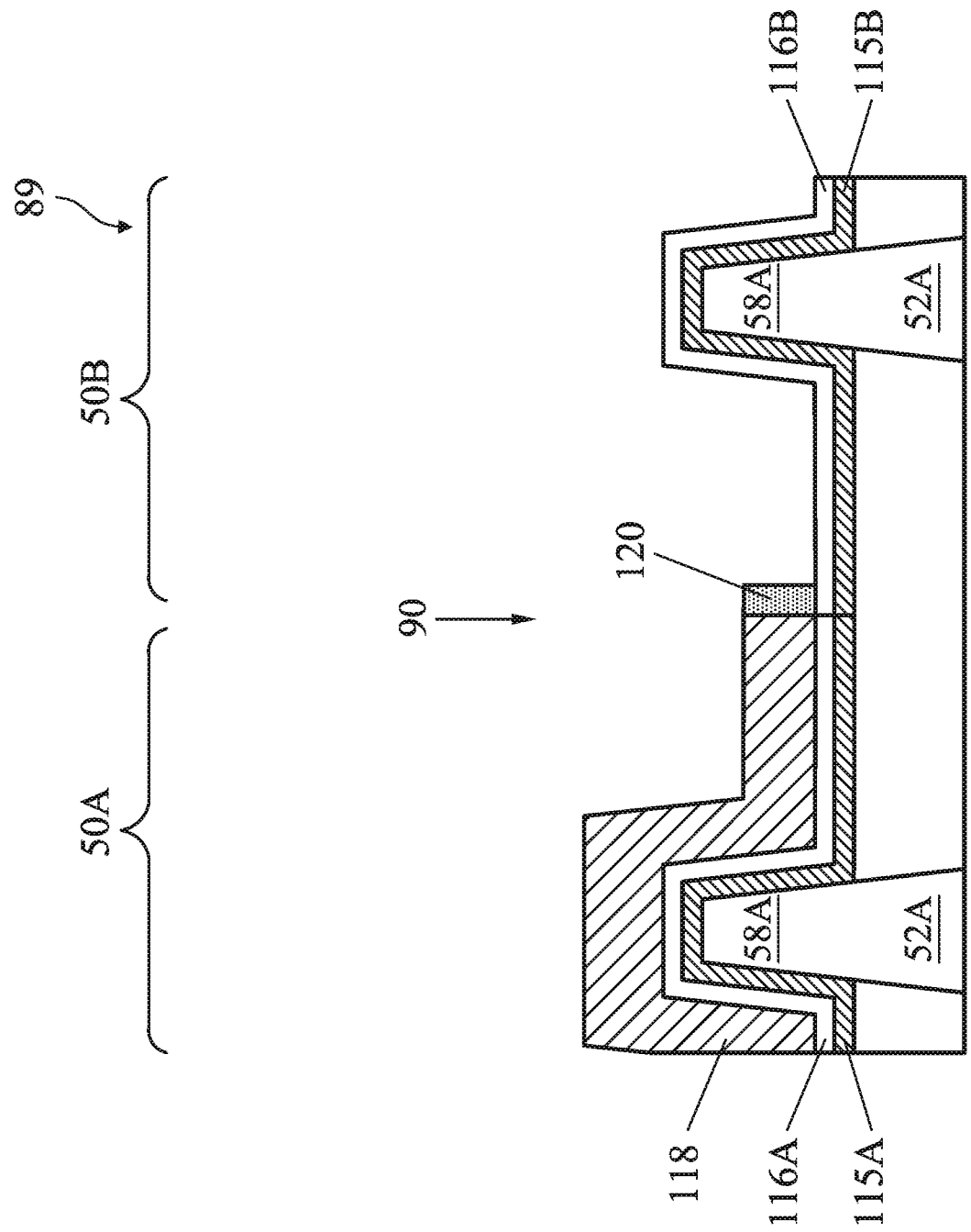

In FIG. 20, the treated portion 126 (see FIG. 19) of the barrier layer 120 is removed, while the un-treated portion of the barrier layer 120 remains at the metal boundary region (at the interface between the region 50A and 50B) along the sidewall of the work function layer 118. In some embodiments, the treated portion 126 (see FIG. 19) of the barrier layer 120 may be removed using a selective etch process. In some embodiments, parameters of the treatment process (such as, for example, implantation angle and energy) described above with reference to FIG. 19 and parameters of the selective etch process (such as, for example, etchant composition and etch duration) are tuned, such that a top surface of the remaining portion of the barrier layer 120 and a top surface of the work function layer 118 are substantially level within process variations. In other embodiments, a residue of the barrier layer 120 may remain on the top surface of the work function layer 118.

In some embodiments when the barrier layer 120 comprises TaN, TiN, and TaTiN, and the treatment comprises an oxidation process, the treated portion 126 (see FIG. 19) of the barrier layer 120 is selectively etched using etchants such as $WF_6$, $TaF_5$, $TiF_4$, $WCl_5$, $TaCl_5$, $TiCl_4$, $NF_3$, $CF_4$, HF, a combination thereof, or the like. In such embodiments, a ratio of an etch rate of the treated portion 126 of the barrier layer 120 to an etch rate of the un-treated portion of the barrier layer 120 is between about 1.8 and about 50.

In some embodiments when the barrier layer 120 comprises MN, $Al_2O_3$, and $HfO_2$, and the treatment comprises a fluorination process, the treated portion 126 (see FIG. 19) of the barrier layer 120 is selectively etched using etchants such as trimethylaluminum (TMA), $Sn(acac)_2$, $Al(CH_3)_2Cl$, $SiCl_4$, a combination thereof, or the like. In such embodiments, a ratio of an etch rate of the treated portion 126 of the barrier layer 120 to an etch rate of the un-treated portion of the barrier layer 120 is between about 4 and about 50.

In some embodiments when the barrier layer 120 comprises $ZrO_2$ and the treatment comprises a fluorination process, the treated portion 126 (see FIG. 19) of the barrier layer 120 is selectively etched using etchants such as $Sn(acac)_2$, or the like. In such embodiments, a ratio of an etch rate of the treated portion 126 of the barrier layer 120 to an etch rate of the un-treated portion of the barrier layer 120 is between about 4 and about 50.

In some embodiments when the barrier layer 120 comprises Si and the treatment comprises an oxidation process or a nitridation process, the treated portion 126 (see FIG. 19) of the barrier layer 120 is selectively etched using etchants such as $C_2F_6$, $CF_4$, a combination thereof, or the like. In such embodiments, a ratio of an etch rate of the treated portion 126 of the barrier layer 120 to an etch rate of the un-treated portion of the barrier layer 120 is between about 2 and about 40.

In some embodiments when the barrier layer 120 comprises Si and the treatment comprises a chlorination process, the treated portion 126 (see FIG. 19) of the barrier layer 120 is selectively etched using Ar plasma, or the like. In such embodiments, a ratio of an etch rate of the treated portion 126 of the barrier layer 120 to an etch rate of the un-treated portion of the barrier layer 120 is between about 1.8 and about 50.

In some embodiments when the barrier layer 120 comprises Ti and V, and the treatment comprises an oxidation process, the treated portion 126 (see FIG. 19) of the barrier layer 120 is selectively etched using etchants such as $C_2F_6$, $CF_4$, a combination thereof, or the like. In such embodiments, a ratio of an etch rate of the treated portion 126 of the barrier layer 120 to an etch rate of the un-treated portion of the barrier layer 120 is between about 2 and about 40.

Referring further to FIG. 20, in some embodiments, the remaining portion of the barrier layer 120 on the sidewall of the work function layer 118 may be formed by blanket depositing the barrier layer 120 as described above with reference to FIG. 18 and removing horizontal and sloped portions of the barrier layer 120. In some embodiments, the horizontal and sloped portions of the barrier layer 120 may be removed using a suitable anisotropic etch process. In such embodiments, the treatment process described above with reference to FIG. 19 is omitted. In some embodiments, parameters of the anisotropic etch process (such as, for example, etchant composition and etch duration) are tuned, such that the top surface of the remaining portion of the barrier layer 120 and the top surface of the work function layer 118 are substantially level within process variations.

Figure 21:
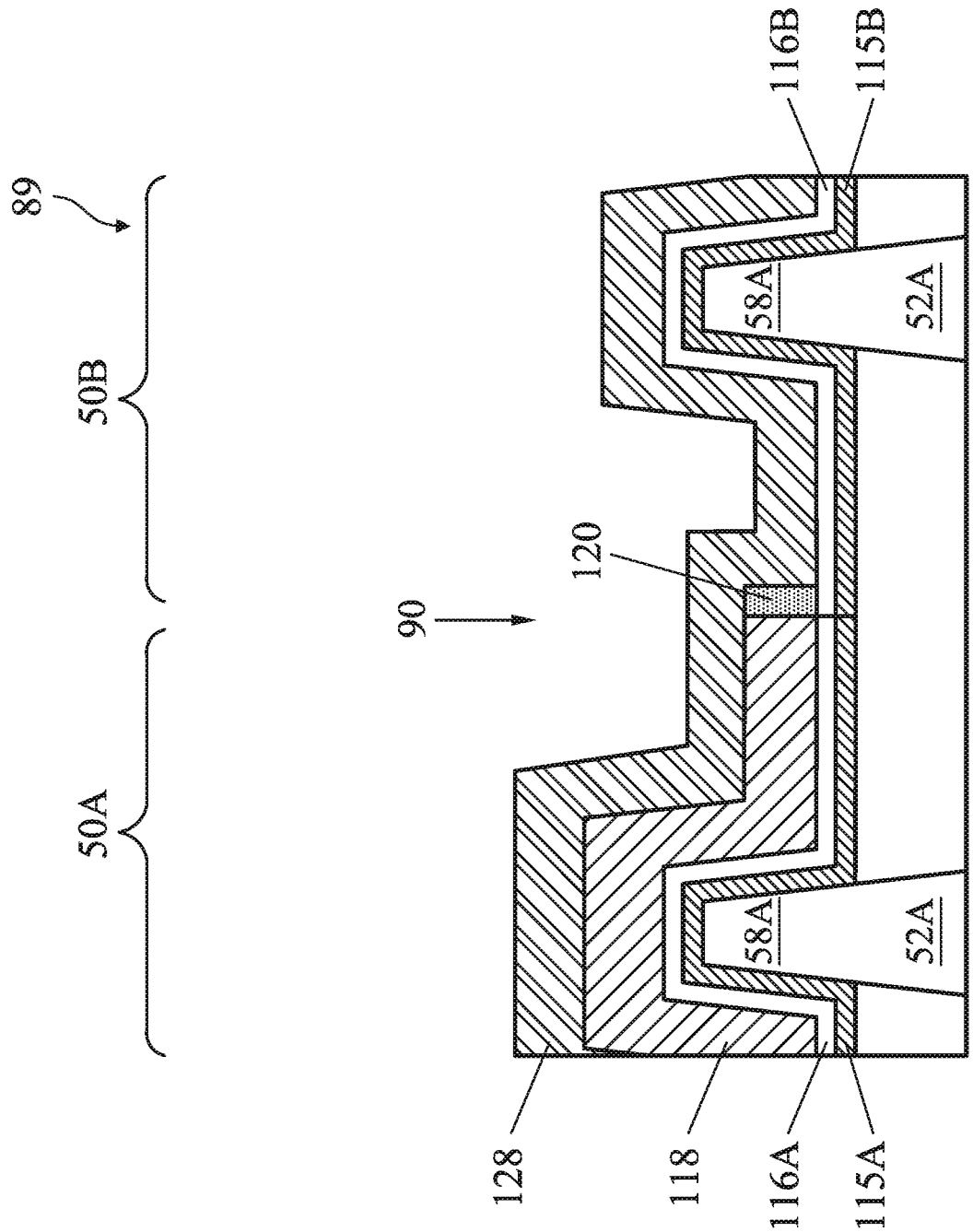

In FIG. 21, after removing the treated portion 126 (see FIG. 19) of the barrier layer 120, a work function layer 128 is blanket deposited in the opening 90 in both the region 50A and the region 50B. In some embodiments, the work function layer 128 may be an n-type work function layer. The n-type work function layer may comprise Ti, Ag, Al, TiAl, TiAlN, TiAlC, TaAl, TaC, TaCN, TaSiN, TaAlC, Mn, Zr, combinations thereof, multi-layers thereof, or the like, and may be formed using PVD, CVD, ALD, a combination thereof, or the like. In some embodiments, the work function layer 128 has a thickness between about 8 Å and about 400 Å.

Figure 22:
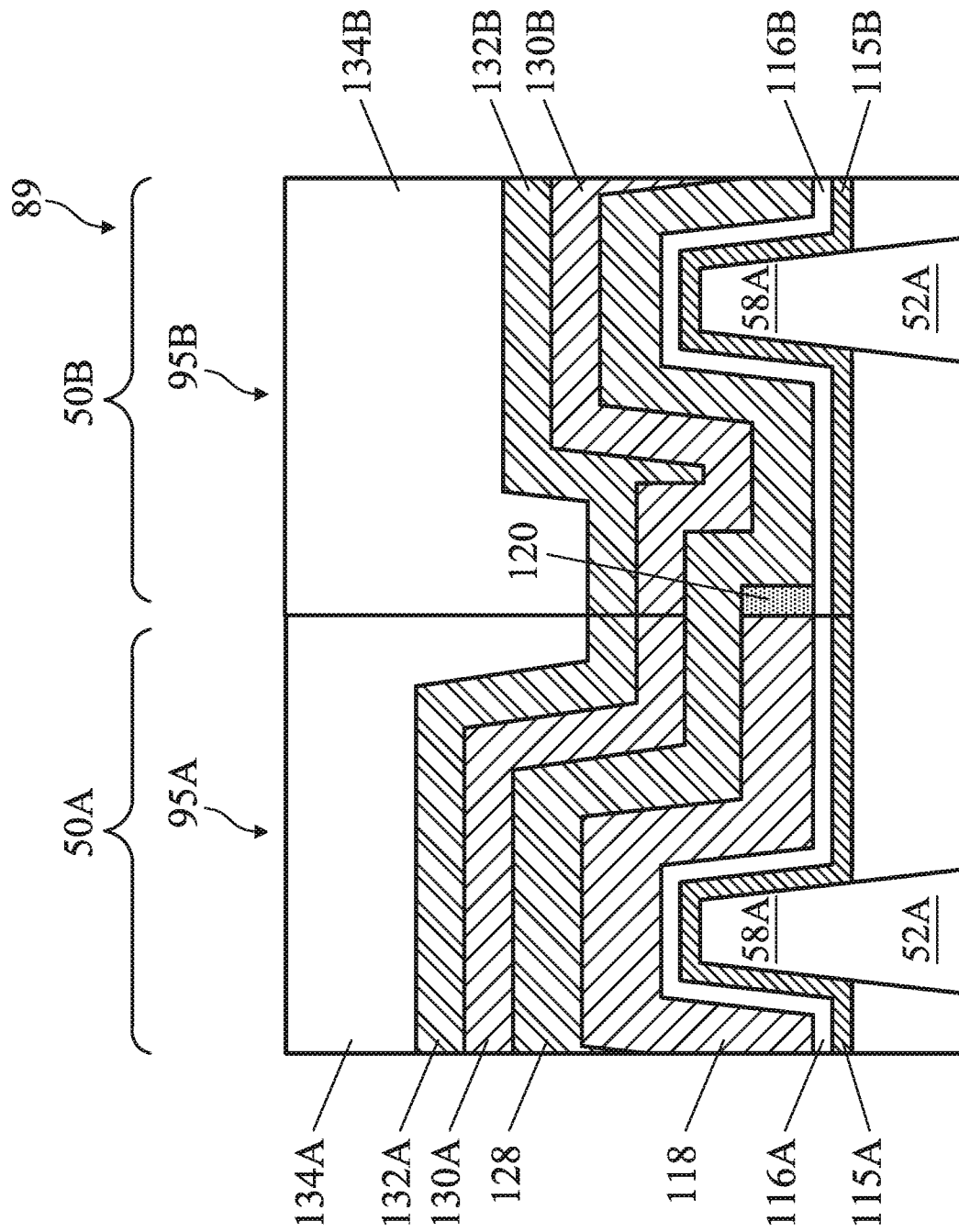

In FIG. 22, after forming the work function layer 128, a shield layer 130A and a shield layer 130B are formed in the opening 90 in the regions 50A and 50B, respectively. In some embodiments, each of the shield layer 130A and the shield layer 130B may comprise TiN, Si, SiN, TiSiN, combinations thereof, multi-layers thereof, or the like, and may be formed using PVD, CVD, ALD, a combination thereof, or the like. In some embodiments, the shield layer 130A and the shield layer 130B comprise a same material. In such embodiments, the shield layers 130A and 130B may be formed by depositing a suitable material in the opening 90 in both the region 50A and the region 50B. In other embodiments, the shield layer 130A and the shield layer 130B may comprise different materials. In such embodiments, a method for forming the shield layer 130A and the shield layer 130B may include depositing a first material in the opening 90 in both the region 50A and the region 50B, removing a portion of the first material in the region 50B using suitable photolithography and etching processes, depositing a second material in the opening 90 in both the region 50A and the region 50B, and removing a portion of the second material in the region 50A using suitable photolithography and etching processes. In this example, the shield layer 130A is formed before forming the shield layer 130B. Alternatively, the shield layer 130A may be formed after forming the shield layer 130B. In some embodiments, the shield layer 130A has a thickness between about 5 Å and about 60 Å. In some embodiments, the shield layer 130B has a thickness between about 5 Å and about 60 Å.

After forming shield layers 130A and 130B, a glue layer 132A and a glue layer 132B are formed in the opening 90 in the regions 50A and 50B, respectively. In some embodiments, each of the glue layer 132A and the glue layer 132B may comprise TiN, Ti, Co, combinations thereof, multi-layers thereof, or the like, and may be formed using PVD, CVD, ALD, a combination thereof, or the like. In some embodiments, the glue layer 132A and the glue layer 132B comprise a same material. In such embodiments, the glue layers 132A and 132B may be formed by depositing a suitable material in the opening 90 in both the region 50A and the region 50B. In other embodiments, the glue layer 132A and the glue layer 132B may comprise different materials. In such embodiments, a method for forming the glue layer 132A and the glue layer 132B may include depositing a first material in the opening 90 in both the region 50A and the region 50B, removing a portion of the first material in the region 50B using suitable photolithography and etching processes, depositing a second material in the opening 90 in both the region 50A and the region 50B, and removing a portion of the second material in the region 50A using suitable photolithography and etching processes. In this example, the glue layer 132A is formed before forming the glue layer 132B. Alternatively, the glue layer 132A may be formed after forming the glue layer 132B. In some embodiments, the glue layer 132A has a thickness between about 5 Å and about 60 Å. In some embodiments, the glue layer 132B has a thickness between about 5 Å and about 60 Å.

Further in FIG. 22, after forming glue layers 132A and 132B, a conductive fill material 134A and a conductive fill material 134B are formed in the opening 90 in the regions 50A and 50B, respectively. In some embodiments, each of the conductive fill material 134A and the fill material 134B may comprise Co, Ru, Al, Ag, Au, W, fluorinated-W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like. In some embodiments, the conductive fill material 134A and the conductive fill material 134B comprise a same conductive material. In such embodiments, the conductive fill materials 134A and 134B may be formed by depositing a conductive material in the opening 90 in both the region 50A and the region 50B. In other embodiments, the conductive fill material 134A and the conductive fill material 134B may comprise different conductive materials. In such embodiments, a method for forming the conductive fill material 134A and the conductive fill material 134B may include depositing a first conductive material in the opening 90 in both the region 50A and the region 50B, removing a portion of the first conductive material in the region 50B using suitable photolithography and etching processes, depositing a second conductive material in the opening 90 in both the region 50A and the region 50B, and removing a portion of the second conductive material in the region 50A using suitable photolithography and etching processes. In this example, the conductive fill material 134A is formed before forming the conductive fill material 134B. Alternatively, the conductive fill material 134A may be formed after forming the conductive fill material 134B.

After forming the conductive fill materials 134A and 134B, a planarization process, such as a CMP process, may be performed to remove excess portions of the layers 115A, 115B, 116A, 116B, 118, 128, 130A, 130B, 132A, 132B, 134A and 134B, which excess portions are over the top surface of the first ILD 88 (see FIG. 14B). The remaining portions of the interfacial layer 115A, the gate dielectric layer 116A, the work function layers 118 and 128, the shield layer 130A, the glue layer 132A, and the conductive fill material 134A form the replacement gates stack 95A (see FIGS. 14A and 14B) in the region 50A. The remaining portions of the interfacial layer 115B, the gate dielectric layer 116B, the work function layer 128, the shield layer 130B, the glue layer 132B, and the conductive fill material 134B form the replacement gates stack 95B (see FIGS. 14A and 14B) in the region 50B.

In some embodiments, the barrier layer 120 formed on the sidewall of the work function layer 118 prevents or reduces metal diffusion from the work function layer 128 to the work function layer 118. For example, when the work function layer 128 comprises TiAl, TiAlN, TiAlC, TaAl, or TaAlC, the barrier layer 120 prevents or reduces Al diffusion from the work function layer 128 to the work function layer 118. Furthermore, the barrier layer 120 isolates the gate stack 95A from the gate stack 95B and prevents or reduces a threshold voltage shift due to the metal diffusion.

Figure 23:
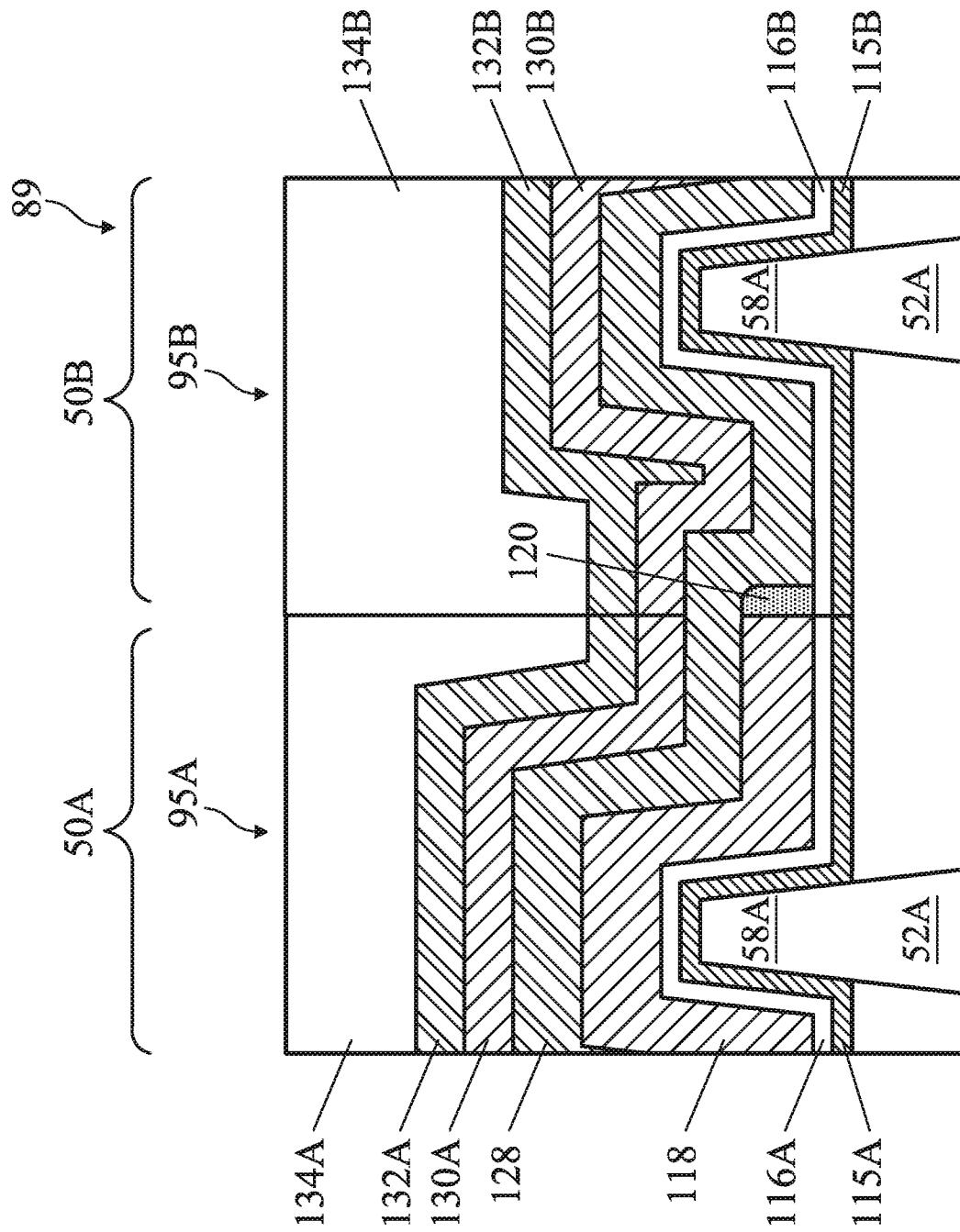
FIG. 23 is a cross-sectional view of a gate structure of a FinFET device in accordance with some embodiments.

FIG. 23 is a cross-sectional view of a gate structure of a FinFET device in accordance with some embodiments. In some embodiments, the gate structure of FIG. 23 is similar to the gate structure of FIG. 22, with similar features being labeled with similar numerical references, and descriptions of these similar features are not repeated herein. In some embodiments, the gate structure of FIG. 23 may be formed using process steps similar to the process steps described above with reference to FIGS. 17-22 and the description is not repeated herein. In some embodiments, parameters of the treatment process (such as, for example, implantation angle and energy) described above with reference to FIG. 19 and parameters of the selective etch process (such as, for example, etchant composition, etch duration, and etch selectivity) described above with reference to FIG. 20 are tuned, such that corners of the remaining portion of the barrier layer 120 are rounded. In some embodiments, an implantation angle of the treatment process may be increased. In some embodiments, implantation energy of the treatment process may be increased. In some embodiments, a duration of the selective etch process may be increased. In some embodiments, etch selectively between the treated and un-treated portions of the barrier layer 120 may be decreased. In other embodiments where the remaining portion of the barrier layer 120 is formed using a blanket deposition process followed by an anisotropic etch process, parameters of the anisotropic etch process (such as, for example, etchant composition and etch duration) are tuned, such that corners of the remaining portion of the barrier layer 120 are rounded.

Figure 24:
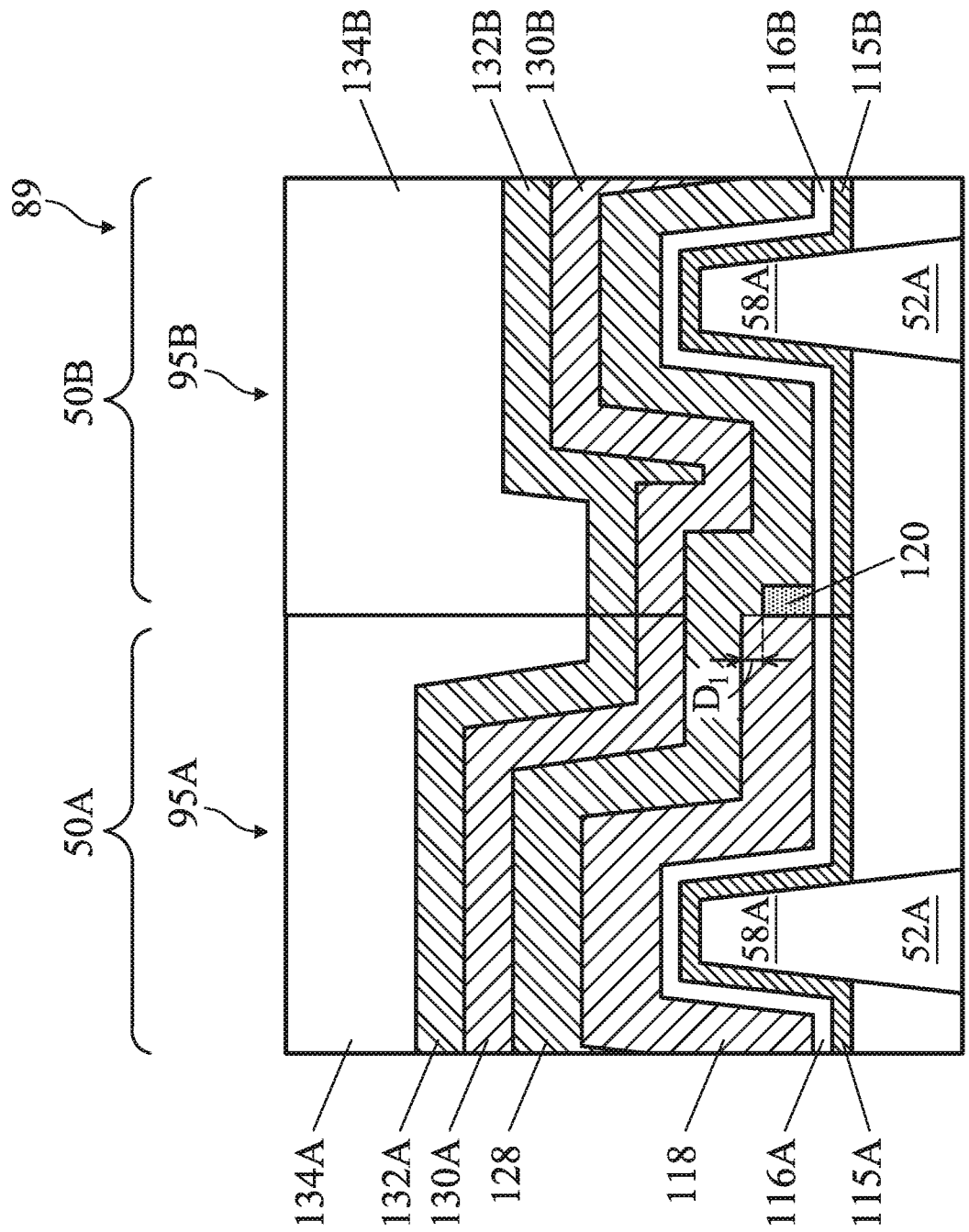
FIG. 24 is a cross-sectional view of a gate structure of a FinFET device in accordance with some embodiments.

FIG. 24 is a cross-sectional view of a gate structure of a FinFET device in accordance with some embodiments. In some embodiments, the gate structure of FIG. 24 is similar to the gate structure of FIG. 22, with similar features being labeled with similar numerical references, and descriptions of these similar features are not repeated herein. In some embodiments, the gate structure of FIG. 24 may be formed using process steps similar to the process steps described above with reference to FIGS. 17-22 and the description is not repeated herein. In some embodiments, parameters of the treatment process (such as, for example, implantation angle and energy) described above with reference to FIG. 19 and parameters of the selective etch process (such as, for example, etchant composition, etch duration, and etch selectivity) described above with reference to FIG. 20 are tuned, such that a top surface of the remaining portion of the barrier layer 120 is lower than a top surface of the work function layer 118. In some embodiments, implantation energy of the treatment process may be increased. In some embodiments, a duration of the selective etch process may be increased. In other embodiments where the remaining portion of the barrier layer 120 is formed using a blanket deposition process followed by an anisotropic etch process, parameters of the anisotropic etch process (such as, for example, etchant composition and etch duration) are tuned, such that a top surface of the remaining portion of the barrier layer 120 is lower than a top surface of the work function layer 118. In some embodiments, the top surface of the remaining portion of the barrier layer 120 is lower than the top surface of the work function layer 118 by a distance $D_1$. In some embodiments, the distance $D_1$ is between about 3 Å and about 55 Å.

Figure 25:
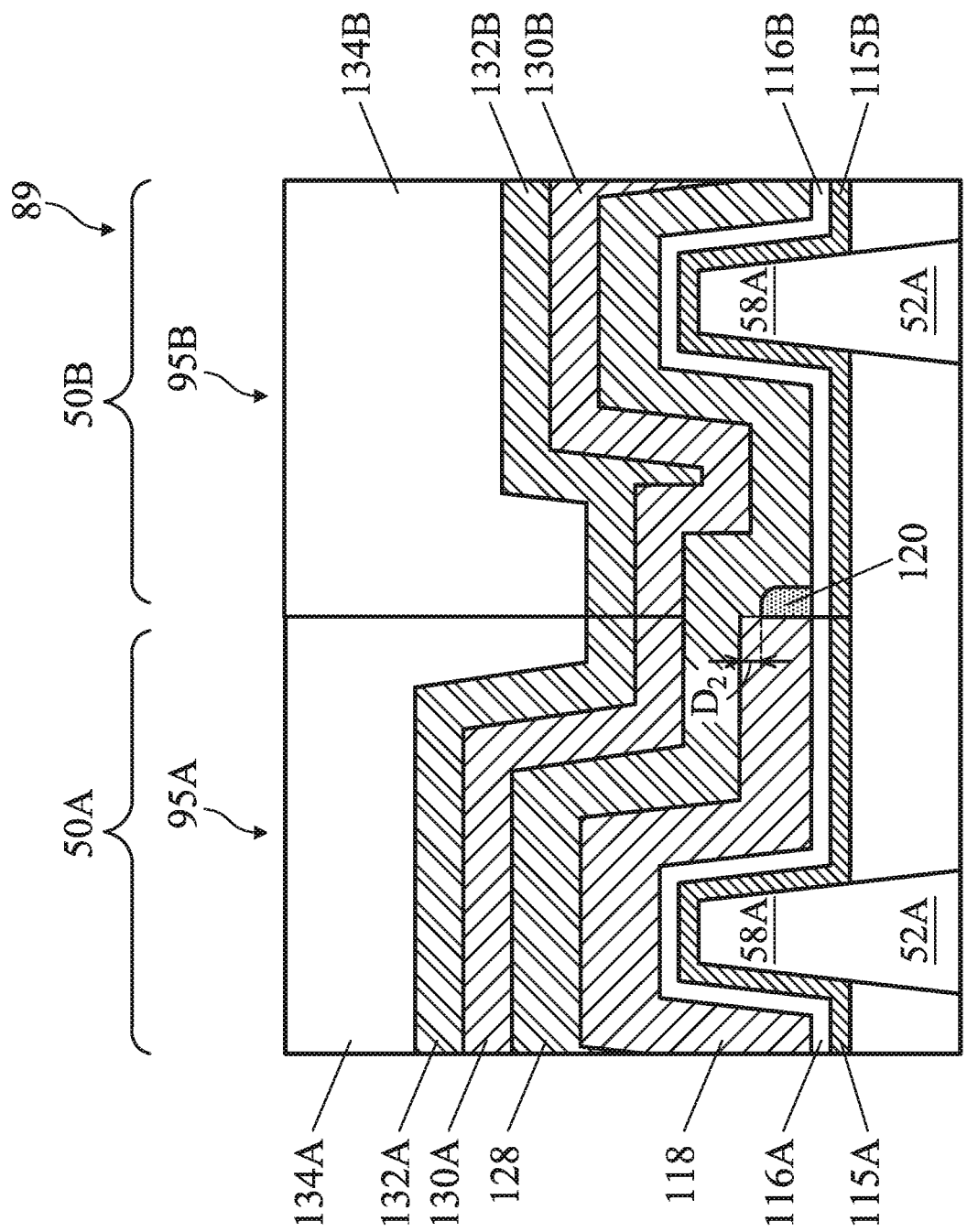
FIG. 25 is a cross-sectional view of a gate structure of a FinFET device in accordance with some embodiments.

FIG. 25 is a cross-sectional view of a gate structure of a FinFET device in accordance with some embodiments. In some embodiments, the gate structure of FIG. 25 is similar to the gate structure of FIG. 22, with similar features being labeled with similar numerical references, and descriptions of these similar features are not repeated herein. In some embodiments, the gate structure of FIG. 25 may be formed using process steps similar to the process steps described above with reference to FIGS. 17-22 and the description is not repeated herein. In some embodiments, parameters of the treatment process (such as, for example, implantation angle and energy) described above with reference to FIG. 19 and parameters of the selective etch process (such as, for example, etchant composition, etch duration, and etch selectivity) described above with reference to FIG. 20 are tuned, such that corners of the remaining portion of the barrier layer 120 are rounded and such that a top surface of the remaining portion of the barrier layer 120 is lower than a top surface of the work function layer 118. In some embodiments, an implantation angle of the treatment process may be increased. In some embodiments, implantation energy of the treatment process may be increased. In some embodiments, a duration of the selective etch process may be increased. In some embodiments, etch selectively between the treated and un-treated portions of the barrier layer 120 may be decreased. In other embodiments where the remaining portion of the barrier layer 120 is formed using a blanket deposition process followed by an anisotropic etch process, parameters of the anisotropic etch process (such as, for example, etchant composition and etch duration) are tuned, such that corners of the remaining portion of the barrier layer 120 are rounded and such that a top surface of the remaining portion of the barrier layer 120 is lower than a top surface of the work function layer 118. In some embodiments, the top surface of the remaining portion of the barrier layer 120 is lower than the top surface of the work function layer 118 by a distance $D_2$. In some embodiments, the distance $D_2$ is between about 3 Å and about 55 Å.

FIGS. 26-32 are cross-sectional views of intermediate stages in the manufacturing of a gate structure including the gate stacks 95A and 95B illustrated in FIGS. 14A and 14B, in accordance with some embodiments. In particular, FIGS. 26-32 illustrate detailed views of a region 89 of FIG. 14A as the gate stacks 95A and 95B are formed in the opening 90. In some embodiments, process steps described in FIGS. 26-32 are similar to the process steps described above with reference to FIGS. 17-22, with similar features being labeled with similar numerical references, and descriptions of these similar features are not repeated herein.

Figure 26:
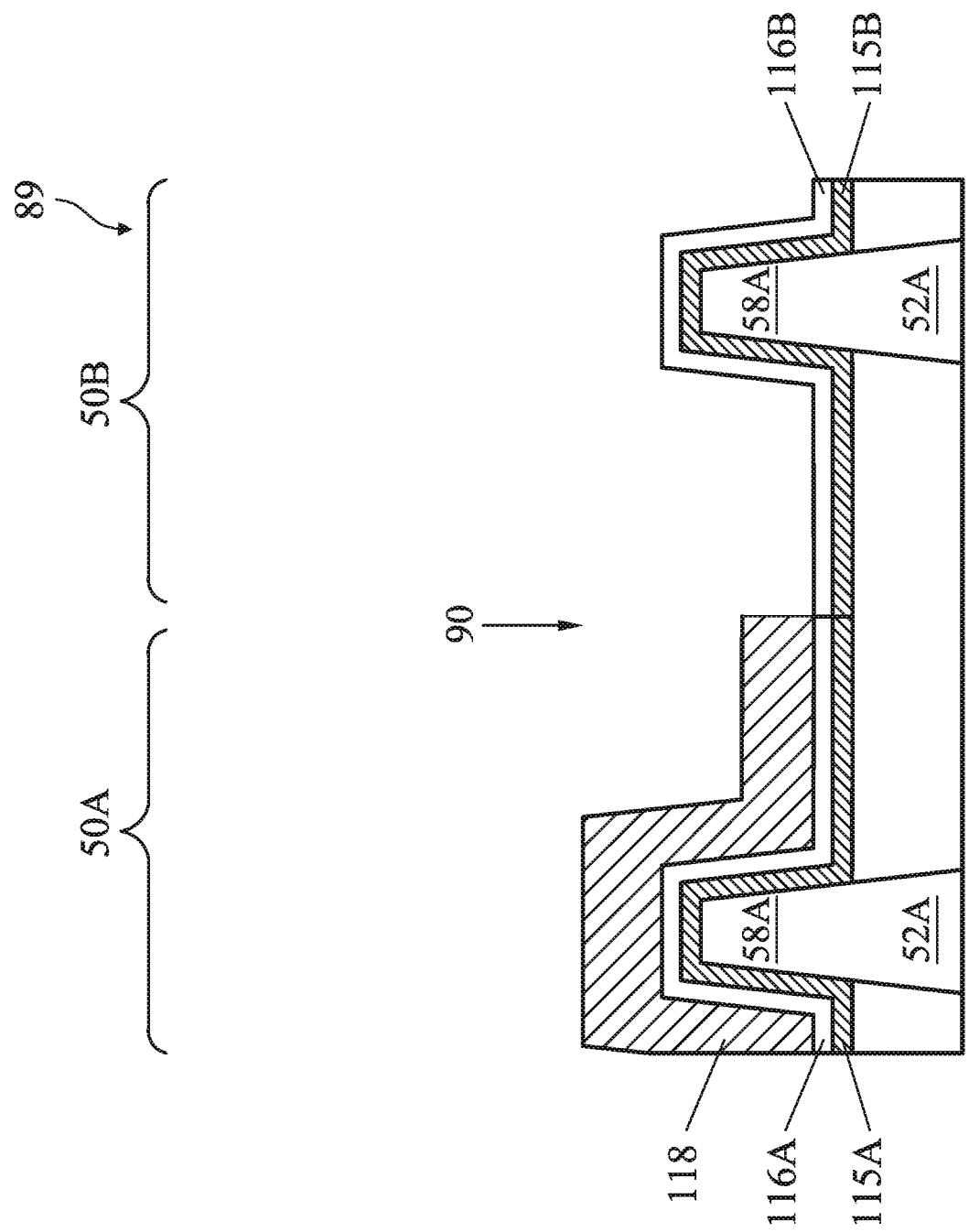
FIGS. 26-32 are cross-sectional views of intermediate stages in the manufacturing of a gate structure of a FinFET device in accordance with some embodiments.

In FIG. 26, interfacial layers 115A and 115B are formed in the opening 90 in the regions 50A and 50B, respectively as described above with reference to FIGS. 17 and the description is not repeated herein. After forming the interfacial layers 115A and 115B, a gate dielectric layer 116A and a gate dielectric layer 116B are formed in the opening in the regions 50A and 50B, respectively, as described above with reference to FIG. 17 and the description is not repeated herein. After forming the gate dielectric layers 116A and 116B, a work function layer 118 is formed over the gate dielectric layer 116A in the region 50A as described above with reference to FIG. 17 and the description is not repeated herein.

Figure 27:
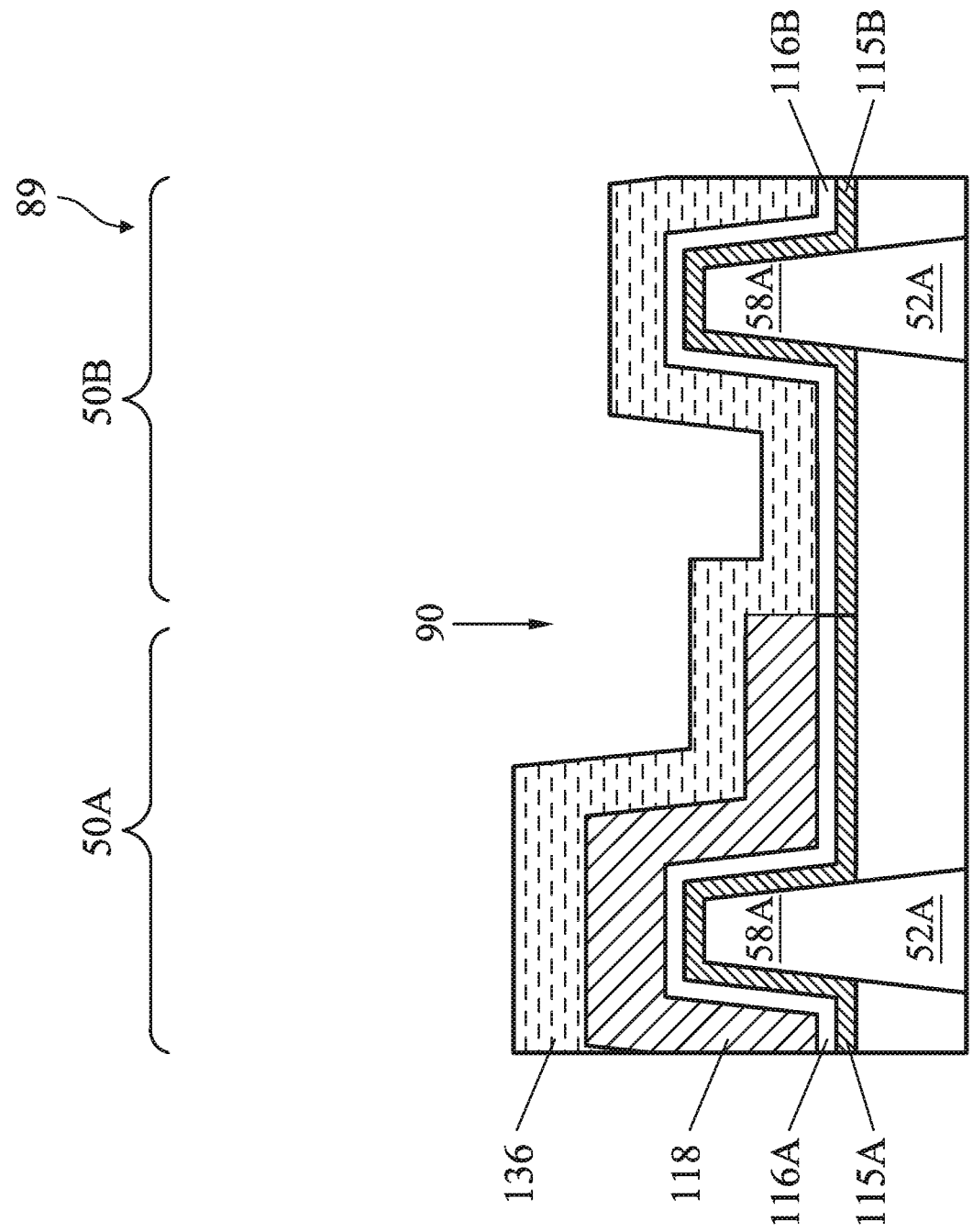

In FIG. 27, after forming the work function layer 118, a work function layer 136 is blanket deposited in the opening 90 in both the region 50A and the region 50B. In some embodiments, the work function layer 136 may be formed using similar materials and method as the work function layer 118 described above with reference to FIG. 17 and the description is not repeated herein. In some embodiments, the work function layer 118 and the work function layer 136 comprise a same material. In other embodiments, the work function layer 118 and the work function layer 136 comprise different materials. In some embodiments, the work function layer 136 has a thickness between about 5 Å and about 400 Å.

Figure 28:
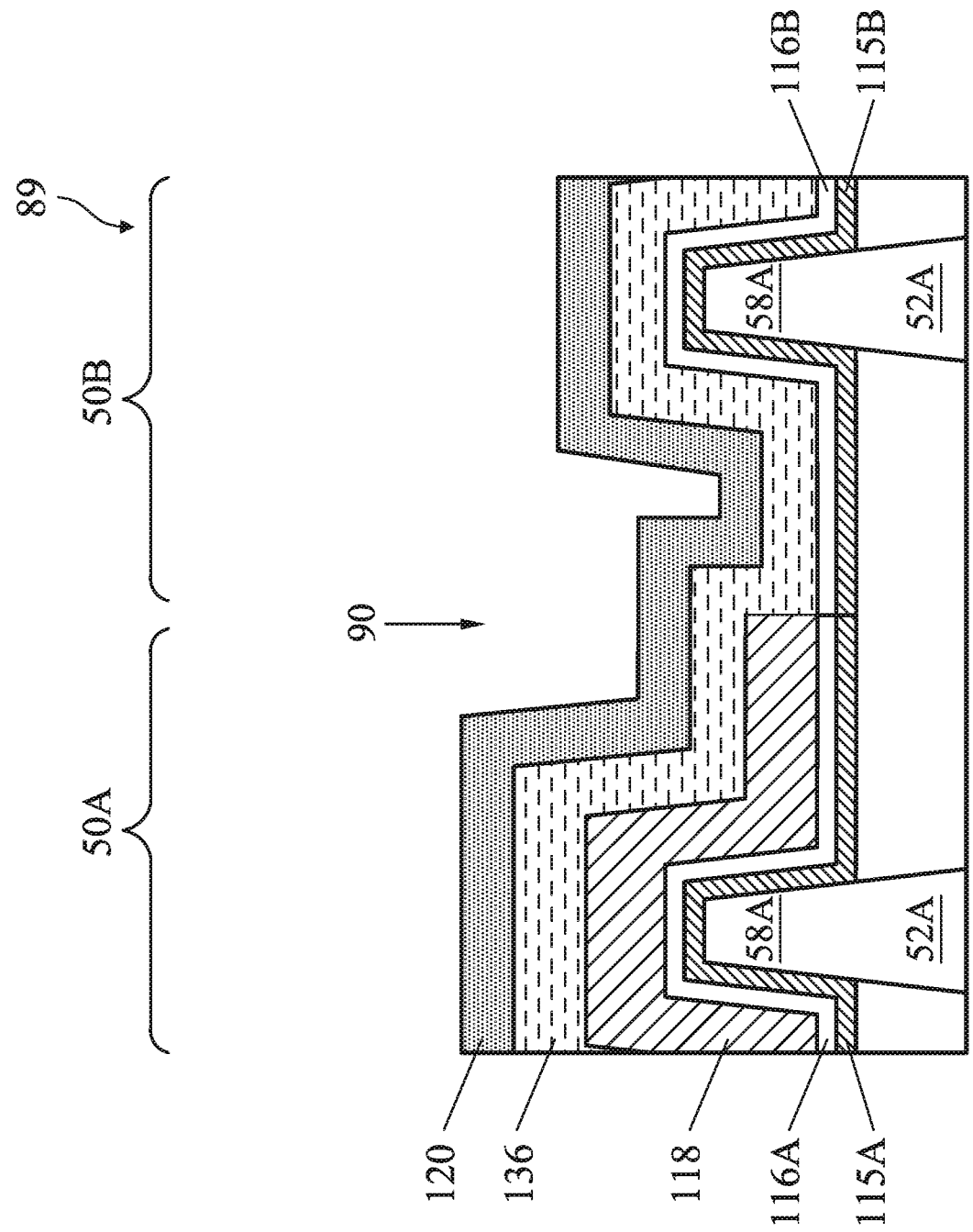

In FIG. 28, after forming the work function layer 136, a barrier layer 120 is blanket deposited in the opening 90 in both the region 50A and the region 50B as described above with reference to FIG. 18 and the description is not repeated herein.

Figure 29:
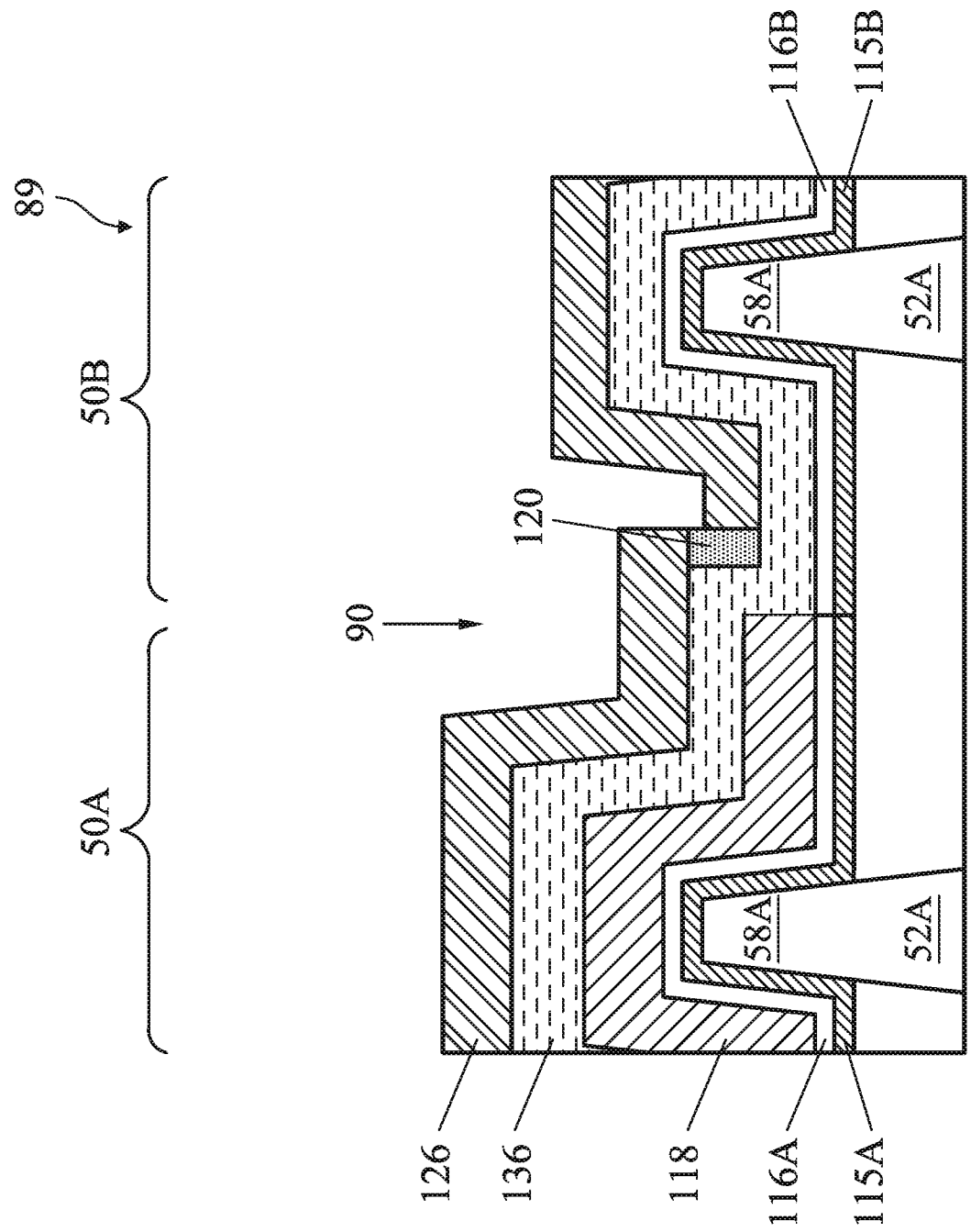

In FIG. 29, after forming the barrier layer 120, a treatment process is performed on the barrier layer 120 to form a treated portion 126 of the barrier layer 120 as described above with reference to FIG. 19 and the description is not repeated herein. After completing the treatment process, a portion of the barrier layer 120 disposed on a sidewall of the work function layer 136 at an interface between the region 50A and the region 50B remains untreated.

Figure 30:
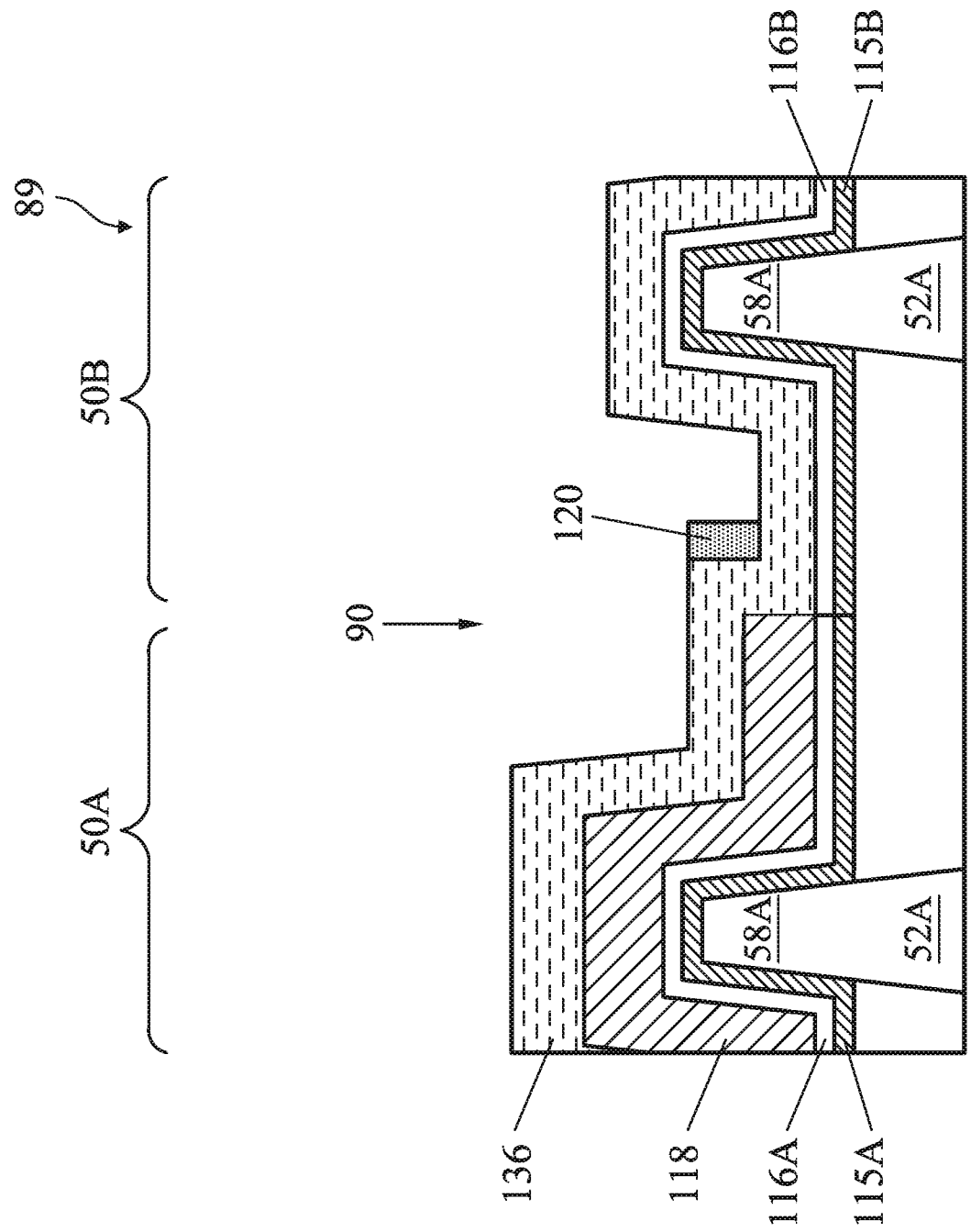

In FIG. 30, the treated portion 126 (see FIG. 29) of the barrier layer 120 is removed as described above with reference to FIG. 20 and description is not repeated herein. After completing the removal process, the un-treated portion of the barrier layer 120 remains along the sidewall of the work function layer 136 at an interface between the region 50A and the region 50B. In some embodiments, parameters of the treatment process (such as, for example, implantation angle and energy) described above with reference to FIG. 29 and parameters of the selective etch process (such as, for example, etchant composition, etch duration, and etch selectivity) are tuned, such that a top surface of the remaining portion of the barrier layer 120 and a top surface of the work function layer 136 are substantially level within process variations.

In other embodiments, the remaining portion of the barrier layer 120 on the sidewall of the work function layer 136 may be formed by blanket depositing the barrier layer 120 as described above with reference to FIG. 28 and removing horizontal and sloped portions of the barrier layer 120. In some embodiments, the horizontal and sloped portions of the barrier layer 120 may be removed using a suitable anisotropic etch process. In such embodiments, the treatment process described above with reference to FIG. 29 is omitted. In some embodiments, parameters of the anisotropic etch process (such as, for example, etchant composition and etch duration) are tuned, such that the top surface of the remaining portion of the barrier layer 120 and the top surface of the work function layer 136 are substantially level within process variations.

Figure 31:
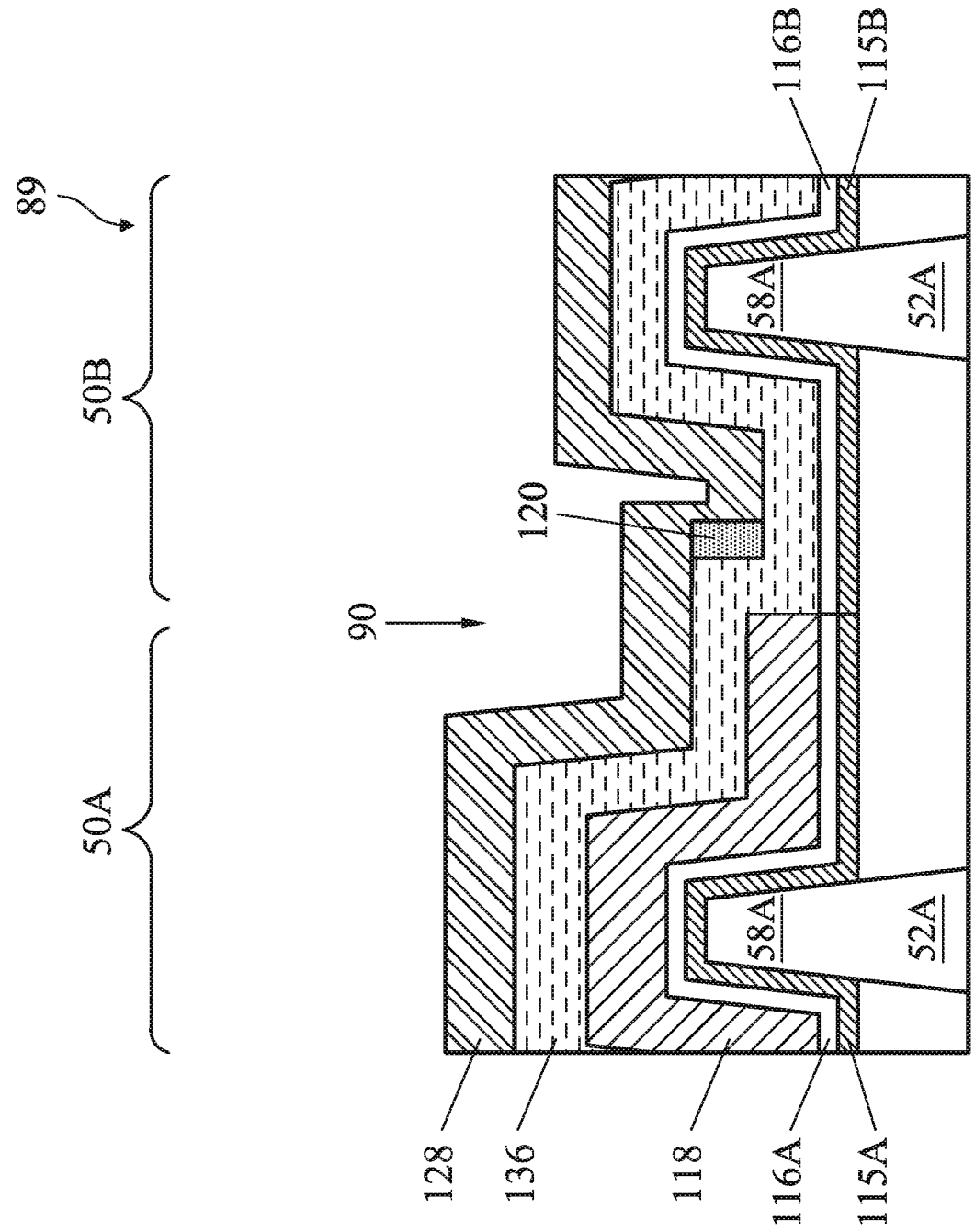

In FIG. 31, after forming the barrier layer 120 on the sidewall of the work function layer 136, a work function layer 128 is blanket deposited in the opening 90 in both the region 50A and the region 50B as described above with reference to FIG. 21 and the description is not repeated herein.

Figure 32:
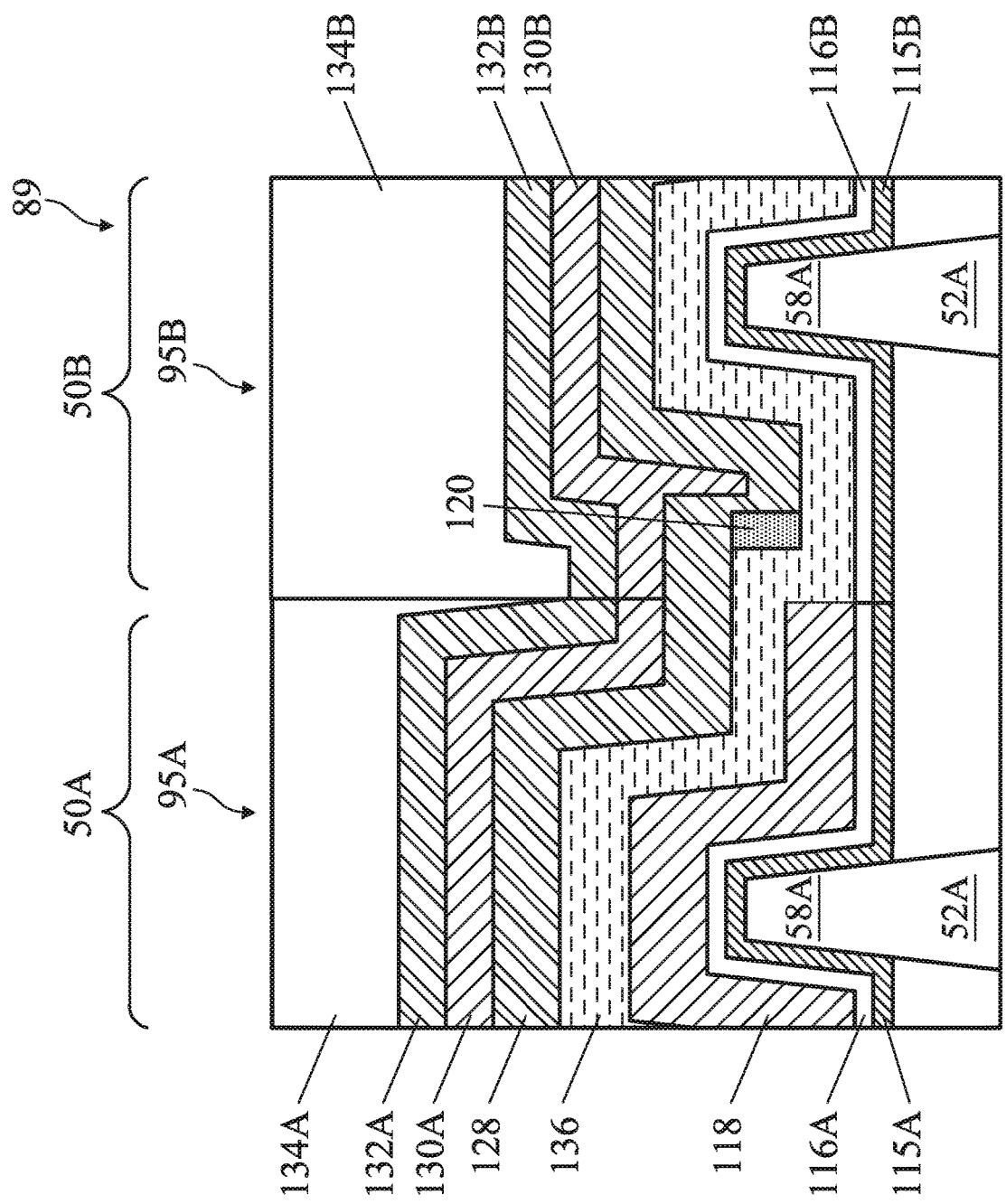

In FIG. 32, after forming the work function layer 128, a shield layer 130A and a shield layer 130B are formed in the opening 90 in the regions 50A and 50B, respectively, as described above with reference to FIG. 22 and the description is not repeated herein. After forming the shield layers 130A and 130B, a glue layer 132A and a glue layer 132B are formed in the opening 90 in the regions 50A and 50B, respectively, as described above with reference to FIG. 22 and the description is not repeated herein. After forming the glue layers 132A and 132B, a conductive fill material 134A and a conductive fill material 134B are formed in the opening 90 in the regions 50A and 50B, respectively, as described above with reference to FIG. 22 and the description is not repeated herein.

After forming the conductive fill materials 134A and 134B, a planarization process, such as a CMP process, may be performed to remove excess portions of the layers 115A, 115B, 116A, 116B, 118, 136, 128, 130A, 130B, 132A, 132B, 134A and 134B, which excess portions are over the top surface of the first ILD 88 (see FIG. 14B). The remaining portions of the interfacial layer 115A, the gate dielectric layer 116A, the work function layers 118, 128 and 136, the shield layer 130A, the glue layer 132A, and the conductive fill material 134A form the replacement gates stack 95A in the region 50A. The remaining portions of the interfacial layer 115B, the gate dielectric layer 116B, the work function layers 128 and 136, the shield layer 130B, the glue layer 132B, and the conductive fill material 134B form the replacement gates stack 95B in the region 50B.

In some embodiments, the barrier layer 120 formed on the sidewall of the work function layer 136 prevents or reduces metal diffusion from the work function layer 128 to the work function layer 136. For example, when the work function layer 128 comprises TiAl, TiAlN, TiAlC, TaAl or TaAlC, the barrier layer 120 prevents or reduces Al diffusion from the work function layer 128 to the work function layer 136. Furthermore, the barrier layer 120 isolates the gate stack 95A from the gate stack 95B and prevents or reduces a threshold voltage shift due to the metal diffusion.

Figure 33:
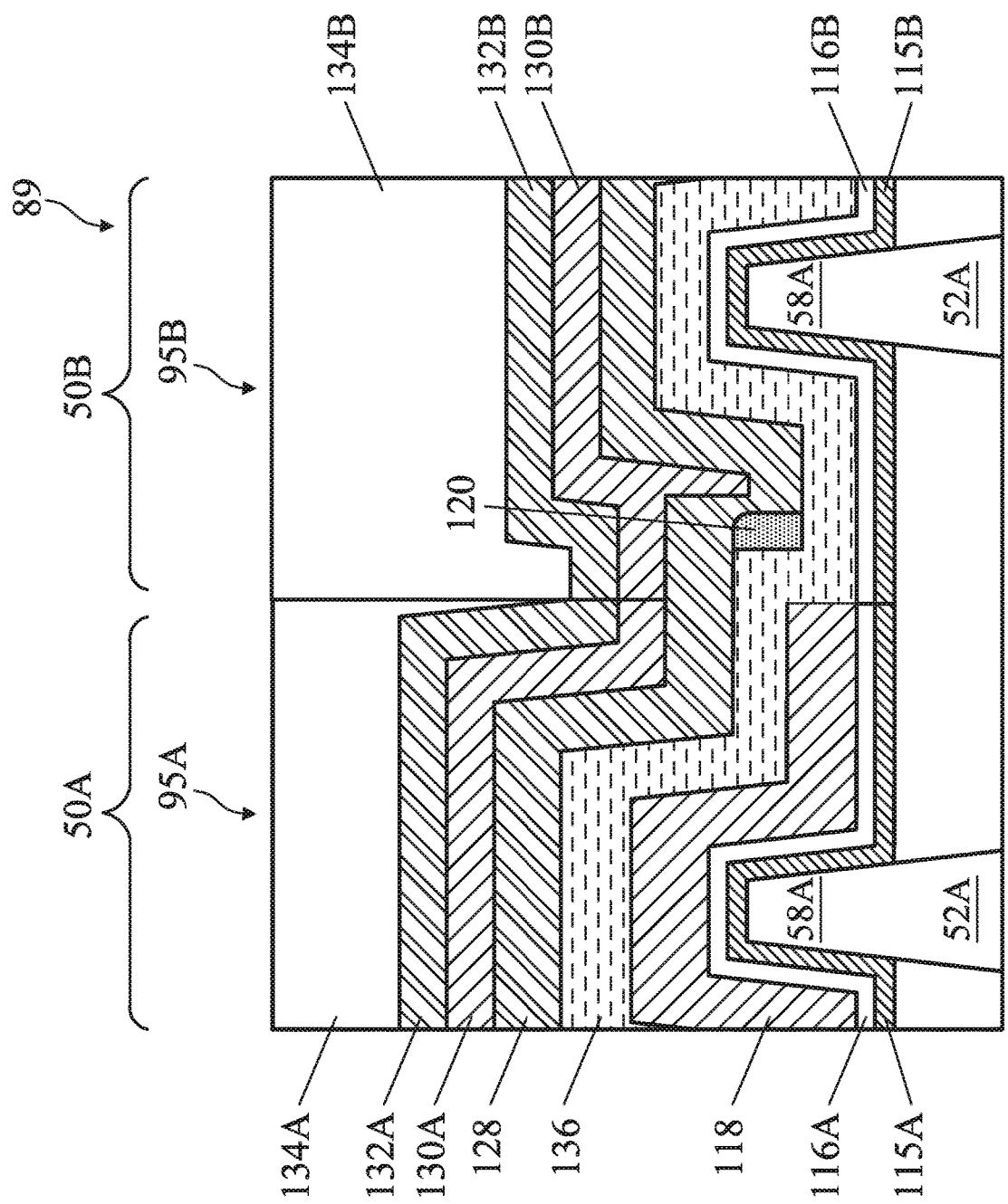
FIG. 33 is a cross-sectional view of a gate structure of a FinFET device in accordance with some embodiments.

FIG. 33 is a cross-sectional view of a gate structure of a FinFET device in accordance with some embodiments. In some embodiments, the gate structure of FIG. 33 is similar to the gate structure of FIG. 32, with similar features being labeled with similar numerical references, and descriptions of these similar features are not repeated herein. In some embodiments, the gate structure of FIG. 32 may be formed using process steps similar to the process steps described above with reference to FIGS. 26-32 and the description is not repeated herein. In some embodiments, parameters of the treatment process (such as, for example, implantation angle and energy) described above with reference to FIG. 29 and parameters of the selective etch process (such as, for example, etchant composition, etch duration, and etch selectivity) described above with reference to FIG. 30 are tuned, such that corners of the remaining portion of the barrier layer 120 are rounded. In some embodiments, an implantation angle of the treatment process may be increased. In some embodiments, implantation energy of the treatment process may be increased. In some embodiments, a duration of the selective etch process may be increased. In some embodiments, etch selectively between the treated and un-treated portions of the barrier layer 120 may be decreased. In other embodiments where the remaining portion of the barrier layer 120 is formed using a blanket deposition process followed by an anisotropic etch process, parameters of the anisotropic etch process (such as, for example, etchant composition and etch duration) are tuned, such that corners of the remaining portion of the barrier layer 120 are rounded.

Figure 34:
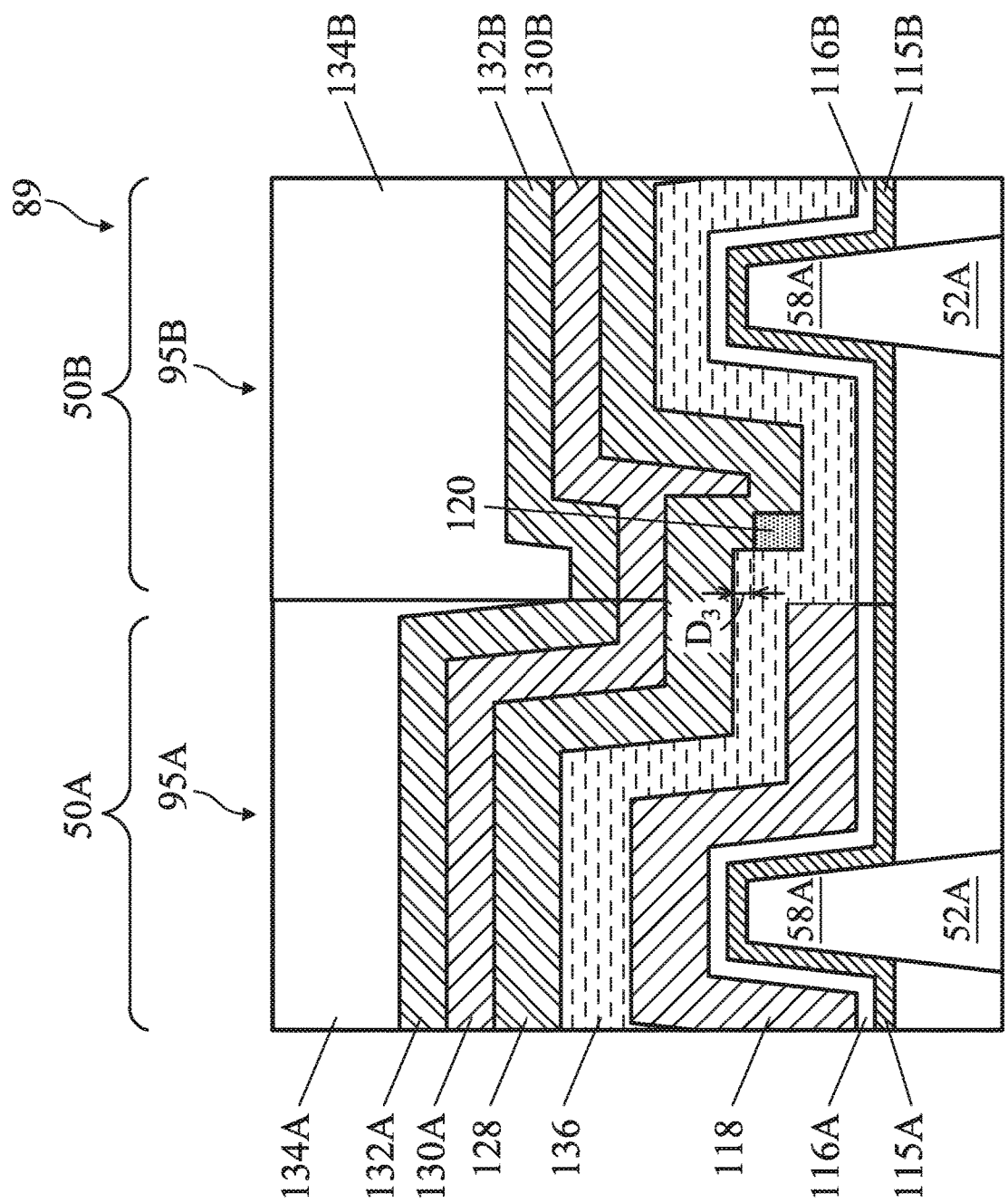
FIG. 34 is a cross-sectional view of a gate structure of a FinFET device in accordance with some embodiments.

FIG. 34 is a cross-sectional view of a gate structure of a FinFET device in accordance with some embodiments. In some embodiments, the gate structure of FIG. 34 is similar to the gate structure of FIG. 32, with similar features being labeled with similar numerical references, and descriptions of these similar features are not repeated herein. In some embodiments, the gate structure of FIG. 34 may be formed using process steps similar to the process steps described above with reference to FIGS. 26-32 and the description is not repeated herein. In some embodiments, parameters of the treatment process (such as, for example, implantation angle and energy) described above with reference to FIG. 29 and parameters of the selective etch process (such as, for example, etchant composition, etch duration, and etch selectivity) described above with reference to FIG. 30 are tuned, such that a top surface of the remaining portion of the barrier layer 120 is lower than a top surface of the work function layer 136. In some embodiments, implantation energy of the treatment process may be increased. In some embodiments, a duration of the selective etch process may be increased. In other embodiments where the remaining portion of the barrier layer 120 is formed using a blanket deposition process followed by an anisotropic etch process, parameters of the anisotropic etch process (such as, for example, etchant composition and etch duration) are tuned, such that the top surface of the remaining portion of the barrier layer 120 is lower than the top surface of the work function layer 136. In some embodiments, the top surface of the remaining portion of the barrier layer 120 is lower than the top surface of the work function layer 136 by a distance $D_3$. In some embodiments, the distance $D_3$ is between about 3 Å and about 55 Å.

Figure 35:
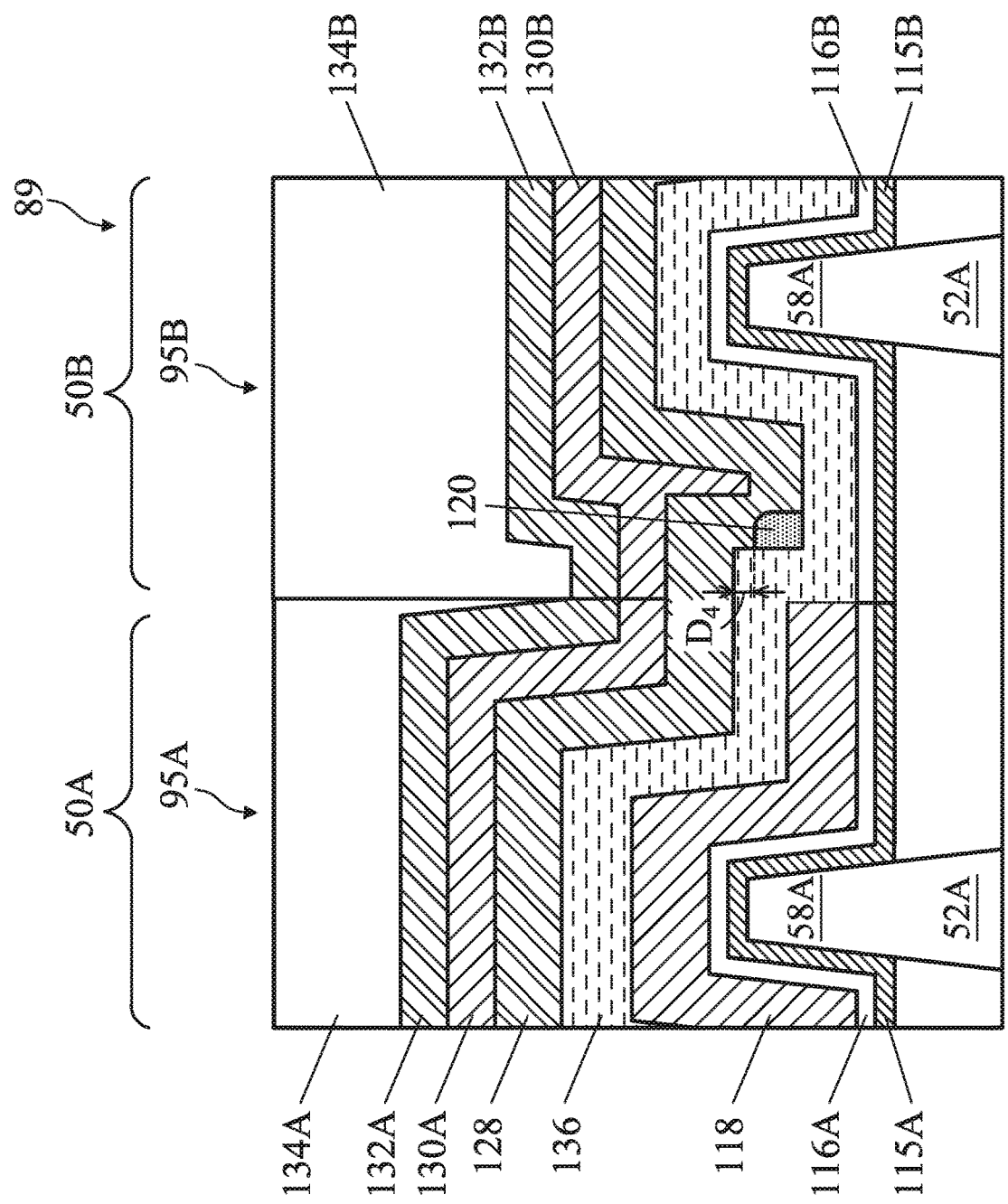
FIG. 35 is a cross-sectional view of a gate structure of a FinFET device in accordance with some embodiments.

FIG. 35 is a cross-sectional view of a gate structure of a FinFET device in accordance with some embodiments. In some embodiments, the gate structure of FIG. 35 is similar to the gate structure of FIG. 32, with similar features being labeled with similar numerical references, and descriptions of these similar features are not repeated herein. In some embodiments, the gate structure of FIG. 35 may be formed using process steps similar to the process steps described above with reference to FIGS. 26-32 and the description is not repeated herein. In some embodiments, parameters of the treatment process (such as, for example, implantation angle and energy) described above with reference to FIG. 29 and parameters of the selective etch process (such as, for example, etchant composition, etch duration, and etch selectivity) described above with reference to FIG. 30 are tuned, such that corners of the remaining portion of the barrier layer 120 are rounded and such that a top surface of the remaining portion of the barrier layer 120 is lower than a top surface of the work function layer 136. In some embodiments, an implantation angle of the treatment process may be increased. In some embodiments, implantation energy of the treatment process may be increased. In some embodiments, a duration of the selective etch process may be increased. In some embodiments, etch selectively between the treated and un-treated portions of the barrier layer 120 may be decreased. In other embodiments where the remaining portion of the barrier layer 120 is formed using a blanket deposition process followed by an anisotropic etch process, parameters of the anisotropic etch process (such as, for example, etchant composition and etch duration) are tuned, such that corners of the remaining portion of the barrier layer 120 are rounded and such that a top surface of the remaining portion of the barrier layer 120 is lower than a top surface of the work function layer 136. In some embodiments, the top surface of the remaining portion of the barrier layer 120 is lower than the top surface of the work function layer 136 by a distance $D_4$. In some embodiments, the distance $D_4$ is between about 3 Å and about 55 A.

FIGS. 36-43 are cross-sectional views of intermediate stages in the manufacturing of a gate structure including the gate stacks 95A and 95B illustrated in FIGS. 14A and 14B, in accordance with some embodiments. In particular, FIGS. 36-43 illustrate detailed views of a region 89 of FIG. 14A as the gate stacks 95A and 95B are formed in the opening 90. In some embodiments, process steps described in FIGS. 36-43 are similar to the process steps described above with reference to FIGS. 17-22, with similar features being labeled with similar numerical references, and descriptions of these similar features are not repeated herein.

Figure 36:
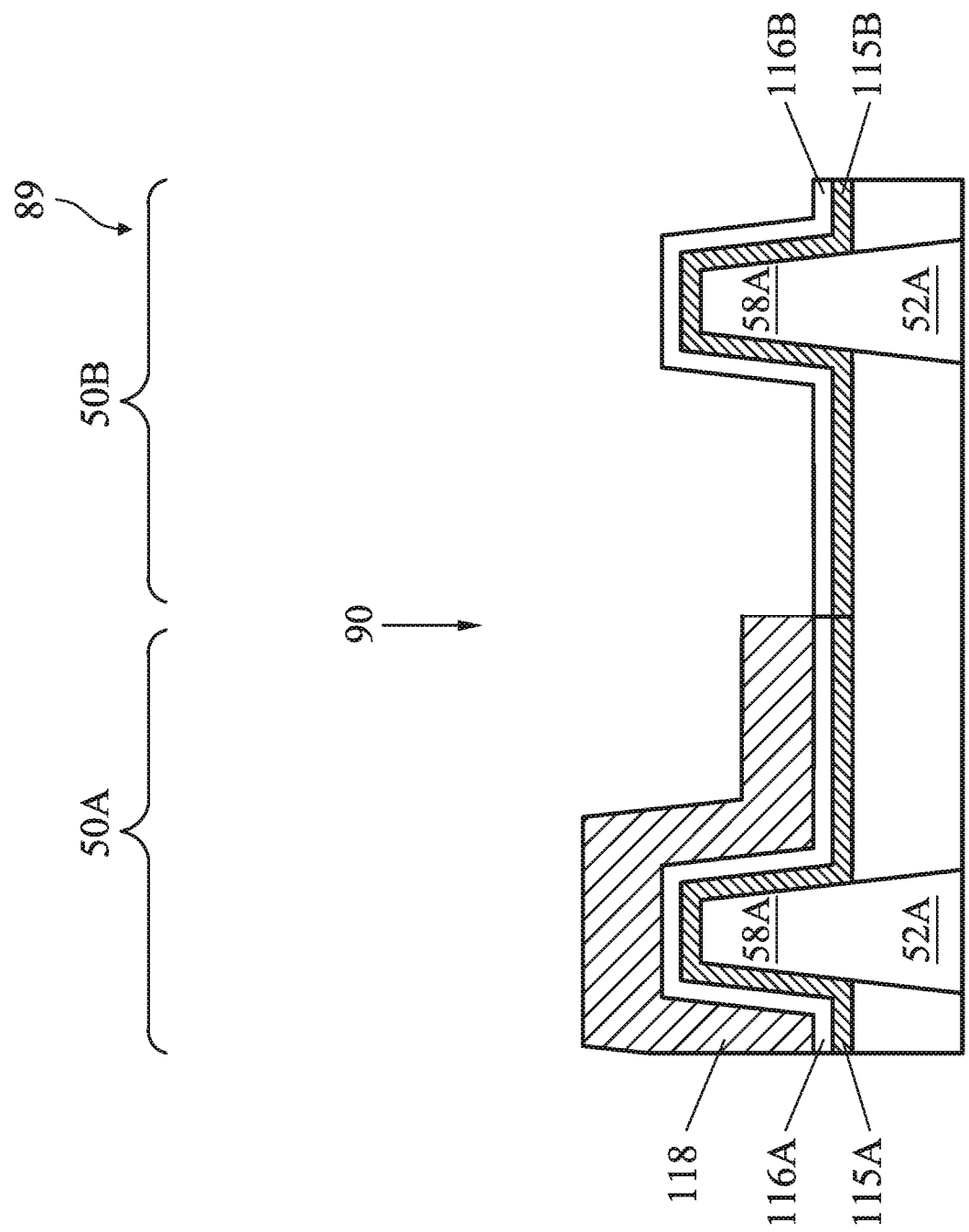
FIGS. 36-43 are cross-sectional views of intermediate stages in the manufacturing of a gate structure of a FinFET device in accordance with some embodiments.

In FIG. 36, interfacial layers 115A and 115B are formed in the opening 90 in the regions 50A and 50B, respectively, as described above with reference to FIG. 17 and the description is not repeated herein. After forming the interfacial layers 115A and 115B, a gate dielectric layer 116A and a gate dielectric layer 116B are formed in the opening 90 in the regions 50A and 50B, respectively, as described above with reference to FIG. 17 and the description is not repeated herein. After forming the gate dielectric layers 116A and 116B, a work function layer 118 is formed over the gate dielectric layer 116A in the region 50A as described above with reference to FIG. 17 and the description is not repeated herein.

Figure 37:
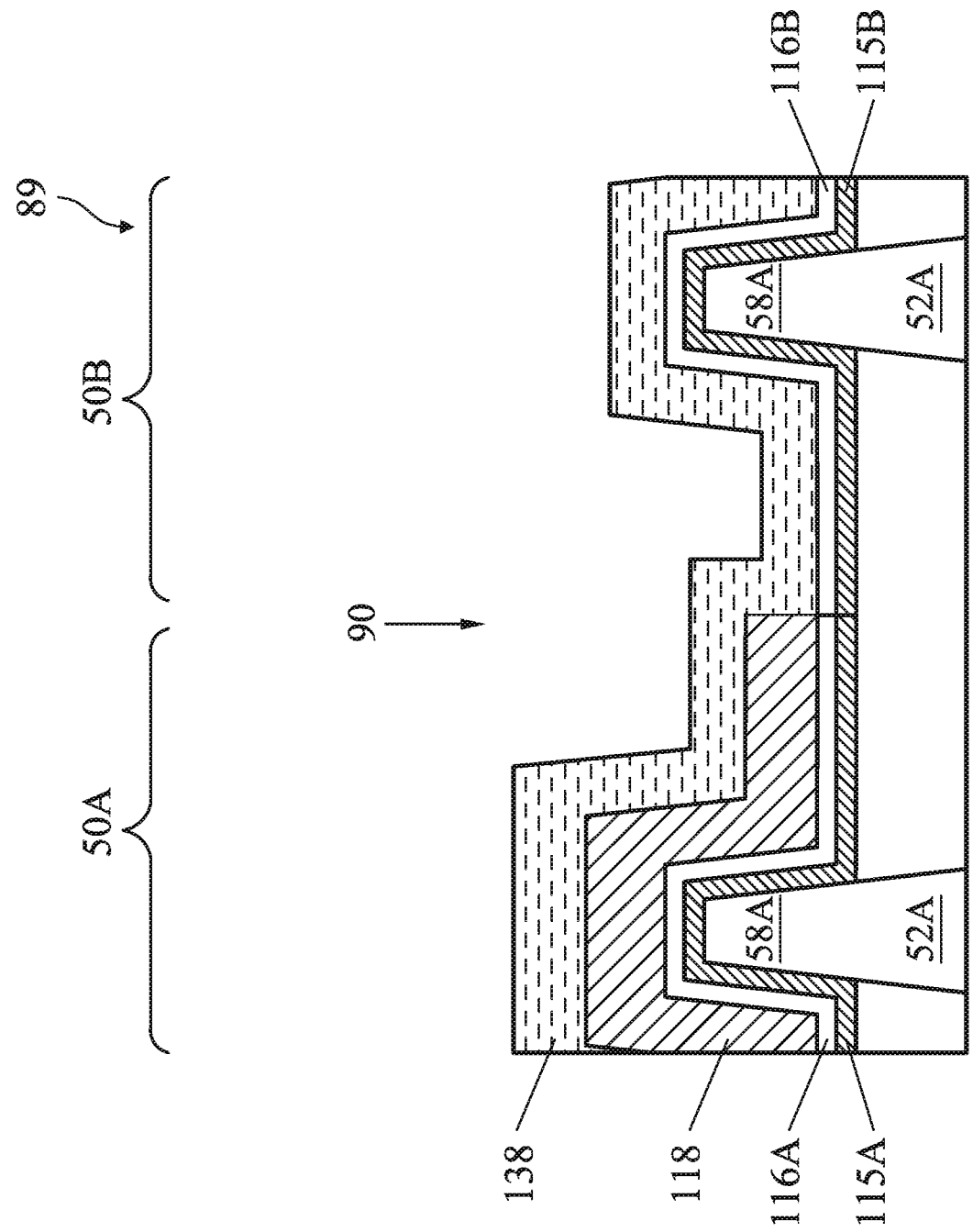

In FIG. 37, after forming the work function layer 118, a work function layer 138 is blanket deposited in the opening 90 in both the region 50A and the region 50B. In some embodiments, the work function layer 138 may be formed using similar materials and method as the work function layer 118 described above with reference to FIG. 17 and the description is not repeated herein. In some embodiments, the work function layer 118 and the work function layer 138 comprise a same material. In other embodiments, the work function layer 118 and the work function layer 138 comprise different materials. In some embodiments, the work function layer 138 has a thickness between about 5 Å and about 400 Å.

Figure 38:
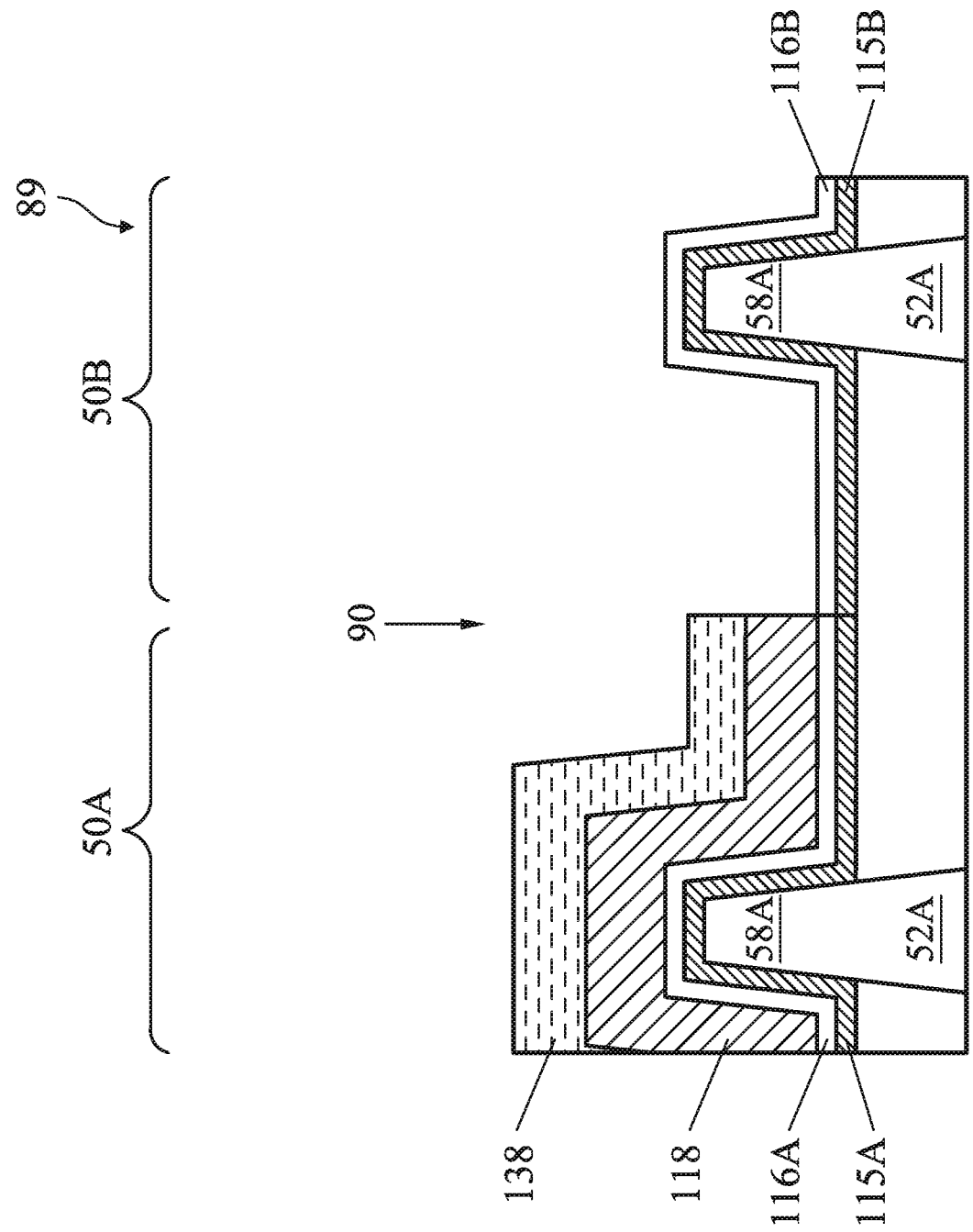

In FIG. 38, a portion of the work function layer 138 is removed from the region 50B, while a remaining portion of the work function layer 138 remains in the region 50A. In some embodiments, the portion of the work function layer 138 may be removed from the region 50B using suitable photolithography and etching methods.

Figure 39:
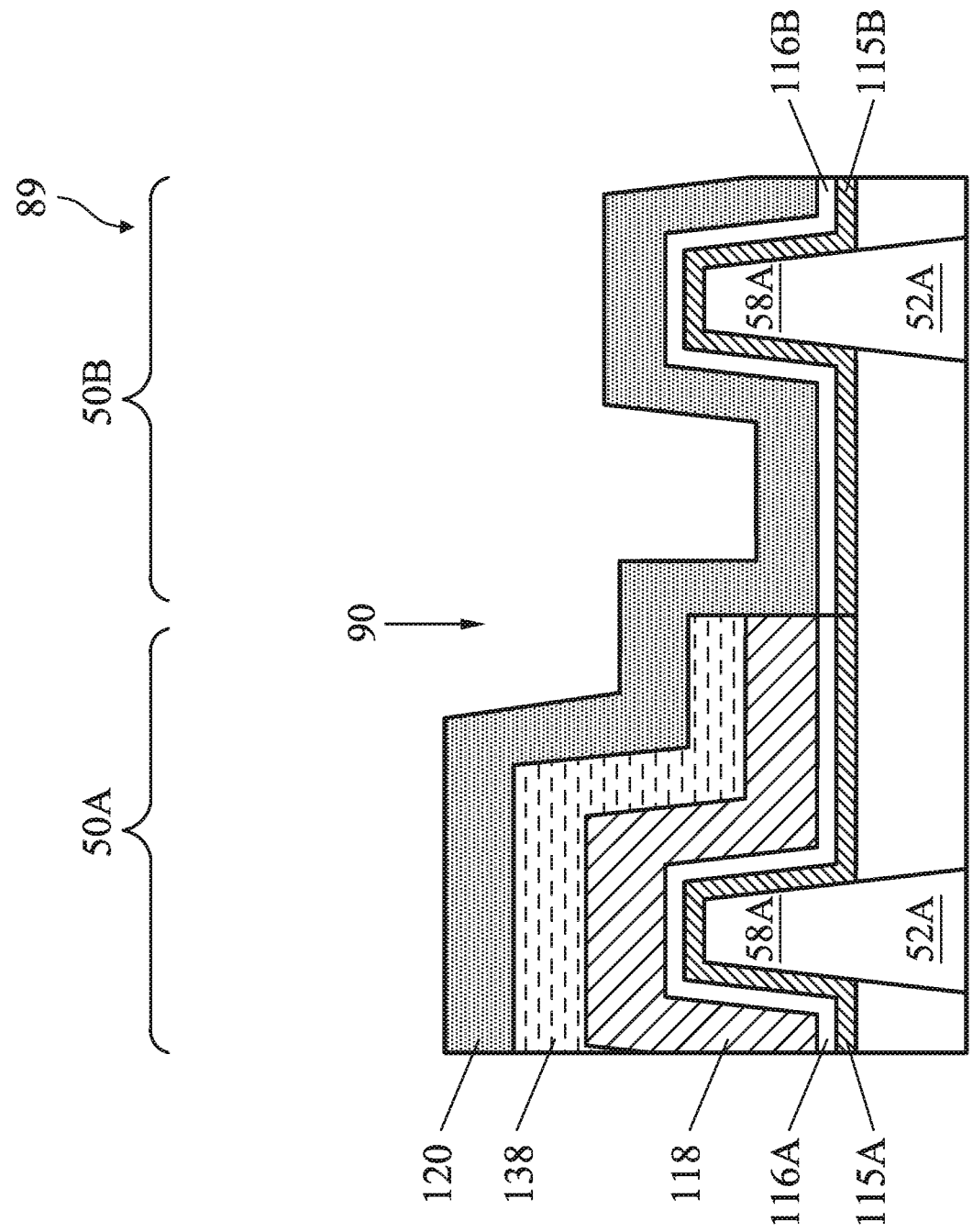

In FIG. 39, after patterning the work function layer 138, a barrier layer 120 is blanket deposited in the opening 90 in both the region 50A and the region 50B as described above with reference to FIG. 18 and the description is not repeated herein.

Figure 40:
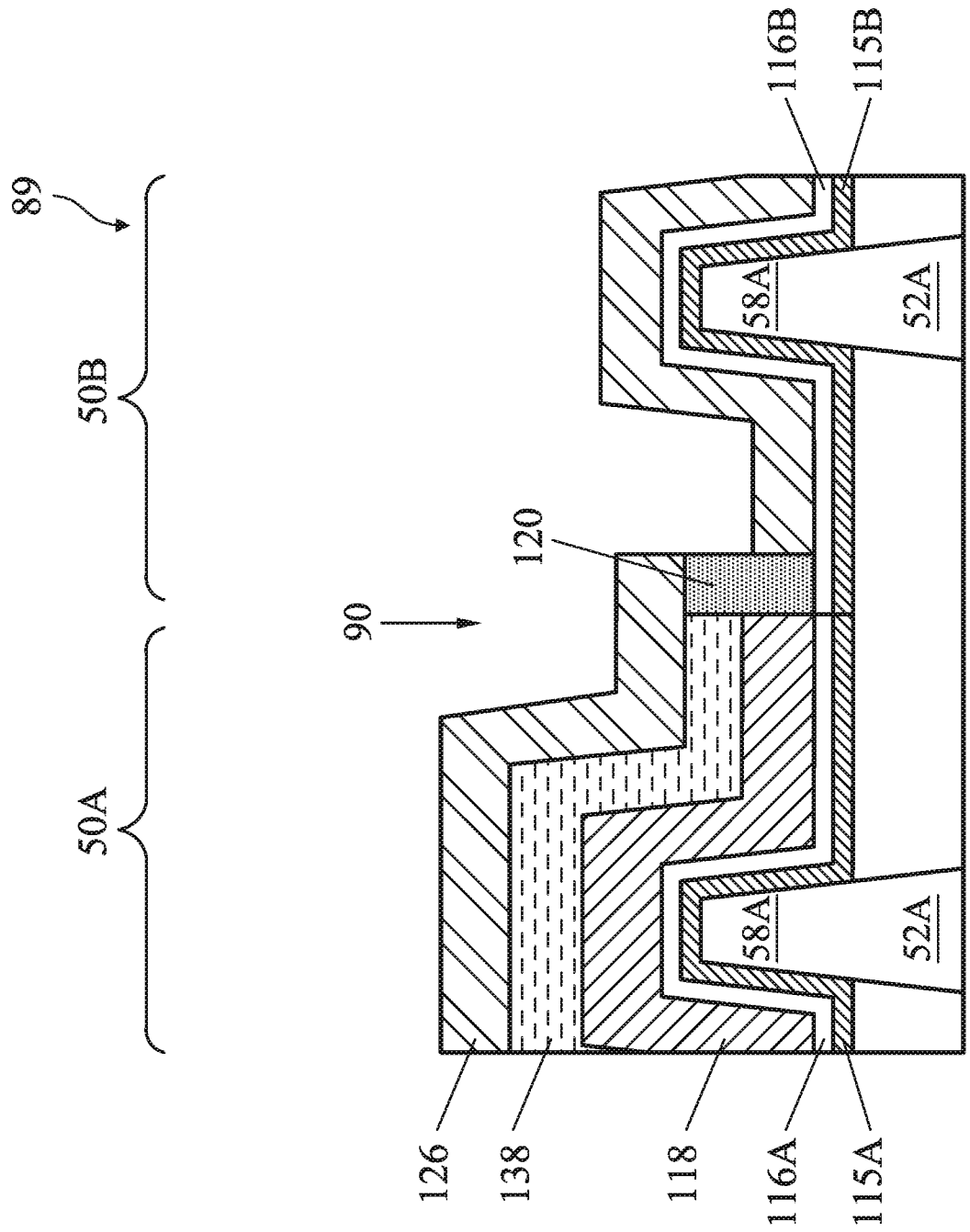

In FIG. 40, after forming the barrier layer 120, a treatment process is performed on the barrier layer 120 to form a treated portion 126 of the barrier layer 120 as described above with reference to FIG. 19 and the description is not repeated herein. In some embodiments, after completing the treatment process, a portion of the barrier layer 120 disposed on a sidewall of the work function layer 118 and a sidewall of the work function layer 138 at an interface between the region 50A and the region 50B remains untreated.

Figure 41:
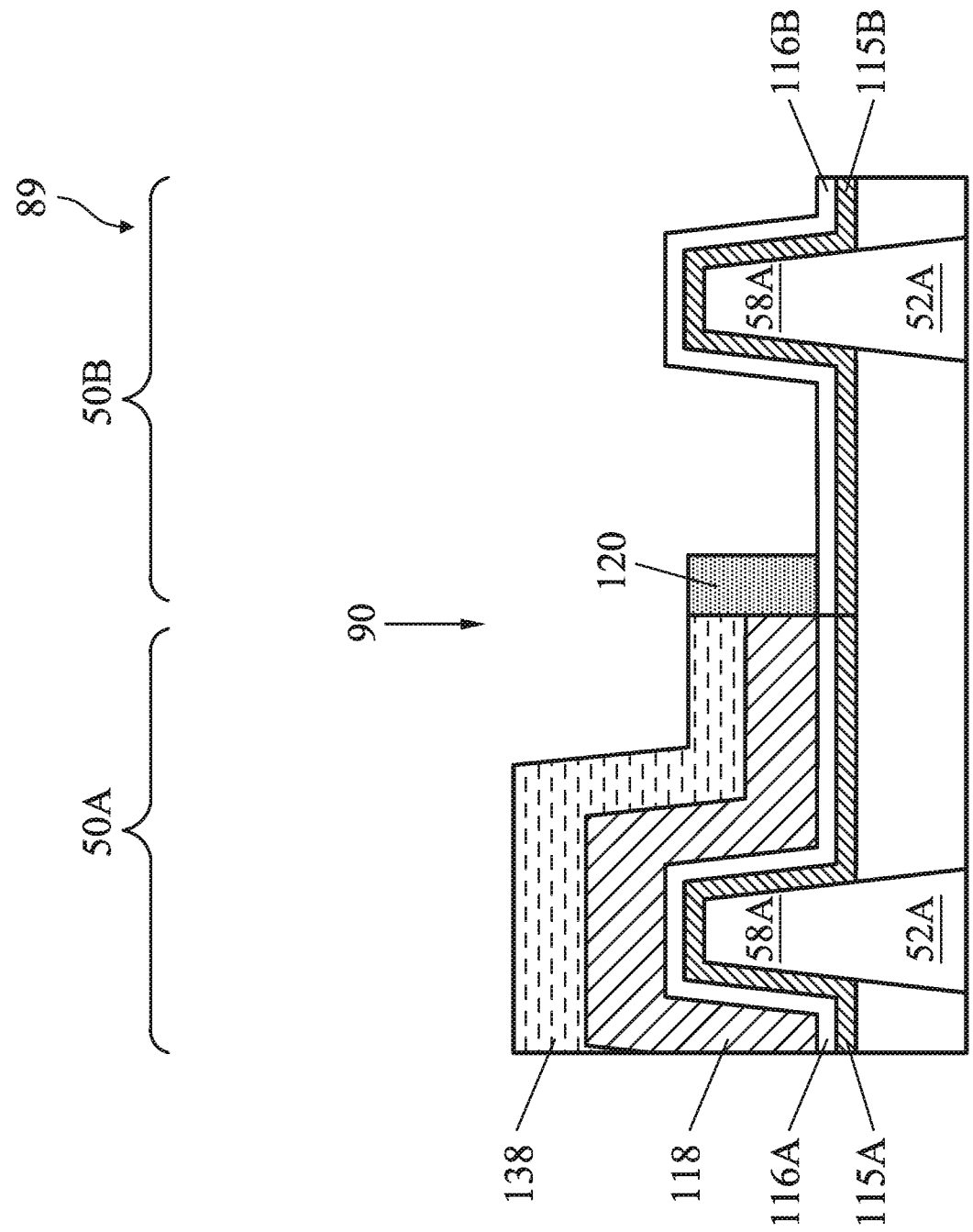

In FIG. 41, the treated portion 126 (see FIG. 40) of the barrier layer 120 is removed as described above with reference to FIG. 20 and description is not repeated herein. After completing the removal process, the un-treated portion of the barrier layer 120 remains along the sidewall of the work function layer 118 and the sidewall of the work function layer 138 at the interface between the region 50A and the region 50B. In some embodiments, parameters of the treatment process (such as, for example, implantation angle and energy) described above with reference to FIG. 40 and parameters of the selective etch process (such as, for example, etchant composition, etch duration, and etch selectivity) are tuned, such that a top surface of the remaining portion of the barrier layer 120 and a top surface of the work function layer 138 are substantially level within process variations.

In other embodiments, the remaining portion of the barrier layer 120 on the sidewall of the work function layer 118 and the sidewall of the work function layer 138 may be formed by blanket depositing the barrier layer 120 as described above with reference to FIG. 39 and removing horizontal and sloped portions of the barrier layer 120. In some embodiments, the horizontal and sloped portions of the barrier layer 120 may be removed using a suitable anisotropic etch process. In such embodiments, the treatment process described above with reference to FIG. 40 is omitted. In some embodiments, parameters of the anisotropic etch process (such as, for example, etchant composition and etch duration) are tuned, such that a top surface of the remaining portion of the barrier layer 120 and a top surface of the work function layer 138 are substantially level within process variations.

Figure 42:
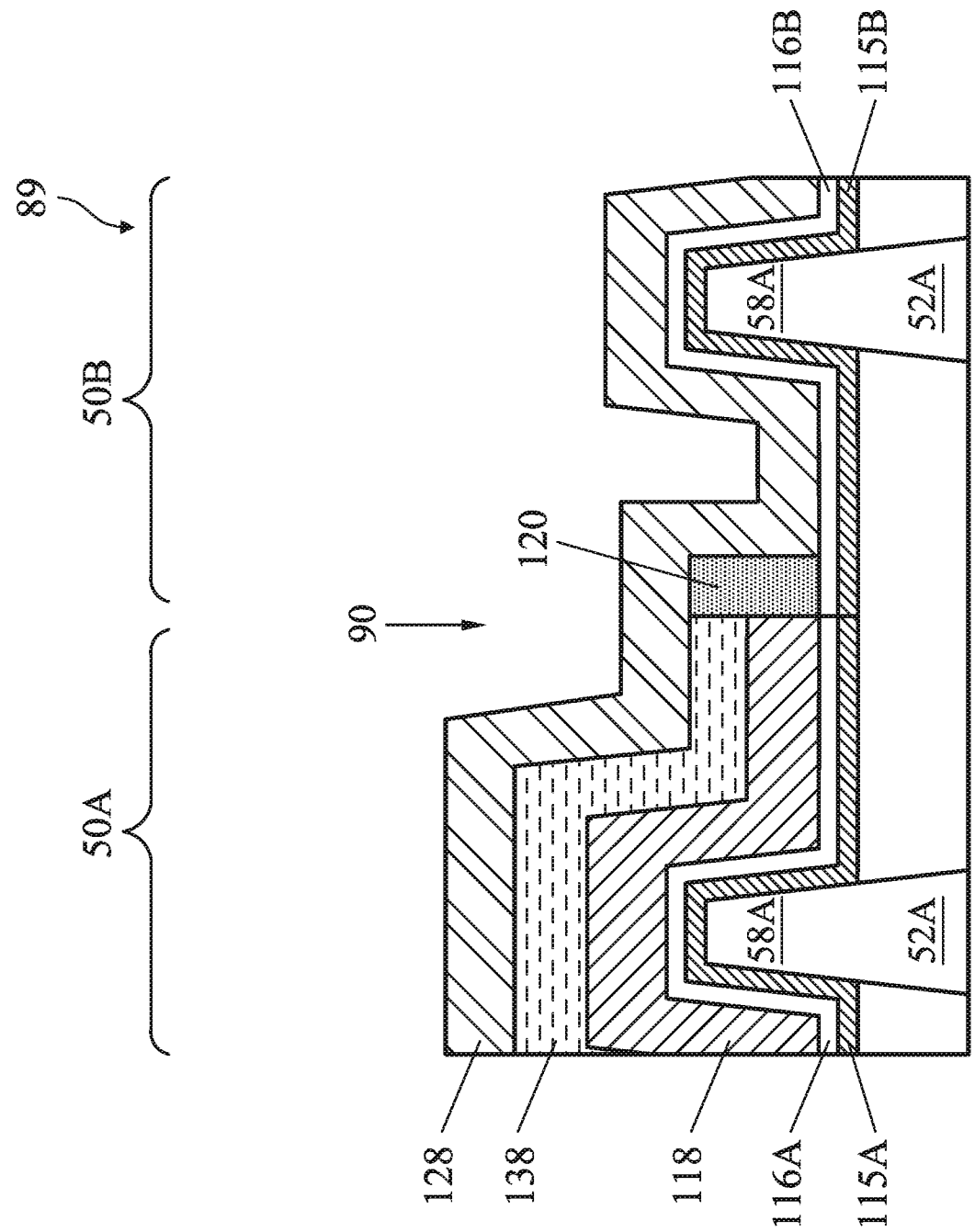

In FIG. 42, after forming the barrier layer 120 on the sidewall of the work function layer 118 and the sidewall of the work function layer 138, a work function layer 128 is blanket deposited in the opening 90 in both the region 50A and the region 50B as described above with reference to FIG. 21 and the description is not repeated herein.

Figure 43:
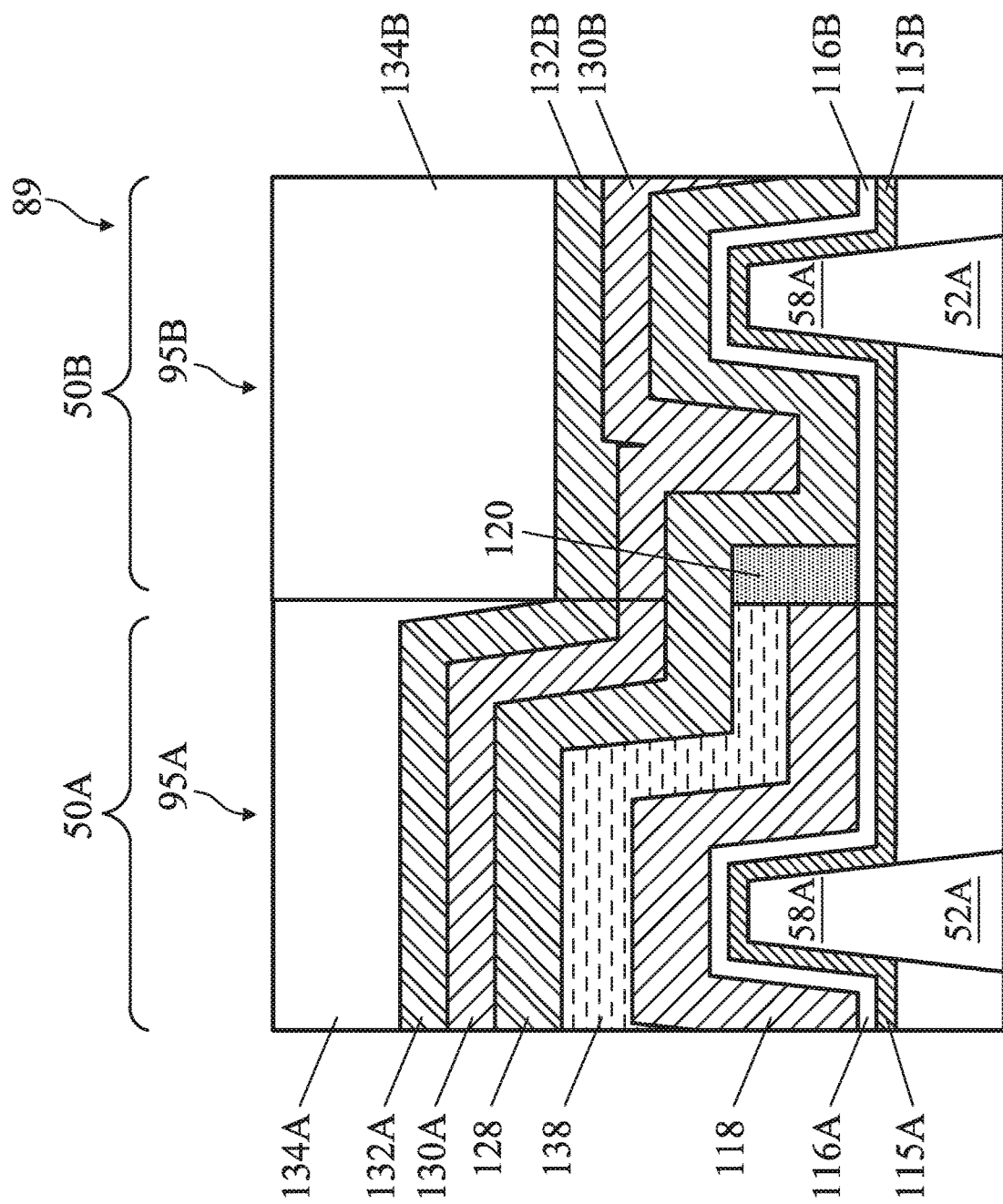

In FIG. 43, after forming the work function layer 128, a shield layer 130A and a shield layer 130B are formed in the opening 90 in the regions 50A and 50B, respectively, as described above with reference to FIG. 22 and the description is not repeated herein. After forming the shield layers 130A and 130B, a glue layer 132A and a glue layer 132B are formed in the opening 90 in the regions 50A and 50B, respectively, as described above with reference to FIG. 22 and the description is not repeated herein. After forming the glue layers 132A and 132B, a conductive fill material 134A and a conductive fill material 134B are formed in the opening 90 in the regions 50A and 50B, respectively, as described above with reference to FIG. 22 and the description is not repeated herein.

After forming the conductive fill materials 134A and 134B, a planarization process, such as a CMP process, may be performed to remove excess portions of the layers 115A, 115B, 116A, 116B, 118, 138, 128, 130A, 130B, 132A, 132B, 134A and 134B, which excess portions are over the top surface of the first ILD 88 (see FIG. 14B). The remaining portions of the interfacial layer 115A, the gate dielectric layer 116A, the work function layers 118, 128 and 138, the shield layer 130A, and the glue layer 132A, and the conductive fill material 134A form the replacement gates stack 95A in the region 50A. The remaining portions of the interfacial layer 115B, the gate dielectric layer 116B, the work function layer 128, the shield layer 130B, and the glue layer 132B, and the conductive fill material 134B form the replacement gates stack 95B in the region 50B.

In some embodiments, the barrier layer 120 formed on the sidewall of the work function layer 118 and the sidewall of the work function layer 138 prevents or reduces metal diffusion from the work function layer 128 to the work function layers 118 and 138. For example, when the work function layer 128 comprises TiAl, TiAlN, TiAlC, TaAl or TaAlC, the barrier layer 120 prevents or reduces Al diffusion from the work function layer 128 to the work function layers 118 and 138. Furthermore, the barrier layer 120 isolates the gate stack 95A from the gate stack 95B and prevents or reduces a threshold voltage shift due to the metal diffusion.

Figure 44:
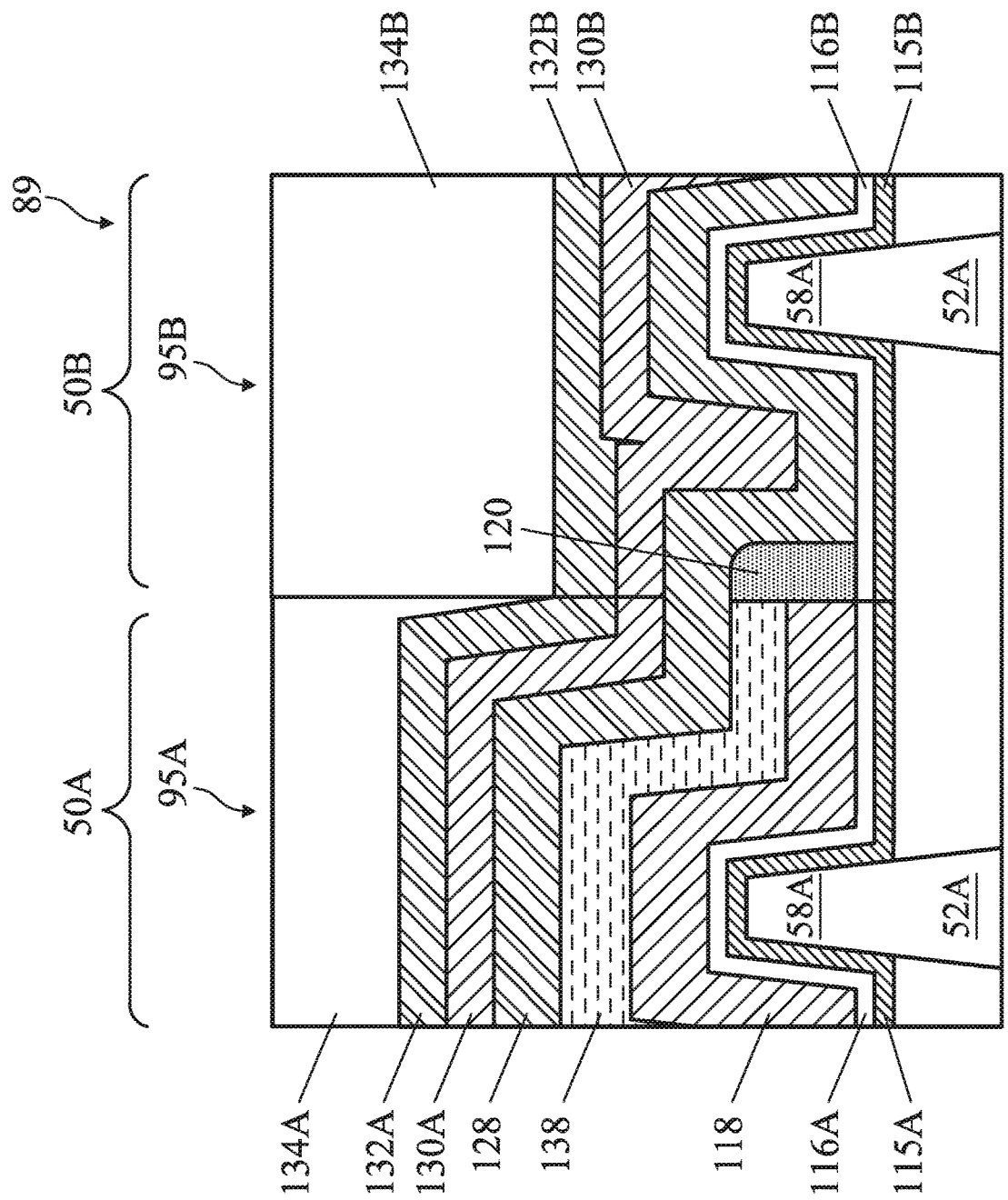
FIG. 44 is a cross-sectional view of a gate structure of a FinFET device in accordance with some embodiments.

FIG. 44 is a cross-sectional view of a gate structure of a FinFET device in accordance with some embodiments. In some embodiments, the gate structure of FIG. 44 is similar to the gate structure of FIG. 43, with similar features being labeled with similar numerical references, and descriptions of these similar features are not repeated herein. In some embodiments, the gate structure of FIG. 44 may be formed using process steps similar to the process steps described above with reference to FIGS. 36-43 and the description is not repeated herein. In some embodiments, parameters of the treatment process (such as, for example, implantation angle and energy) described above with reference to FIG. 40 and parameters of the selective etch process (such as, for example, etchant composition, etch duration, and etch selectivity) described above with reference to FIG. 41 are tuned, such that corners of the remaining portion of the barrier layer 120 are rounded. In some embodiments, an implantation angle of the treatment process may be increased. In some embodiments, implantation energy of the treatment process may be increased. In some embodiments, a duration of the selective etch process may be increased. In some embodiments, etch selectively between the treated and un-treated portions of the barrier layer 120 may be decreased. In other embodiments where the remaining portion of the barrier layer 120 is formed using a blanket deposition process followed by an anisotropic etch process, parameters of the anisotropic etch process (such as, for example, etchant composition and etch duration) are tuned, such that corners of the remaining portion of the barrier layer 120 are rounded.

Figure 45:
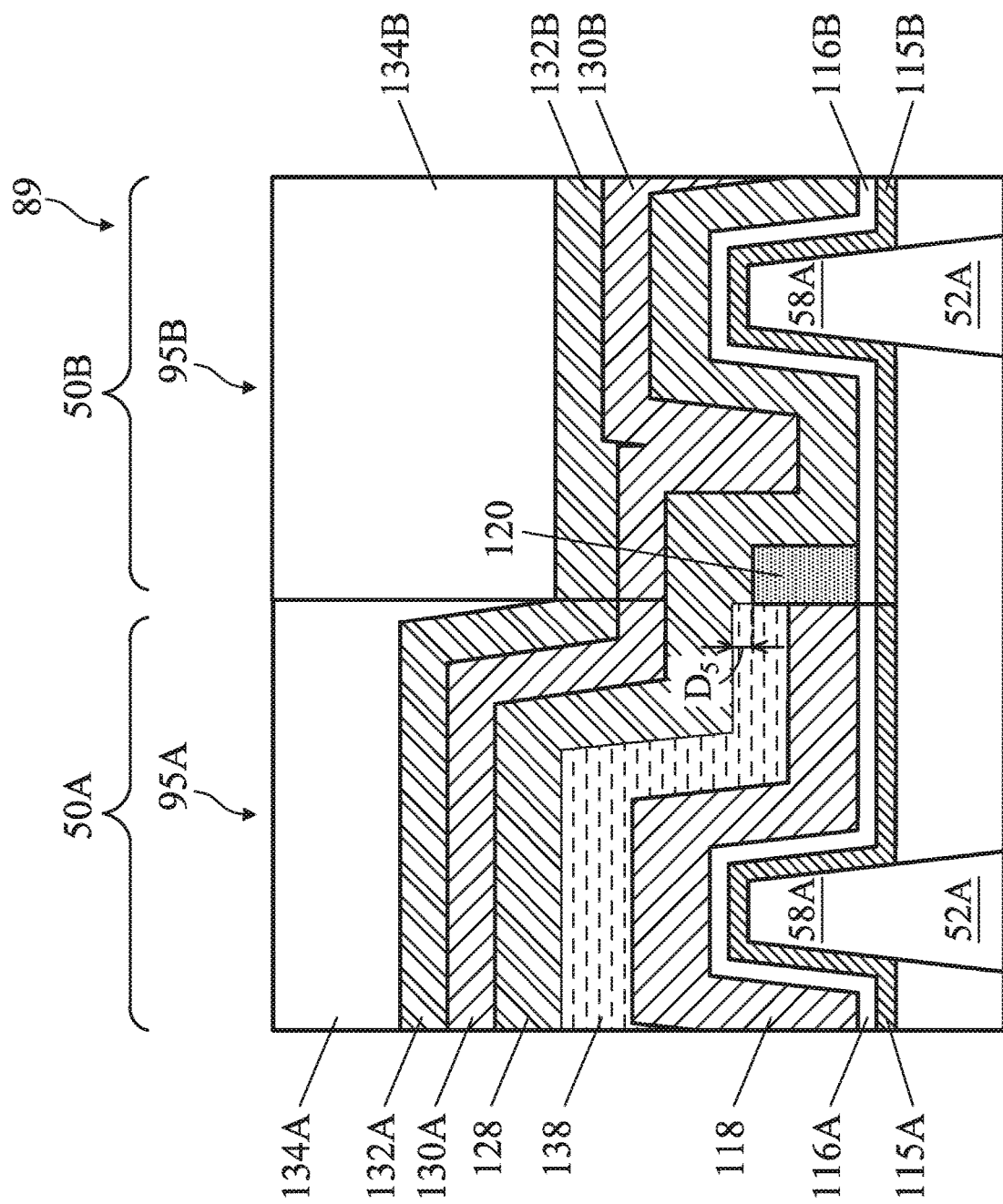
FIG. 45 is a cross-sectional view of a gate structure of a FinFET device in accordance with some embodiments.

FIG. 45 is a cross-sectional view of a gate structure of a FinFET device in accordance with some embodiments. In some embodiments, the gate structure of FIG. 45 is similar to the gate structure of FIG. 43, with similar features being labeled with similar numerical references, and descriptions of these similar features are not repeated herein. In some embodiments, the gate structure of FIG. 45 may be formed using process steps similar to the process steps described above with reference to FIGS. 36-43 and the description is not repeated herein. In some embodiments, parameters of the treatment process (such as, for example, implantation angle and energy) described above with reference to FIG. 40 and parameters of the selective etch process (such as, for example, etchant composition, etch duration, and etch selectivity) described above with reference to FIG. 41 are tuned, such that a top surface of the remaining portion of the barrier layer 120 is lower than a top surface of the work function layer 138. In some embodiments, implantation energy of the treatment process may be increased. In some embodiments, a duration of the selective etch process may be increased. In other embodiments where the remaining portion of the barrier layer 120 is formed using a blanket deposition process followed by an anisotropic etch process, parameters of the anisotropic etch process (such as, for example, etchant composition and etch duration) are tuned, such that the top surface of the remaining portion of the barrier layer 120 is lower than the top surface of the work function layer 138. In some embodiments, the top surface of the remaining portion of the barrier layer 120 is lower than the top surface of the work function layer 138 by a distance $D_5$. In some embodiments, the distance $D_5$ is between about 3 Å and about 55 Å.

Figure 46:
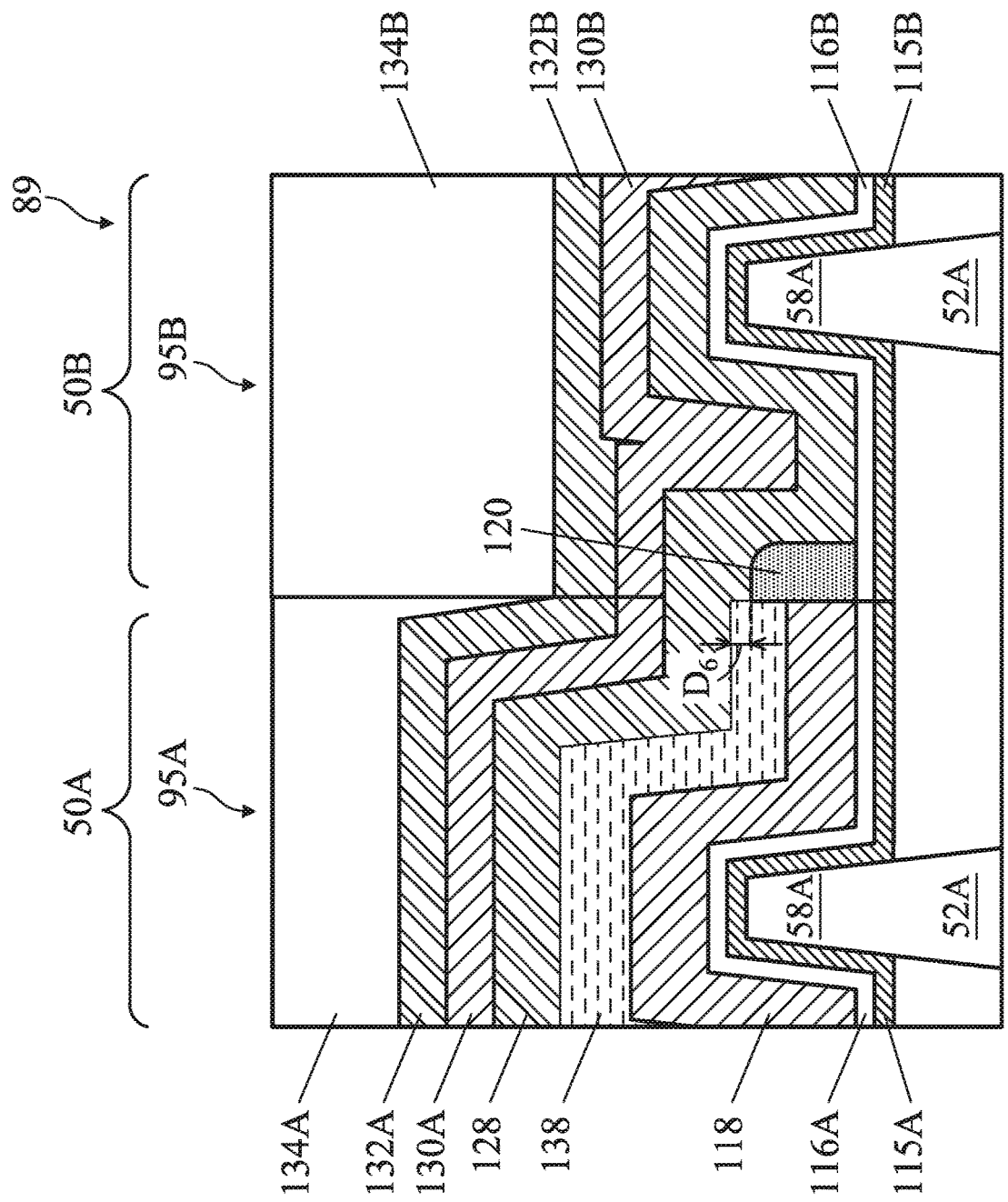
FIG. 46 is a cross-sectional view of a gate structure of a FinFET device in accordance with some embodiments.

FIG. 46 is a cross-sectional view of a gate structure of a FinFET device in accordance with some embodiments. In some embodiments, the gate structure of FIG. 46 is similar to the gate structure of FIG. 43, with similar features being labeled with similar numerical references, and descriptions of these similar features are not repeated herein. In some embodiments, the gate structure of FIG. 46 may be formed using process steps similar to the process steps described above with reference to FIGS. 36-43 and the description is not repeated herein. In some embodiments, parameters of the treatment process (such as, for example, implantation angle and energy) described above with reference to FIG. 40 and parameters of the selective etch process (such as, for example, etchant composition, etch duration, and etch selectivity) described above with reference to FIG. 41 are tuned, such that corners of the remaining portion of the barrier layer 120 are rounded and such that a top surface of the remaining portion of the barrier layer 120 is lower than a top surface of the work function layer 138. In some embodiments, an implantation angle of the treatment process may be increased. In some embodiments, implantation energy of the treatment process may be increased. In some embodiments, a duration of the selective etch process may be increased. In some embodiments, etch selectively between the treated and un-treated portions of the barrier layer 120 may be decreased. In other embodiments where the remaining portion of the barrier layer 120 is formed using a blanket deposition process followed by an anisotropic etch process, parameters of the anisotropic etch process (such as, for example, etchant composition and etch duration) are tuned, such that corners of the remaining portion of the barrier layer 120 are rounded and such that a top surface of the remaining portion of the barrier layer 120 is lower than a top surface of the work function layer 138. In some embodiments, the top surface of the remaining portion of the barrier layer 120 is lower than the top surface of the work function layer 138 by a distance $D_6$. In some embodiments, the distance $D_6$ is between about 3 Å and about 55 A.

In some embodiments, some or all of the devices illustrated in FIGS. 22-26, 32-35, and 43-46 may coexists on a single wafer or a single die, and may be formed at different locations on the wafer or the die. In some embodiments, the number of p-type work function layers may be more than one to as much as six different layers.

Figure 47:
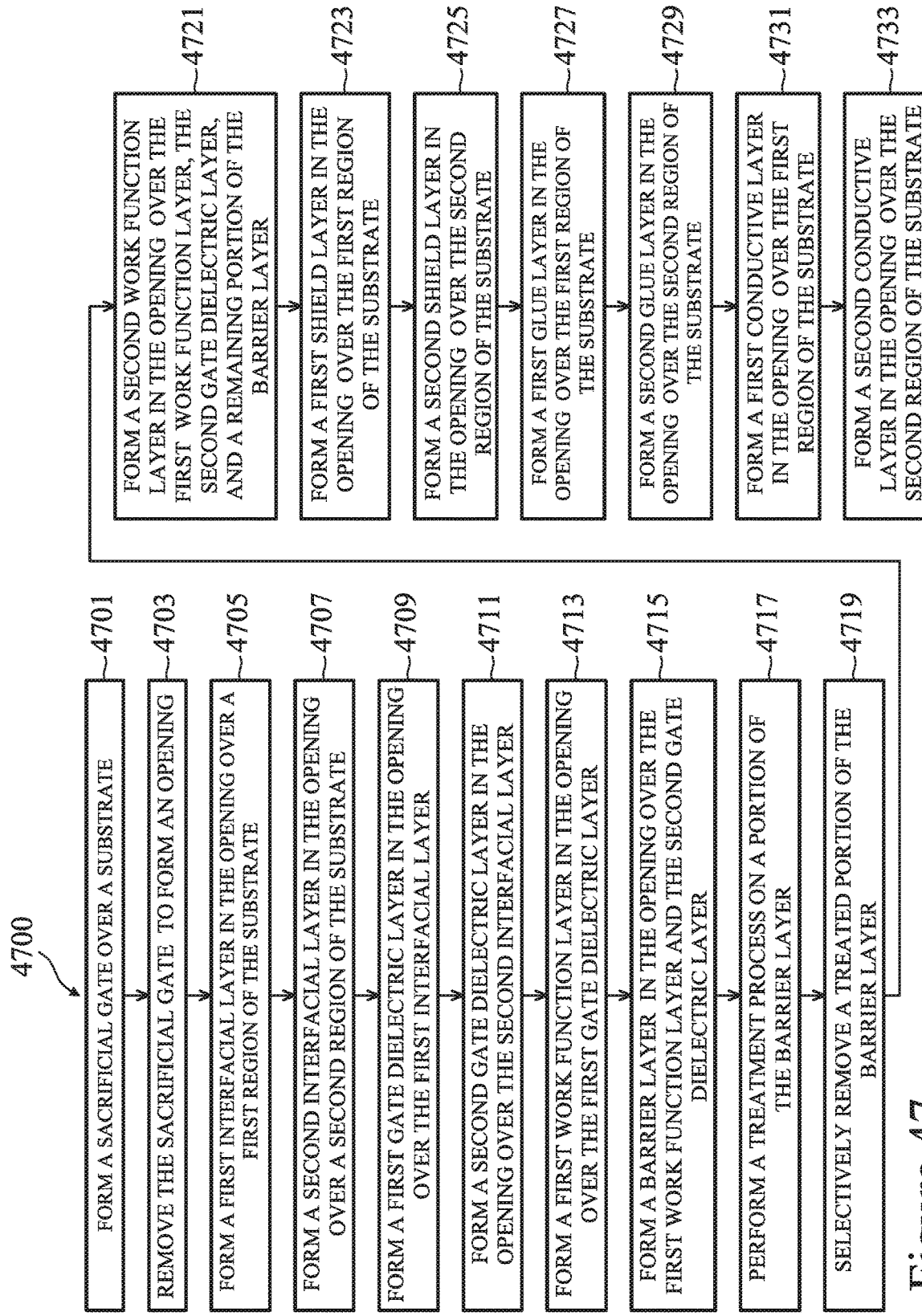
FIG. 47 is a flow diagram illustrating a method of forming a gate structure in accordance with some embodiments.

FIG. 47 is a flow diagram illustrating a method 4700 of forming a gate structure in accordance with some embodiments. The method 4700 starts with step 4701, where a sacrificial gate (such as the gate 72 illustrated in FIGS. 8A and 8B) is formed over a substrate (such as the substrate 50 illustrated in FIGS. 8A and 8B) as described above with reference to FIGS. 8A and 8B. In step 4703, the sacrificial gate is removed to form an opening (such as the opening 90 illustrated in FIGS. 13A and 13B) as described above with reference to FIGS. 13A and 13B. In step 4705, a first interfacial layer (such as the interfacial layer 115A illustrated in FIG. 17) is formed in the opening over a first region (such as the region 50A illustrated in FIG. 17) of the substrate as described above with reference to FIG. 17. In step 4707, a second interfacial layer (such as the interfacial layer 115B illustrated in FIG. 17) is formed in the opening over a second region (such as the region 50B illustrated in FIG. 17) of the substrate as described above with reference to FIG. 17. In some embodiments, steps 4705 and 4707 are performed at the same time. In other embodiments, step 4705 is performed before step 4707. In yet other embodiments, step 4705 is performed after step 4707. In step 4709, a first gate dielectric layer (such as the gate dielectric layer 116A illustrated in FIG. 17) is formed in the opening over first interfacial layer as described above with reference to FIG. 17. In step 4711, a second gate dielectric layer (such as the gate dielectric layer 116B illustrated in FIG. 17) is formed in the opening over second interfacial layer as described above with reference to FIG. 17. In some embodiments, steps 4709 and 4711 are performed at the same time. In other embodiments, step 4709 is performed before step 4711. In yet other embodiments, step 4709 is performed after step 4711. In step 4713, a first work function layer (such as the work function layer 118 illustrated in FIG. 17) is formed in the opening over the first dielectric layer as described above with reference to FIG. 17. In step 4715, a barrier layer (such as the barrier layer 120 illustrated in FIG. 18) is formed in the opening over the first work function layer and the second gate dielectric layer as described above with reference to FIG. 18. In step 4717, a treatment process is performed on a portion of the barrier layer as described above with reference to FIG. 19. In step 4719, a treated portion of the barrier layer (such as the treated portion 126 of the barrier layer 120 illustrated in FIG. 19) is selectively removed as described above with reference to FIG. 20. In step 4721, a second work function layer (such as the work function layer 128 illustrated in FIG. 21) is formed over the first work function layer, the second dielectric layer and a remaining portion of the barrier layer as described above with reference to FIG. 21. In step 4723, a first shield layer (such as the shield layer 130A illustrated in FIG. 22) is formed in the opening over the first region of the substrate as described above with reference to FIG. 22. In step 4725, a second shield layer (such as the shield layer 130B illustrated in FIG. 22) is formed in the opening over the second region of the substrate as described above with reference to FIG. 22. In some embodiments, steps 4723 and 4725 are performed at the same time. In other embodiments, step 4723 is performed before step 4725. In yet other embodiments, step 4723 is performed after step 4725. In step 4727, a first glue layer (such as the glue layer 132A illustrated in FIG. 22) is formed in the opening over the first region of the substrate as described above with reference to FIG. 22. In step 4729, a second glue layer (such as the glue layer 132B illustrated in FIG. 22) is formed in the opening over the second region of the substrate as described above with reference to FIG. 22. In some embodiments, steps 4727 and 4729 are performed at the same time. In other embodiments, step 4727 is performed before step 4729. In yet other embodiments, step 4727 is performed after step 4729. In step 4731, a first conductive layer (such as the conductive fill material 134A illustrated in FIG. 22) is formed in the opening over the first region of the substrate as described above with reference to FIG. 22. In step 4733, a second conductive layer (such as the conductive fill material 134B illustrated in FIG. 22) is formed in the opening over the second region of the substrate as described above with reference to FIG. 22. In some embodiments, steps 4731 and 4733 are performed at the same time. In other embodiments, step 4731 is performed before step 4733. In yet other embodiments, step 4731 is performed after step 4733.

Figure 48:
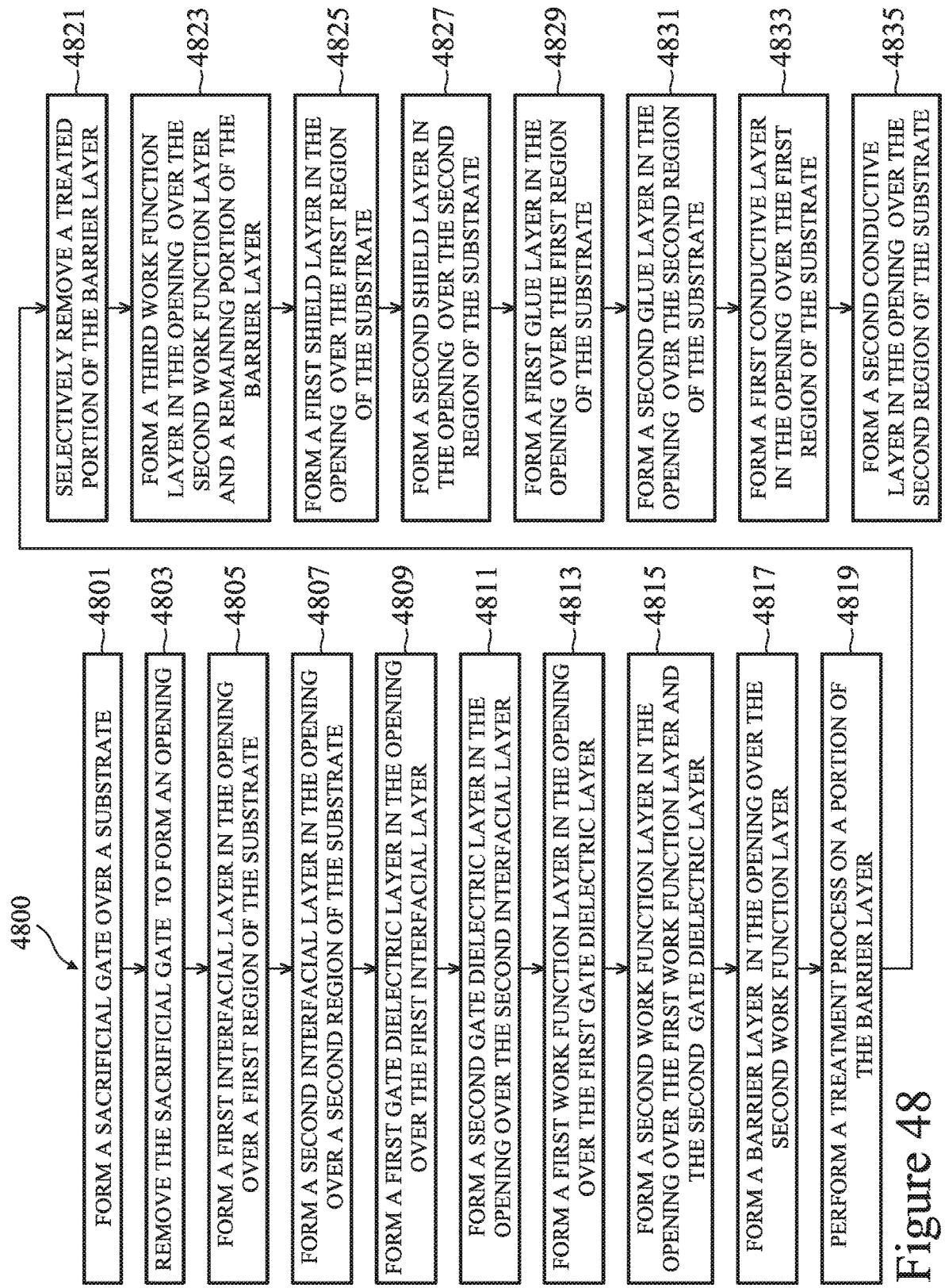
FIG. 48 is a flow diagram illustrating a method of forming a gate structure in accordance with some embodiments.

FIG. 48 is a flow diagram illustrating a method 4800 of forming a gate structure in accordance with some embodiments. The method 4800 starts with step 4801, where a sacrificial gate (such as the gate 72 illustrated in FIGS. 8A and 8B) is formed over a substrate (such as the substrate 50 illustrated in FIGS. 8A and 8B) as described above with reference to FIGS. 8A and 8B. In step 4803, the sacrificial gate is removed to form an opening (such as the opening 90 illustrated in FIGS. 13A and 13B) as described above with reference to FIGS. 13A and 13B. In step 4805, a first interfacial layer (such as the interfacial layer 115A illustrated in FIG. 26) is formed in the opening over a first region (such as the region 50A illustrated in FIG. 26) of the substrate as described above with reference to FIG. 26. In step 4807, a second interfacial layer (such as the interfacial layer 115B illustrated in FIG. 26) is formed in the opening over a second region (such as the region 50B illustrated in FIG. 26) of the substrate as described above with reference to FIG. 26. In some embodiments, steps 4805 and 4807 are performed at the same time. In other embodiments, step 4805 is performed before step 4807. In yet other embodiments, step 4805 is performed after step 4807. In step 4809, a first gate dielectric layer (such as the gate dielectric layer 116A illustrated in FIG. 26) is formed in the opening over first interfacial layer as described above with reference to FIG. 26. In step 4811, a second gate dielectric layer (such as the gate dielectric layer 116B illustrated in FIG. 26) is formed in the opening over second interfacial layer as described above with reference to FIG. 26. In some embodiments, steps 4809 and 4811 are performed at the same time. In other embodiments, step 4809 is performed before step 4811. In yet other embodiments, step 4809 is performed after step 4811. In step 4813, a first work function layer (such as the work function layer 118 illustrated in FIG. 26) is formed in the opening over the first gate dielectric layer as described above with reference to FIG. 26. In step 4815, a second work function layer (such as the work function layer 136 illustrated in FIG. 27) is formed in the opening over the first work function layer and the second gate dielectric layer as described above with reference to FIG. 27. In step 4817, a barrier layer (such as the barrier layer 120 illustrated in FIG. 28) is formed in the opening over the second work function layer as described above with reference to FIG. 28. In step 4819, a treatment process is performed on a portion of the barrier layer as described above with reference to FIG. 29. In step 4821, a treated portion of the barrier layer (such as the treated portion 126 of the barrier layer 120 illustrated in FIG. 29) is selectively removed as described above with reference to FIG. 30. In step 4823, a third work function layer (such as the work function layer 128 illustrated in FIG. 21) is formed over the second work function layer and a remaining portion of the barrier layer as described above with reference to FIG. 31. In step 4825, a first shield layer (such as the shield layer 130A illustrated in FIG. 32) is formed in the opening over the first region of the substrate as described above with reference to FIG. 32. In step 4827, a second shield layer (such as the shield layer 130B illustrated in FIG. 32) is formed in the opening over the second region of the substrate as described above with reference to FIG. 32. In some embodiments, steps 4825 and 4827 are performed at the same time. In other embodiments, step 4825 is performed before step 4827. In yet other embodiments, step 4825 is performed after step 4827. In step 4829, a first glue layer (such as the glue layer 132A illustrated in FIG. 32) is formed in the opening over the first region of the substrate as described above with reference to FIG. 32. In step 4831, a second glue layer (such as the glue layer 132B illustrated in FIG. 32) is formed in the opening over the second region of the substrate as described above with reference to FIG. 32. In some embodiments, steps 4829 and 4831 are performed at the same time. In other embodiments, step 4829 is performed before step 4831. In yet other embodiments, step 4829 is performed after step 4831. In step 4833, a first conductive layer (such as the conductive fill material 134A illustrated in FIG. 32) is formed in the opening over the first region of the substrate as described above with reference to FIG. 32. In step 4835, a second conductive layer (such as the conductive fill material 134B illustrated in FIG. 32) is formed in the opening over the second region of the substrate as described above with reference to FIG. 32. In some embodiments, steps 4833 and 4835 are performed at the same time. In other embodiments, step 4833 is performed before step 4835. In yet other embodiments, step 4833 is performed after step 4835.

Figure 49:
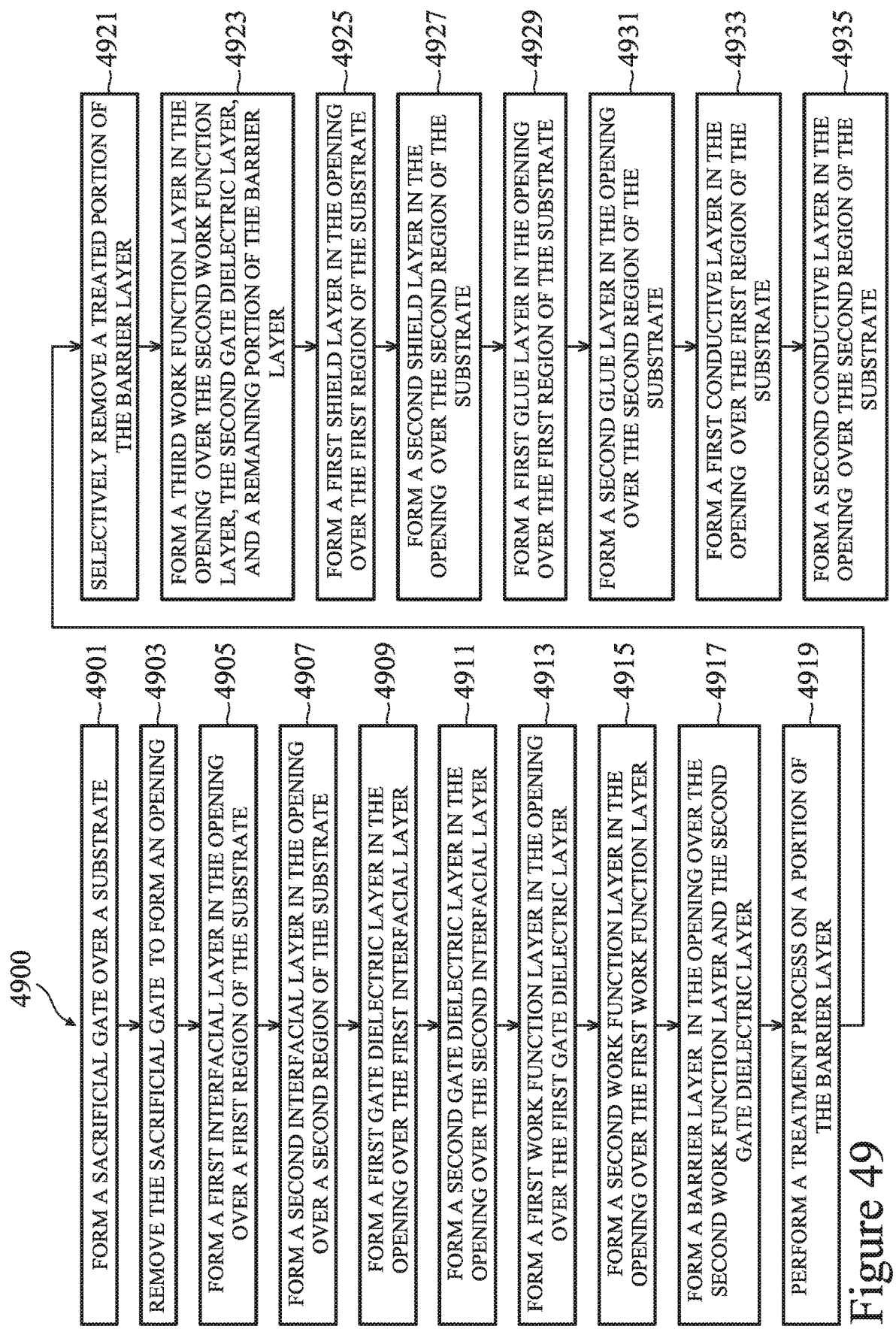
FIG. 49 is a flow diagram illustrating a method of forming a gate structure in accordance with some embodiments.

FIG. 49 is a flow diagram illustrating a method 4900 of forming a gate structure in accordance with some embodiments. The method 4900 starts with step 4901, where a sacrificial gate (such as the gate 72 illustrated in FIGS. 8A and 8B) is formed over a substrate (such as the substrate 50 illustrated in FIGS. 8A and 8B) as described above with reference to FIGS. 8A and 8B. In step 4903, the sacrificial gate is removed to form an opening (such as the opening 90 illustrated in FIGS. 13A and 13B) as described above with reference to FIGS. 13A and 13B. In step 4905, a first interfacial layer (such as the interfacial layer 115A illustrated in FIG. 36) is formed in the opening over a first region (such as the region 50A illustrated in FIG. 36) of the substrate as described above with reference to FIG. 36. In step 4907, a second interfacial layer (such as the interfacial layer 115B illustrated in FIG. 36) is formed in the opening over a second region (such as the region 50B illustrated in FIG. 36) of the substrate as described above with reference to FIG. 36. In some embodiments, steps 4905 and 4907 are performed at the same time. In other embodiments, step 4905 is performed before step 4907. In yet other embodiments, step 4905 is performed after step 4907. In step 4909, a first gate dielectric layer (such as the gate dielectric layer 116A illustrated in FIG. 36) is formed in the opening over the first interfacial layer as described above with reference to FIG. 36. In step 4911, a second gate dielectric layer (such as the gate dielectric layer 116B illustrated in FIG. 36) is formed in the opening over the second interfacial layer as described above with reference to FIG. 36. In some embodiments, steps 4909 and 4911 are performed at the same time. In other embodiments, step 4909 is performed before step 4911. In yet other embodiments, step 4909 is performed after step 4911. In step 4913, a first work function layer (such as the work function layer 118 illustrated in FIG. 36) is formed in the opening over the first gate dielectric layer as described above with reference to FIG. 36. In step 4915, a second work function layer (such as the work function layer 138 illustrated in FIG. 38) is formed in the opening over the first work function layer as described above with reference to FIGS. 37 and 38. In step 4917, a barrier layer (such as the barrier layer 120 illustrated in FIG. 39) is formed in the opening over the second work function layer and the second gate dielectric layer as described above with reference to FIG. 39. In step 4919, a treatment process is performed on a portion of the barrier layer as described above with reference to FIG. 40. In step 4921, a treated portion of the barrier layer (such as the treated portion 126 of the barrier layer 120 illustrated in FIG. 40) is selectively removed as described above with reference to FIG. 41. In step 4923, a third work function layer (such as the work function layer 128 illustrated in FIG. 42) is formed over the second work function layer, the second gate dielectric layer, and a remaining portion of the barrier layer as described above with reference to FIG. 42. In step 4925, a first shield layer (such as the shield layer 130A illustrated in FIG. 43) is formed in the opening over the first region of the substrate as described above with reference to FIG. 43. In step 4927, a second shield layer (such as the shield layer 130B illustrated in FIG. 43) is formed in the opening over the second region of the substrate as described above with reference to FIG. 43. In some embodiments, steps 4925 and 4927 are performed at the same time. In other embodiments, step 4925 is performed before step 4927. In yet other embodiments, step 4925 is performed after step 4927. In step 4929, a first glue layer (such as the glue layer 132A illustrated in FIG. 43) is formed in the opening over the first region of the substrate as described above with reference to FIG. 43. In step 4931, a second glue layer (such as the glue layer 132B illustrated in FIG. 43) is formed in the opening over the second region of the substrate as described above with reference to FIG. 43. In some embodiments, steps 4929 and 4931 are performed at the same time. In other embodiments, step 4929 is performed before step 4931. In yet other embodiments, step 4929 is performed after step 4931. In step 4933, a first conductive layer (such as the conductive fill material 134A illustrated in FIG. 43) is formed in the opening over the first region of the substrate as described above with reference to FIG. 43. In step 4935, a second conductive layer (such as the conductive fill material 134B illustrated in FIG. 43) is formed in the opening over the second region of the substrate as described above with reference to FIG. 43. In some embodiments, steps 4933 and 4935 are performed at the same time. In other embodiments, step 4933 is performed before step 4935. In yet other embodiments, step 4933 is performed after step 4935.

In an embodiment, a semiconductor device includes a substrate and a gate structure over the substrate. The substrate has a first region and a second region. The gate structure extends across an interface between the first region and the second region. The gate structure includes a first gate dielectric layer over the first region, a second gate dielectric layer over the second region, a first work function layer over the first gate dielectric layer, a barrier layer along a sidewall of the first work function layer and above the interface between the first region and the second region, and a second work function layer over the first work function layer, the barrier layer and the second gate dielectric layer. The second work function layer is in physical contact with a top surface of the first work function layer. In an embodiment, the gate structure further includes a third work function layer between the first gate dielectric layer and the first work function layer. In an embodiment, the first work function layer is in physical contact with a top surface of the third work function layer. In an embodiment, the barrier layer extends along a sidewall of the third work function layer. In an embodiment, the second work function layer is in physical contact with a top surface and a sidewall of the barrier layer. In an embodiment, the barrier layer is laterally spaced apart from the interface between the first region and the second region. In an embodiment, a top surface of the barrier layer is substantially level with the top surface of the first work function layer. In an embodiment, a top surface of the barrier layer is lower than the top surface of the first work function layer. In an embodiment, the barrier layer has a rounded corner.

In another embodiment, a semiconductor device includes a substrate and a gate structure over the substrate. The substrate has a first region and a second region. A first portion of the gate structure is above the first region and a second portion of the gate structure is above the second region. The gate structure includes a first gate dielectric layer over the first region, a second gate dielectric layer over the second region, and a first p-type work function layer over the first gate dielectric layer. The first p-type work function layer has a sidewall above an interface between the first region and the second region. The gate structure further includes a barrier layer in physical contact with the sidewall of the first p-type work function layer. The barrier layer extends along the sidewall of the first p-type work function layer not higher than to a top surface of the first p-type work function layer. The gate structure further includes an n-type work function layer over the first p-type work function layer. The n-type work function layer is in physical contact with a top surface and a sidewall of the barrier layer. The gate structure further includes a first conductive layer over a first portion of the n-type work function layer above the first region and a second conductive layer over a second portion of the n-type work function layer above the second region. In an embodiment, the first p-type work function layer is in physical contact with the second portion of the n-type work function layer. In an embodiment, the n-type work function layer is in physical contact with the second gate dielectric layer. In an embodiment, a top surface of the barrier layer is substantially level with the top surface of the first p-type work function layer. In an embodiment, a top surface of the barrier layer is lower than the top surface of the first p-type work function layer. In an embodiment, the first p-type work function layer is in physical contact with a bottom surface of the barrier layer. In an embodiment, the first p-type work function layer is in physical contact with the second gate dielectric layer.

In yet another embodiment, a method includes forming a sacrificial gate over a substrate. The substrate has a first region and a second region. The sacrificial gate extends across an interface between the first region and the second region. The sacrificial gate is removed to form an opening. A first gate dielectric layer is formed over the first region in the opening. A second gate dielectric layer is formed over the second region in the opening. A first work function layer is formed over the first gate dielectric layer in the opening. A dielectric layer is deposited over the first work function layer and the second gate dielectric layer in the opening. The dielectric layer includes a first material. The dielectric layer is patterned to form a barrier layer on a sidewall of the first work function layer. A second work function layer is formed over the first work function layer and the barrier layer. In an embodiment, patterning the dielectric layer includes performing a treatment process on the dielectric layer to form a treated portion of the dielectric layer. The treated portion of the dielectric layer includes a second material different from the first material. The treated portion of the dielectric layer is selectively removed. An un-treated portion of the dielectric layer remains on the sidewall of the first work function layer and forms the barrier layer. In an embodiment, performing the treatment process on the dielectric layer includes performing an implantation process on the dielectric layer. In an embodiment, selectively removing the treated portion of the dielectric layer includes performing a selective etch process on the treated portion of the dielectric layer. In an embodiment, patterning the dielectric layer includes performing an anisotropic etch process on the dielectric layer.

In yet another embodiment, a semiconductor device includes a substrate and a gate structure over the substrate. The substrate has a first region and a second region. The gate structure extends across an interface between the first region and the second region. The gate structure includes a first gate dielectric layer over the first region, a second gate dielectric layer over the second region, a first work function layer over the first gate dielectric layer, a second work function layer over the first work function layer and the second gate dielectric layer, a barrier layer along a sidewall of the second work function layer, and a third work function layer over the second work function layer and the barrier layer. The second work function layer is in physical contact with a top surface of the first work function layer and a top surface of the second gate dielectric layer. The barrier layer is above the interface between the first region and the second region. The third work function layer is in physical contact with a top surface of the second work function layer and a top surface and a sidewall of the barrier layer. In an embodiment, the top surface of the barrier layer is substantially level with the top surface of the second work function layer. In an embodiment, the top surface of the barrier layer is lower than the top surface of the second work function layer. In an embodiment, the barrier layer has a rounded corner. In an embodiment, the gate structure further includes: a first shield layer over the third work function layer, where the first shield layer is over the first gate dielectric layer; and a second shield layer over the third work function layer, where the second shield layer is over the second gate dielectric layer. In an embodiment, the gate structure further includes: a first glue layer over the first shield layer; and a second glue layer over the second shield layer. In an embodiment, the gate structure further includes: a first conductive layer over the first glue layer; and a second conductive layer over the second glue layer.

In yet another embodiment, a semiconductor device includes a substrate and a gate structure over the substrate. The substrate has a first region and a second region. A first portion of the gate structure is above the first region and a second portion of the gate structure is above the second region. The gate structure includes a first gate dielectric layer over the first region, a second gate dielectric layer over the second region, a first p-type work function layer over the first gate dielectric layer, a second p-type work function layer over the first p-type work function layer and the second gate dielectric layer, a barrier layer in physical contact with the sidewall of the second p-type work function layer, an n-type work function layer over the second p-type work function layer, a first conductive layer over a first portion of the n-type work function layer above the first region, and a second conductive layer over a second portion of the n-type work function layer above the second region. The first p-type work function layer has a sidewall above an interface between the first region and the second region. The second p-type work function layer has a sidewall above the interface between the first region and the second region. The barrier layer extends along the sidewall of the second p-type work function layer not higher than to a top surface of the second p-type work function layer. The n-type work function layer is in physical contact with a top surface and a sidewall of the barrier layer. In an embodiment, the top surface of the barrier layer is substantially level with the top surface of the second p-type work function layer. In an embodiment, the top surface of the barrier layer is lower than the top surface of the second p-type work function layer. In an embodiment, the second p-type work function layer is in physical contact with a bottom surface of the barrier layer. In an embodiment, the second p-type work function layer is in physical contact with a top surface of the second gate dielectric layer. In an embodiment, the first p-type work function layer and the second p-type work function layer comprise different materials. In an embodiment, the first p-type work function layer and the second p-type work function layer comprise a same material.

In yet another embodiment, a method includes forming a sacrificial gate over a substrate. The substrate has a first region and a second region. The sacrificial gate extends across an interface between the first region and the second region. The sacrificial gate is removed to form an opening. A first gate dielectric layer is formed over the first region in the opening. A second gate dielectric layer is formed over the second region in the opening. A first work function layer is formed over the first gate dielectric layer in the opening. A second work function layer is formed over the first work function layer and the second gate dielectric layer in the opening. A dielectric layer is deposited over the second work function layer in the opening. The dielectric layer includes a first material. The dielectric layer is patterned to form a barrier layer on a sidewall of the second work function layer. A third work function layer is formed over the second work function layer and the barrier layer. In an embodiment, patterning the dielectric layer includes: performing a treatment process on the dielectric layer to form a treated portion of the dielectric layer, where the treated portion of the dielectric layer comprises a second material different from the first material; and selectively etching the treated portion of the dielectric layer, where an un-treated portion of the dielectric layer remains on the sidewall of the second work function layer and forms the barrier layer. In an embodiment, the treatment process comprises an oxidation process, a fluorination process, a nitridation process, or a chlorination process. In an embodiment, the treatment process comprises an implantation process. In an embodiment, patterning the dielectric layer comprises performing an anisotropic etch process on the dielectric layer. In an embodiment, the first work function layer and the second work function layer are p-type work function layers, and the third work function layer is an n-type work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a substrate, the substrate having a first region and a second region; and
   a gate structure over the substrate, the gate structure extending across an interface between the first region and the second region, the gate structure comprising:
      a first gate dielectric layer over the first region;
      a second gate dielectric layer over the second region;
      a first work function layer over the first gate dielectric layer;
      a second work function layer over the first work function layer and the second gate dielectric layer, wherein the second work function layer is in physical contact with a top surface of the first work function layer and a top surface of the second gate dielectric layer;
      a barrier layer along a sidewall of the second work function layer, wherein the barrier layer is above the interface between the first region and the second region; and
      a third work function layer over the second work function layer and the barrier layer, wherein the third work function layer is in physical contact with a top surface of the second work function layer and a top surface and a sidewall of the barrier layer.

2. The semiconductor device of claim 1, wherein the top surface of the barrier layer is substantially level with the top surface of the second work function layer.

3. The semiconductor device of claim 1, wherein the top surface of the barrier layer is lower than the top surface of the second work function layer.

4. The semiconductor device of claim 1, wherein the barrier layer has a rounded corner.

5. The semiconductor device of claim 1, wherein the gate structure further comprises:
   a first shield layer over the third work function layer, wherein the first shield layer is over the first gate dielectric layer; and
   a second shield layer over the third work function layer, wherein the second shield layer is over the second gate dielectric layer.

6. The semiconductor device of claim 5, wherein the gate structure further comprises:
   a first glue layer over the first shield layer; and
   a second glue layer over the second shield layer.

7. The semiconductor device of claim 6, wherein the gate structure further comprises:
   a first conductive layer over the first glue layer; and
   a second conductive layer over the second glue layer.

8. A semiconductor device comprising:
   a substrate, the substrate having a first region and a second region; and
   a gate structure over the substrate, wherein a first portion of the gate structure is above the first region and a second portion of the gate structure is above the second region, and wherein the gate structure comprises:
      a first gate dielectric layer over the first region;
      a second gate dielectric layer over the second region;
      a first p-type work function layer over the first gate dielectric layer, the first p-type work function layer having a sidewall above an interface between the first region and the second region;
      a second p-type work function layer over the first p-type work function layer and the second gate dielectric layer, wherein the second p-type work function layer has a sidewall above the interface between the first region and the second region;
      a barrier layer in physical contact with the sidewall of the second p-type work function layer, wherein the barrier layer extends along the sidewall of the second p-type work function layer not higher than to a top surface of the second p-type work function layer;

an n-type work function layer over the second p-type work function layer, wherein the n-type work function layer is in physical contact with a top surface and a sidewall of the barrier layer;

a first conductive layer over a first portion of the n-type work function layer above the first region; and a second conductive layer over a second portion of the n-type work function layer above the second region.

9. The semiconductor device of claim 8, wherein the top surface of the barrier layer is substantially level with the top surface of the second p-type work function layer.

10. The semiconductor device of claim 8, wherein the top surface of the barrier layer is lower than the top surface of the second p-type work function layer.

11. The semiconductor device of claim 8, wherein the second p-type work function layer is in physical contact with a bottom surface of the barrier layer.

12. The semiconductor device of claim 8, wherein the second p-type work function layer is in physical contact with a top surface of the second gate dielectric layer.

13. The semiconductor device of claim 8, wherein the first p-type work function layer and the second p-type work function layer comprise different materials.

14. The semiconductor device of claim 8, wherein the first p-type work function layer and the second p-type work function layer comprise a same material.

15. A method comprising:
forming a sacrificial gate over a substrate, the substrate having a first region and a second region, the sacrificial gate extending across an interface between the first region and the second region;
removing the sacrificial gate to form an opening;
forming a first gate dielectric layer over the first region in the opening;
forming a second gate dielectric layer over the second region in the opening;
forming a first work function layer over the first gate dielectric layer in the opening;
forming a second work function layer over the first work function layer and the second gate dielectric layer in the opening;
depositing a dielectric layer over the second work function layer in the opening, wherein the dielectric layer comprises a first material;
patterning the dielectric layer to form a barrier layer on a sidewall of the second work function layer; and
forming a third work function layer over the second work function layer and the barrier layer.

16. The method of claim 15, wherein patterning the dielectric layer comprises:
performing a treatment process on the dielectric layer to form a treated portion of the dielectric layer, wherein the treated portion of the dielectric layer comprises a second material different from the first material; and
selectively etching the treated portion of the dielectric layer, wherein an un-treated portion of the dielectric layer remains on the sidewall of the second work function layer and forms the barrier layer.

17. The method of claim 16, wherein the treatment process comprises an oxidation process, a fluorination process, a nitridation process, or a chlorination process.

18. The method of claim 16, wherein the treatment process comprises an implantation process.

19. The method of claim 15, wherein patterning the dielectric layer comprises performing an anisotropic etch process on the dielectric layer.

20. The method of claim 15, wherein the first work function layer and the second work function layer are p-type work function layers, and wherein the third work function layer is an n-type work function layer.

* * * * *